US007999287B2

(12) United States Patent
Zundel et al.

(10) Patent No.: US 7,999,287 B2
(45) Date of Patent: Aug. 16, 2011

(54) LATERAL HEMT AND METHOD FOR THE PRODUCTION OF A LATERAL HEMT

(75) Inventors: Markus Zundel, Egmating (DE); Franz Hirler, Isen (DE); Walter Rieger, Arnoldstein (AT)

(73) Assignee: Infineon Technologies Austria AG, Villach (AT)

( * ) Notice: Subject to any disclaimer, the term of this patent is extended or adjusted under 35 U.S.C. 154(b) by 109 days.

(21) Appl. No.: 12/605,751

(22) Filed: Oct. 26, 2009

(65) Prior Publication Data

US 2011/0095336 A1 Apr. 28, 2011

(51) Int. Cl.
*H01L 29/66* (2006.01)

(52) U.S. Cl. ................. 257/194; 257/488; 257/E29.246

(58) Field of Classification Search .................. 257/194, 257/488, E29.246, E29.009
See application file for complete search history.

(56) References Cited

U.S. PATENT DOCUMENTS 6,489,628 B1 12/2002 Morizuka
6,933,544 B2 8/2005 Saito et al.
7,075,125 B2 7/2006 Saito et al.
7,157,748 B2 1/2007 Saito et al.
7,166,867 B2 1/2007 Beach et al.
7,271,429 B2 9/2007 Saito et al.
7,417,267 B2 8/2008 Beach
7,508,015 B2 3/2009 Saito et al.
7,550,783 B2 6/2009 Wu et al.
7,601,993 B2 * 10/2009 Hoshi et al. .................. 257/194
7,915,644 B2 * 3/2011 Wu et al. ...................... 257/194
2007/0007547 A1 1/2007 Beach
2007/0026587 A1 2/2007 Briere
2007/0066020 A1 3/2007 Beach
2008/0054303 A1 3/2008 Beach

OTHER PUBLICATIONS

Saito et al., High Breakdown Voltate AIGaN-GaN Power-HEMT Design and High Current Density Switching Behavior, IEEE Transactions on Electron Devices, vol. 50, No. 12, Dec. 2003, pp. 2528-2531.

Advanced Linear Devices, Inc., Quad/Dual EPAD® Precision Matched Pair N-Channel Mosfet Array, 2003, pp. 8.

* cited by examiner

*Primary Examiner* — Mark Prenty
(74) *Attorney, Agent, or Firm* — Dicke, Billig & Czaja, PLLC

(57) ABSTRACT

In one embodiment a lateral HEMT has a first layer, the first layer including a semiconducting material, and a second layer, the second layer including a semiconducting material and being at least partially arranged on the first layer. The lateral HEMT further has a passivation layer and a drift region, the drift region including a lateral width $w_d$. The lateral HEMT further has at least one field plate, the at least one field plate being arranged at least partially on the passivation layer in a region of the drift region and including a lateral width $w_f$, wherein $w_f<w_d$.

25 Claims, 45 Drawing Sheets

10
17
13
35
12
14
15
19
24
18
13
16
11
21
22

10
17
$w_d$
14
35
15
$w_{fg}$
$d_{fg}$
19
18
16

30
17
$w_d$
14
35
15
$w_{fg}$
$d_{fg}$
19
18
16

40
17
$w_d$
14
35
35
35
35
35
15
15
15
15
15
$w_{fg}$
$d_{fg}$
$l_{fg}$
19
19
19
19
19
18
16

50
17
$w_d$
14
35
15
$d_{fg}$
$w_{fg}$
$l_{fg}$
19
18
16

60
17
13
$t_{p1}$
12
35
14
23
18
24
16
11
21
22

65
17
13
$t_{p2}$
14
12
36
42
41
18
24
16
11
21
22

60
17
wd
14
35
23
wfs
dfs
lfs
18
16

65
17
Wd
14
dfs
36
42
36
42
36
42
36
wfs
lfs
le
18
41
16

70
17
13
12
35
14
25
18
24
16
11
21
22

70
17
$w_d$
14
35
25
$w_{fs}$
$d_{fs}$
$l_{fs}$
18
16

80
17
13
12
35
14
25
18
24
16
11
21
22

80
17
$w_d$
14
35
25
$w_{fs}$
$d_{fs}$
$l_{fs}$
18
16

90
17
14
$w_d$
35
25
23
$w_{fs}$
$l_{fs}$
$d_{fs}$
18
16

100
17
26
35
13
12
14
18
24
16
11
21
22

100
17
26
26
lfd
wfd
35
35
wd
14
18
16

110
17
13
15
12
35
35
14
19
24
23
18
13
16
11
21
22

120
17
14
$w_d$
35
15
25
23
19
18
16
$w_{fg}$
$l_{fg}$
$w_{fs}$
$d_{gs}$
$d_{fs}$
$l_{fs}$ 130
17
16
14
$w_d$
35
25
23
15
20
19
18
$w_{fs}$
$w_{fg}$
$d_{fs}$
$d_{fg}$ 140
17
26
35
13
15
12
14
19
24
18
13
16
11
21
22

140
17
14
26
26
$l_{fd}$
$w_{fd}$
$w_d$
35
15
$w_{fg}$
$l_{fg}$
$d_{fg}$
19
18
16

150
17
26
35
13
12
14
23
24
18
16
11
21
22

150
17
26
26
$l_{fd}$
$w_{fd}$
$w_d$
14
35
35
35
35
35
23
23
23
23
23
$w_{fs}$
$d_{fs}$
$l_{fs}$
18
16

160
17
26
35
35
13
15
12
14
19
24
23
18
13
16
11
21
22

170
17
26
$l_{fd}$
$w_{fd}$
$w_d$
14
35
15
$l_{fg}$
25
$w_{fs}$
$l_{fs}$
$w_{fg}$
23
$d_{gs}$
$d_{fs}$
19
18
16

180
A
A
B
B
$w_d$
17
13
13
13
13
13
$w_l$
27
27
27
$l_l$
14
37
37
37
18
13
16

180
17
27
12
13
14
37
18
24
13
16
11
21
22

180
17
12
13
14
18
24
13
16
11
21
22

190
A
A
$w_d$
17
13
14
28
28
28
$w_l$
$l_l$
37
37
37
18
13
16

190
17
28
12
13
14
37
18
24
13
16
11
21
22

200
A
A
$w_d$
17
13
28
28
28
$w_l$
$l_l$
14
37
37
37
37
18
13
16

210
A
A
wd
17
13
14
29
29
29
37
37
37
wl
ll
18
13
16

210
17
12
13
29
14
37
18
24
13
16
11
21
22

220
wd
17
13
14
29
29
29
w1
37
37
37
l1
18
13
16

230
A
A
$w_d$
17
13
13
14
34
34
34
$w_l$
$l_l$
37
37
37
18
13
16

230
17
12
13
34
37
14
18
24
13
16
11
21
22

250
wd
17
13
14
27
28
wl
34
29
ll
37
18
16

260
$w_d$
17
31
31
31
31
13
13
13
$w_l$
$l_l$
14
38
38
38
18
13
16

270
17
13
12
32
14
18
24
16
11
21
22

280
33
24
13
12
11
21
22

280
33
33
33
13

280
17
33
12
13
24
16
11
21
22

280
17
33
13
18
13
12
24
16
11
21
22

LATERAL HEMT AND METHOD FOR THE PRODUCTION OF A LATERAL HEMT

BACKGROUND

For semiconductor devices, for example power semiconductor devices, compound semiconductors such as III-V compound semiconductors have become more and more important in recent years, since they allow for semiconductor devices with higher doping and shorter drift zone compared to silicon-based semiconductor devices while retaining a high blocking capability.

Up to now, power semiconductor devices based on III-V compound semiconductors are realized as lateral devices. These devices are known as high electron mobility transistors (HEMTs). A HEMT includes several layers of differently doped semiconducting materials with different band gaps. Due to the different band gaps of the individual layers, a two-dimensional electron gas (2DEG) is formed at the interface of these layers, the two-dimensional electron gas serving as a conductive channel. The mobility of the electrons as well as the 2D-electron charge carrier density is very high in two-dimensional electron gas.

The two-dimensional electron gas is provided in a region between a source electrode and a drain electrode. When the HEMT is reverse-biased, breakdown occurs in a region between a gate electrode and the drain electrode and the two-dimensional electron gas is significantly deteriorated by hot charge carriers.

For these and other reasons there is a need for the present invention.

SUMMARY

In one embodiment, a lateral HEMT includes a first layer, the first layer including a semiconducting material, and a second layer, the second layer including a semiconducting material and being at least partially arranged on the first layer. The lateral HEMT further includes a passivation layer and a drift region, the drift region including a lateral width $w_d$. The lateral HEMT further includes at least one field plate, the at least one field plate being arranged at least partially on the passivation layer in a region of the drift region and including a lateral width $w_f$, wherein $w_f < w_d$.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
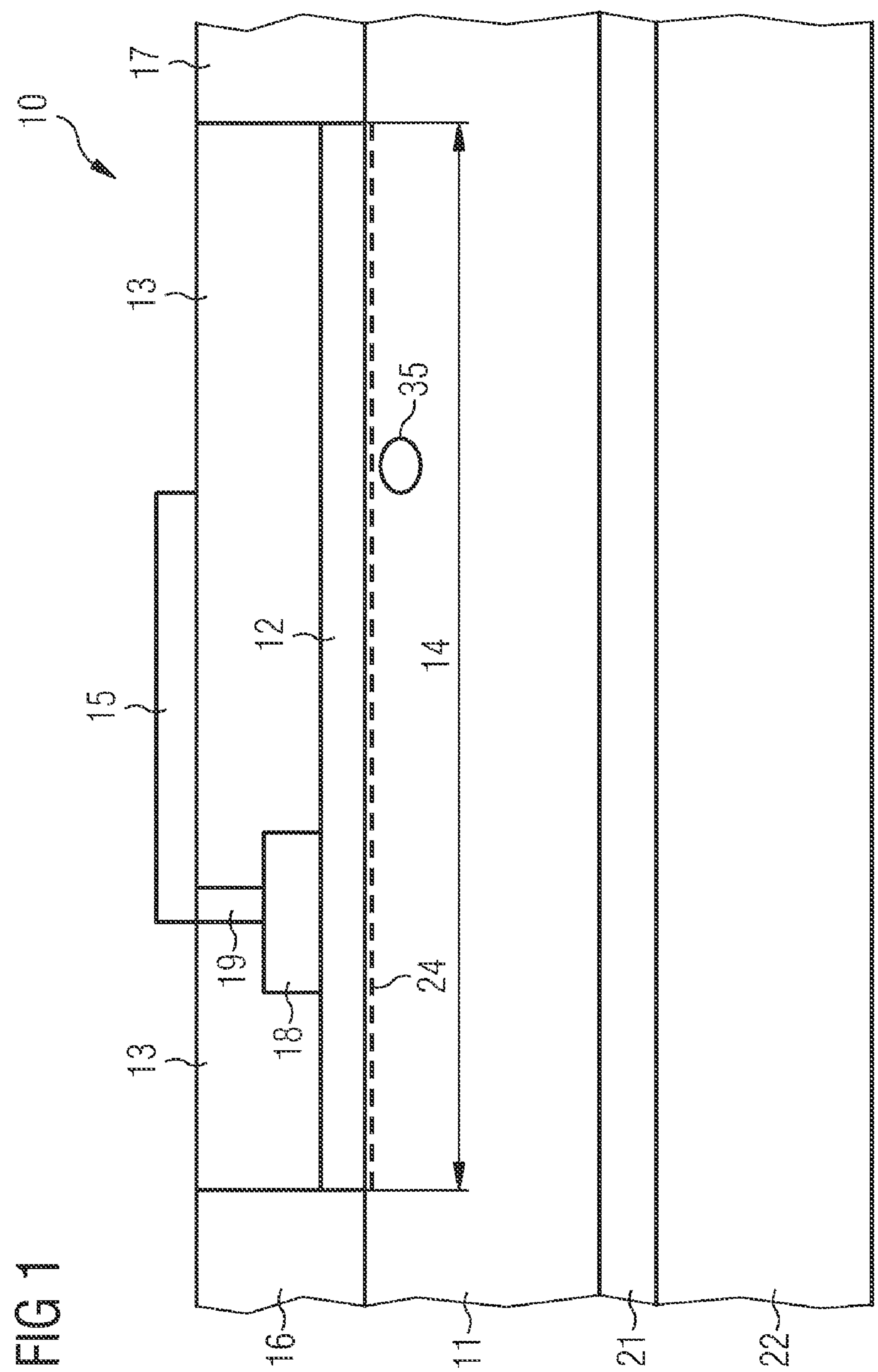
FIG. 1 illustrates a diagrammatic cross-section through a section of an embodiment of a lateral HEMT.

FIG. 1 illustrates a diagrammatic cross-section through a section of a lateral HEMT 10. In this embodiment, the lateral HEMT 10 includes a substrate 22 and a buffer layer 21 arranged on the substrate 22. The substrate 22 may include Si, SiC or $Al_2O_3$. The buffer layer 21 may include AlN, GaN or AlGaN. In some embodiments, the buffer layer 21 includes a plurality of individual layers, wherein each of the individual layers may include AlN, GaN or AlGaN. Depending on the requirements of the lateral HEMT 10, a suitable buffer layer 21 may therefore be provided.

A first layer 11 is arranged on the buffer layer 21. A second layer 12 is at least partially arranged on the first layer 11. In the illustrated embodiment, the first layer 11 includes lightly n-doped GaN, which is typically depleted by fixed charges at the interface or which is lightly n-conducting and contains deep traps to reduce the concentration of free charge carriers and the second layer 12 includes AlGaN. The AlGaN of the second layer 12 is typically compensated, i.e., it has no free charge carriers and is therefore electrically insulating. At the interface between the first layer 11 and the second layer 12, a two-dimensional electron gas is formed, which is schematically illustrated in FIG. 1 by a dashed line 24.

The lateral HEMT 10 further includes a first electrode 16, a second electrode 17 and a gate electrode 18. In the illustrated embodiment, the first electrode 16 and the second electrode 17 are each arranged on the first layer 11. In other embodiments, the first electrode 16 and the second electrode 17 are each arranged on the second layer 12 and the two-dimensional electron gas is electrically contacted by alloying the first electrode 16 and the second electrode 17 into the second layer 12. The first electrode 16 and the second electrode 17 are electrically contacting the first layer 11, the second layer 12 and the two-dimensional electron gas. Between the first electrode 16 and the second electrode 17, a drift region 14 is provided in the region of the two-dimensional electron gas. The gate electrode 18 is arranged on the second layer 12 in a region between the first electrode 16 and the second electrode 17 or in some embodiments may be at least partially recessed into the second layer 12 for normally-off devices. A passivation layer 13 is arranged on the second layer 12 and at least partially surrounds the gate electrode 18. The passivation layer 13 may include a material selected from the group consisting of $Si_xN_y$, $SiO_2$ and $Al_2O_3$.

The gate electrode 18 is configured to control the lateral HEMT 10 by applying a suitable voltage to the gate electrode 18. In the illustrated embodiment, the first electrode 16 is a source electrode and the second electrode 17 is a drain electrode. The first electrode 16, the second electrode 17 and the gate electrode 18 include an electrically conductive material, for example a metal or highly doped polysilicon.

The lateral HEMT 10 further includes at least one field plate 15. The at least one field plate 15 is arranged at least partially on the passivation layer 13 in a region of the drift region 14. The at least one field plate 15 includes an electrically conductive material such as a metal or highly doped polysilicon. In the illustrated embodiment, the at least one field plate 15 is electrically coupled to the gate electrode 18 via a through contact 19. The through contact 19 is arranged between the at least one field plate 15 and the gate electrode 18 in a region of the passivation layer 13 and directly contacts both the at least one field plate 15 and the gate electrode 18. The trough contact 19 includes an electrically conductive material, for example a metal or highly doped polysilicon. In some embodiments, the through contact 19 may also be located in the periphery of the lateral HEMT.

Figure 2:
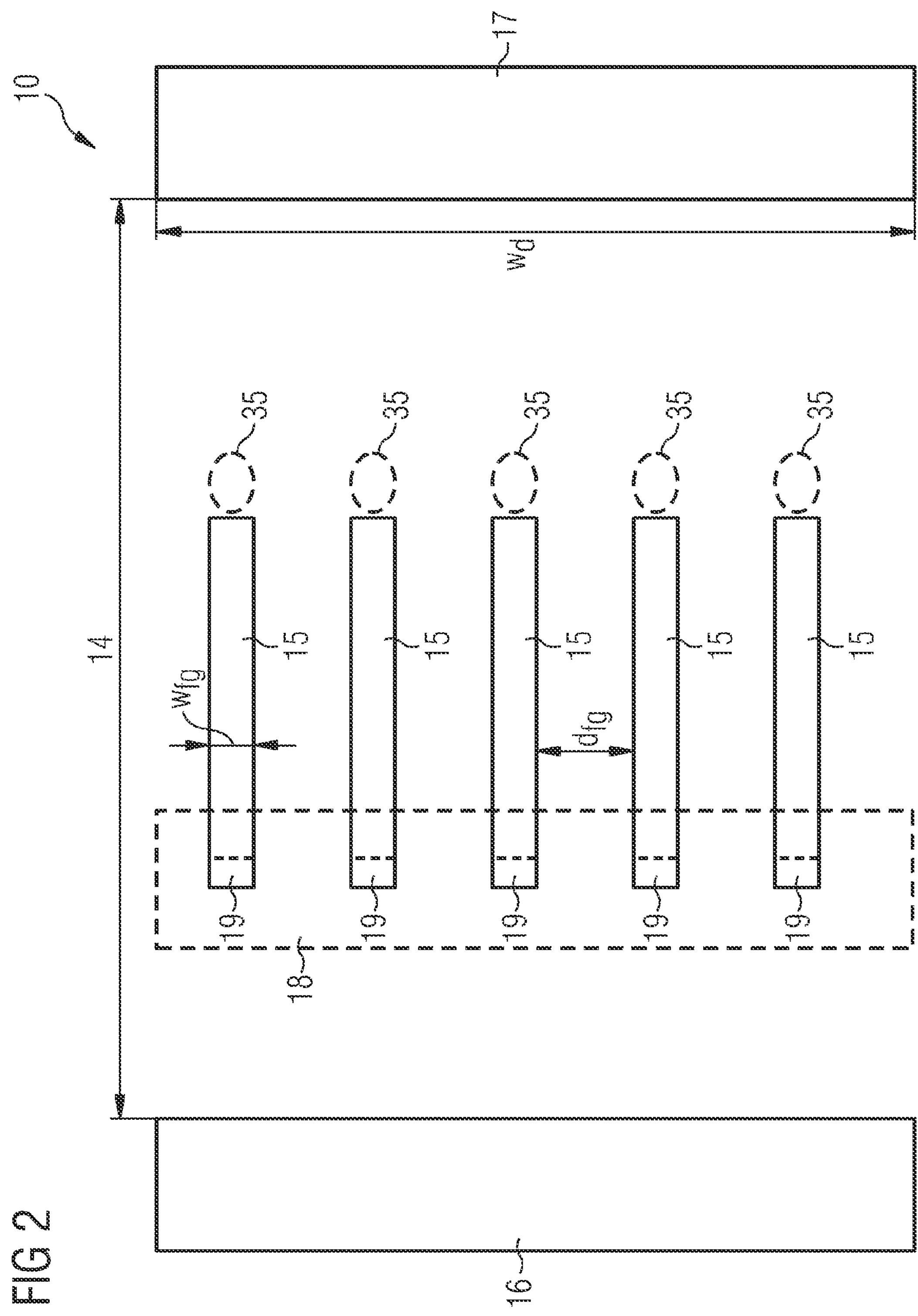
FIG. 2 illustrates a diagrammatic top view of a section of the lateral HEMT illustrated in FIG. 1.

FIG. 2 illustrates a diagrammatic top view of a section of the lateral HEMT 10 illustrated in FIG. 1. Components of the same function as those in FIG. 1 are identified by the same reference numbers and are not explained again below.

The gate electrode 18 of the lateral HEMT 10 is arranged in a vertically lower layer which cannot be seen in the top view of FIG. 2, and is therefore illustrated by a dashed line.

As illustrated in FIG. 2, the field plates 15 providing a first plurality of field plates each include a lateral width $w_{fg}$ and extend laterally from the gate electrode 18 in a direction towards the second electrode 17. The field plates 15 are arranged in a comb-shaped manner. The lateral width $w_{fg}$ of the field plates 15 is smaller than a lateral width $w_d$ of the drift region 14, i.e., is given by the relation $w_{fg}<w_d$. Moreover, a sum of the lateral widths $w_{fg}$ of the field plates 15 of the first plurality of field plates is smaller than the lateral width $w_d$.

As illustrated schematically in FIGS. 1 and 2, when the lateral HEMT 10 is reverse-biased, regions 35 in which breakdown occurs may be pinned towards the ends of the field plates 15 which are laterally closer to the second electrode 17. The two-dimensional electron gas is deteriorated locally in these regions 35 of the drift region 14 by hot charge carriers. However, in the remaining regions of the drift region 14, the electric field strength may be sufficiently lowered to avoid breakdown in these regions and thus to avoid a deterioration of the two-dimensional electron gas in these regions. Thus, when the lateral HEMT 10 is forward-biased, the two-dimensional electron gas and hence a conductive channel may be provided in a large area of the drift region 14.

In the illustrated embodiment, a lateral distance $d_{fg}$ between adjacent field plates 15 is the same for all field plates 15. In a non-illustrated embodiment, the first plurality of field plates 15 includes a first lateral distance between adjacent field plates 15 and a second lateral distance between adjacent field plates 15, the first lateral distance being different from the second lateral distance. In further non-illustrated embodiments, many or all lateral distances $d_{fg}$ between adjacent field plates 15 are different from one another.

Figure 3:
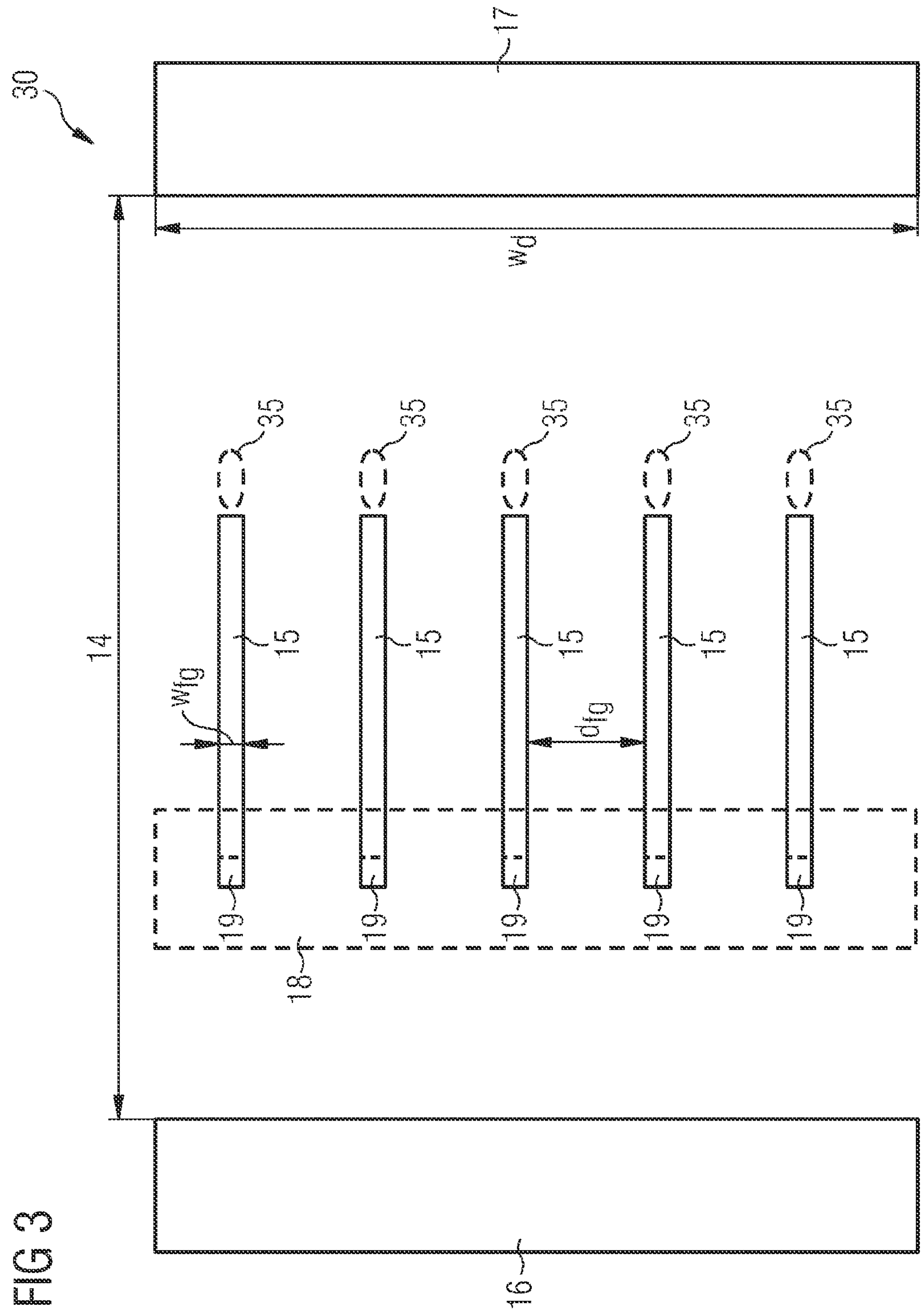
FIG. 3 illustrates a diagrammatic top view of a section of an embodiment of a lateral HEMT.

FIG. 3 illustrates a diagrammatic top view of a section of a lateral HEMT 30. Components of the same function as those in previous figures are identified by the same reference numbers and are not explained again below.

In the illustrated embodiment, the lateral widths $w_{fg}$ of the field plates 15 providing a first plurality of field plates of the lateral HEMT 30 are smaller than the lateral widths $w_{fg}$ of the field plates 15 of the lateral HEMT 10 illustrated in FIG. 2. Additionally, the lateral distance $d_{fg}$ between adjacent field plates 15 is increased. The number of field plates is the same as for the lateral HEMT 10. A relation of the sum of the lateral widths $w_{fg}$ of the field plates 15 to a sum of the lateral distances $d_{fg}$ between adjacent field plates 15 is given by 1:n, wherein n>1 for the embodiments illustrated in FIG. 1 and FIG. 2, and n>5 for the lateral HEMT 30. In a non-illustrated embodiment, n is greater than 10. For increasing values of n, the area of the two-dimensional electron gas, which is not deteriorated by hot charge carriers when breakdown occurs, is increased. Thus, the on-state resistance of the lateral HEMT may be decreased.

In the illustrated embodiment, the lateral distance $d_{fg}$ between adjacent field plates 15 is the same for all field plates 15. In a non-illustrated embodiment, the first plurality of field plates 15 includes a first lateral distance between adjacent field plates 15 and a second lateral distance between adjacent field plates 15, the first lateral distance being different from the second lateral distance. In further non-illustrated embodiments, many or all lateral distances $d_{fg}$ between adjacent field plates 15 are different from one another.

Figure 4:
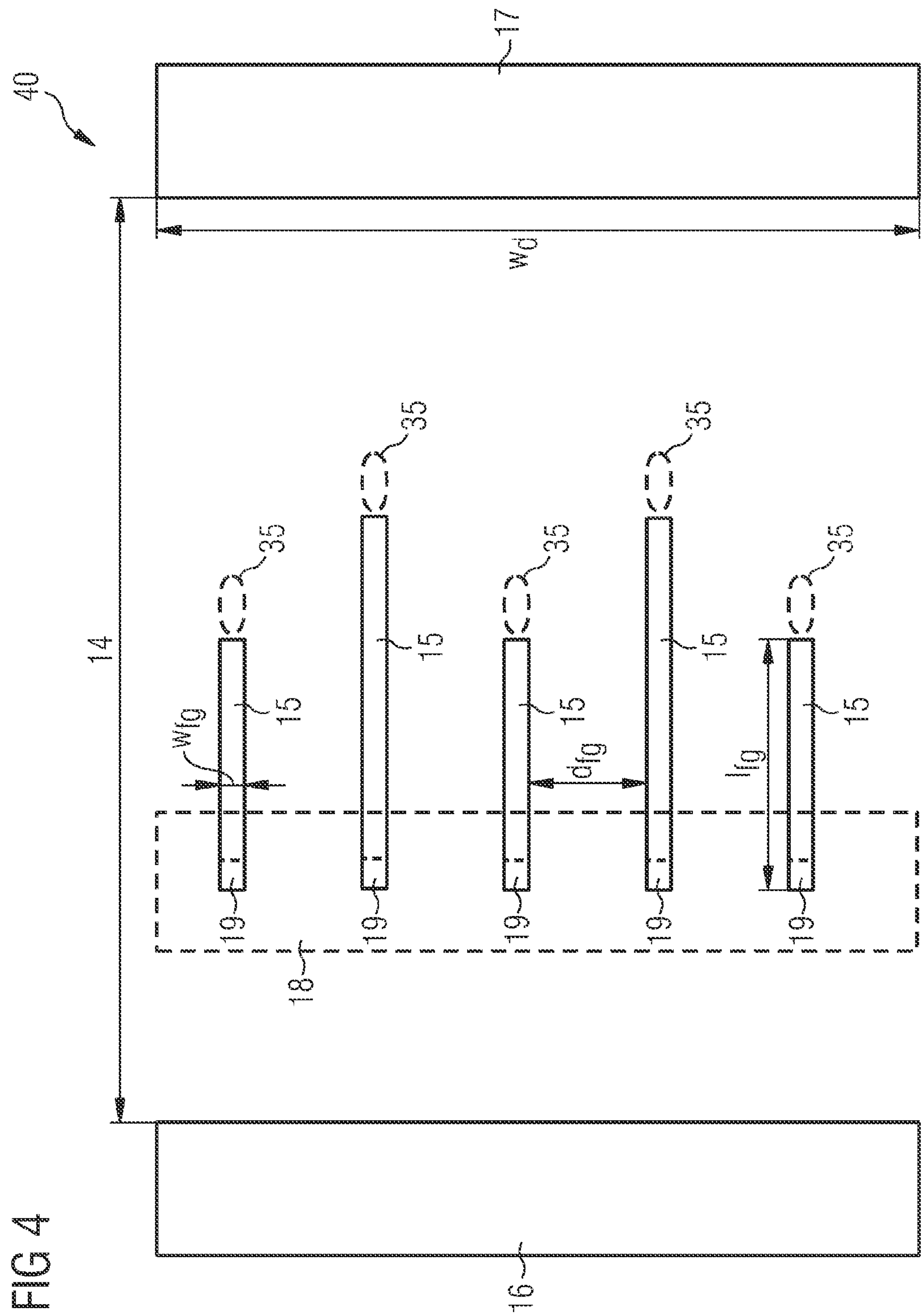
FIG. 4 illustrates a diagrammatic top view of a section of an embodiment of a lateral HEMT.

FIG. 4 illustrates a diagrammatic top view of a section of a lateral HEMT 40. Components of the same function as those in previous figures are identified by the same reference numbers and are not explained again below.

The lateral HEMT 40 differs from the lateral HEMTs 10 and 30 in that the first plurality of field plates 15 includes a first field plate 15 including a first lateral length $l_{fg}$ and a second field plate 15 including a second lateral length, the first lateral length being different from the second lateral length. Thus, the lateral distances between the field plates 15 and the second electrode 17 and hence the lateral positions, at which breakdown occurs, vary.

In the illustrated embodiment, the lateral distance $d_{fg}$ between adjacent field plates 15 is the same for all field plates 15. In a non-illustrated embodiment, the first plurality of field plates 15 includes a first lateral distance between adjacent field plates 15 and a second lateral distance between adjacent field plates 15, the first lateral distance being different from the second lateral distance. In further non-illustrated embodiments, many or all lateral distances $d_{fg}$ between adjacent field plates 15 are different from one another.

Figure 5:
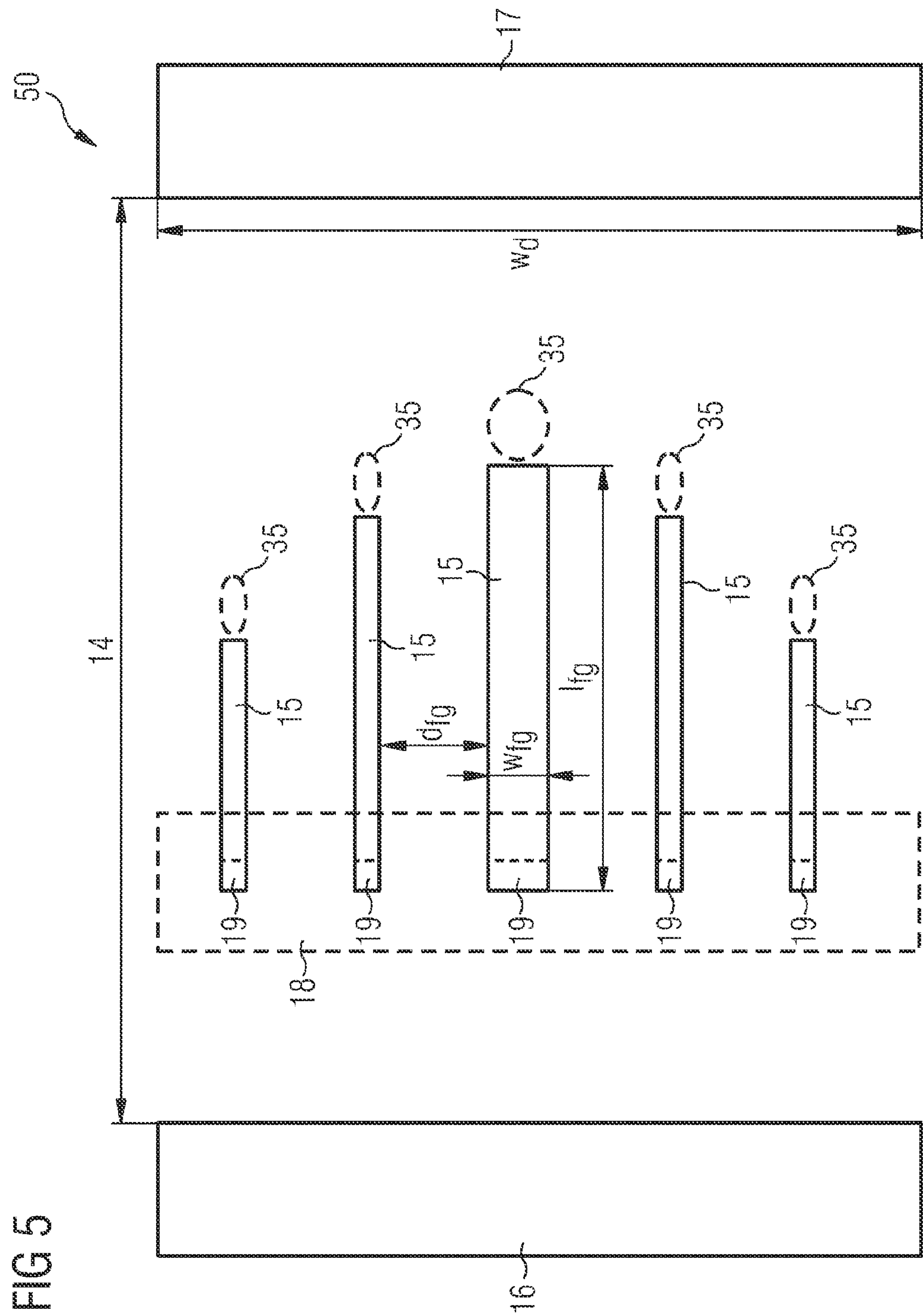
FIG. 5 illustrates a diagrammatic top view of a section of an embodiment of a lateral HEMT.

FIG. 5 illustrates a diagrammatic top view of a section of a lateral HEMT 50. Components of the same function as those in previous figures are identified by the same reference numbers and are not explained again below.

The lateral HEMT 50 differs from the previously illustrated embodiments in that the first plurality of field plates 15 includes a first field plate 15 including a first lateral width $w_{fg}$ and a second field plate 15 including a second lateral width, the first lateral width being different from the second lateral width.

Additionally, the first plurality of field plates 15 includes a first field plate 15 including a first lateral length $l_{fg}$ and a second field plate 15 including a second lateral length, the first lateral length being different from the second lateral length.

In the illustrated embodiment, the lateral distance $d_{fg}$ between adjacent field plates 15 is the same for all field plates 15. In a non-illustrated embodiment, the first plurality of field plates 15 includes a first lateral distance between adjacent field plates 15 and a second lateral distance between adjacent field plates 15, the first lateral distance being different from the second lateral distance. In further non-illustrated embodiments, many or all lateral distances $d_{fg}$ between adjacent field plates 15 are different from one another.

In the embodiments illustrated in FIGS. 1 to 5, the field plates 15 are arranged separately from one another. In further embodiments, a layer including an electrically conductive material, for example a metal or highly doped polysilicon, may be arranged on the passivation layer 13 and may overlap the ends of the field plates 15 which are laterally closer to the first electrode 16 and may electrically couple the field plates 15 to one another. In other embodiments, the field plates 15 are connected to one another in the same layer with further field plate material in a comb-shaped manner. The connection can be established on the side closer to the first electrode 16.

Figure 6A:
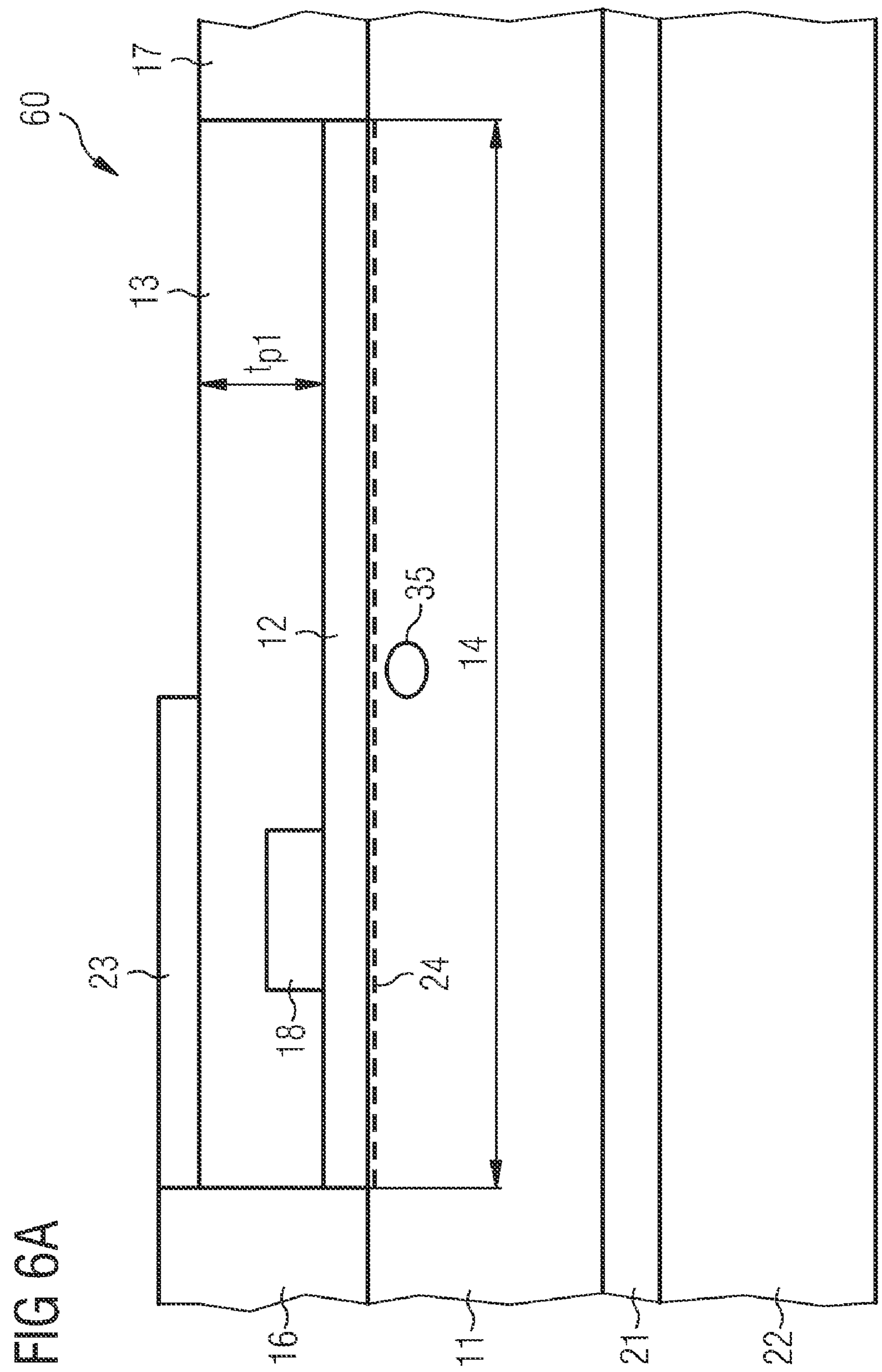
FIG. 6A illustrates a diagrammatic cross-section through a section of an embodiment of a lateral HEMT.

FIG. 6A illustrates a diagrammatic cross-section through a section of a lateral HEMT 60. Components of the same function as those in previous figures are identified by the same reference numbers and are not explained again below.

The lateral HEMT 60 differs from the previously illustrated embodiments in that at least one field plate 23 is arranged at least partially on the passivation layer 13 and is electrically coupled to the first electrode 16. In the illustrated embodiment, the at least one field plate 23 is in direct contact with the first electrode 16. The at least one field plate 23 includes an electrically conductive material such as a metal or highly doped polysilicon. The passivation layer 13 includes a thickness $t_{p1}$.

Figure 6B:
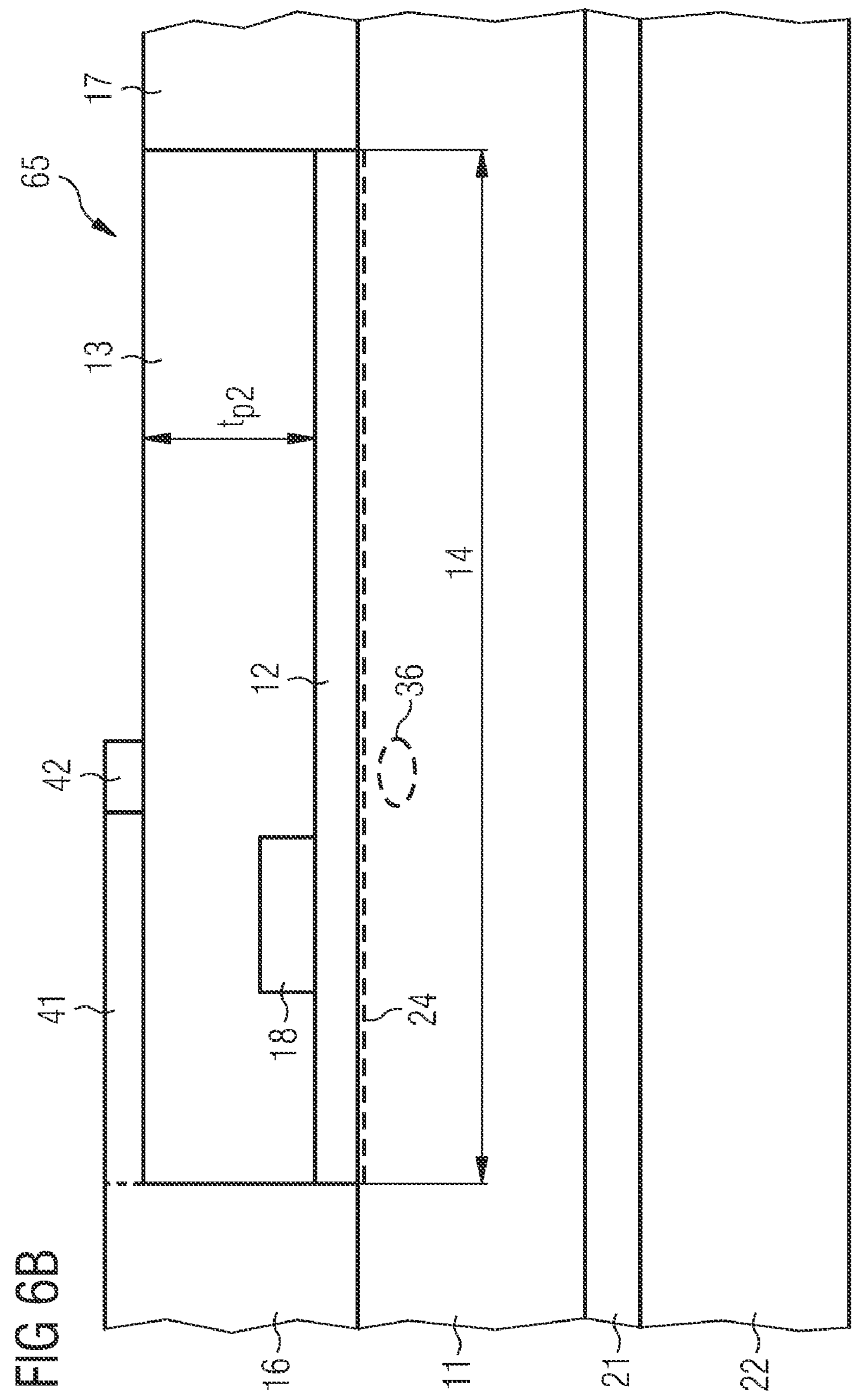
FIG. 6B illustrates a diagrammatic cross-section through a section of an embodiment of a lateral HEMT.

FIG. 6B illustrates a diagrammatic cross-section through a section of a lateral HEMT 65. Components of the same function as those in previous figures are identified by the same reference numbers and are not explained again below.

The lateral HEMT 65 differs from the previously illustrated embodiments in that the first electrode 16 includes an extension region 41 arranged on the passivation layer 13. The extension region 41 overlaps the gate electrode 18 in a vertical direction and laterally extends closer to the second electrode 17 than the gate electrode 16. The extension region 41 includes an electrically conductive material such as a metal or highly doped polysilicon. The extension region 41 may reduce peaks in the electric field strength caused by the edge of the gate electrode 18 which is laterally closer to the second electrode 17. Moreover, the passivation layer 13 includes a thickness $t_{p2}$ which may be chosen greater than the thickness $t_{p1}$ of the passivation layer 13 illustrated in FIG. 6A.

At least one field plate 42 is arranged at least partially on the passivation layer 13 and is electrically coupled to the first electrode 16. In the illustrated embodiment, the at least one field plate 42 is in direct contact with the extension region 41 of the first electrode 16. The at least one field plate 42 includes an electrically conductive material such as a metal or highly doped polysilicon.

The first electrode 16, the extension region 41 and the at least one field plate 42 or the extension region 41 and the at least one field plate 42 may consist of the same material layers and may be formed during the same deposition and structuring steps.

Figure 7A:
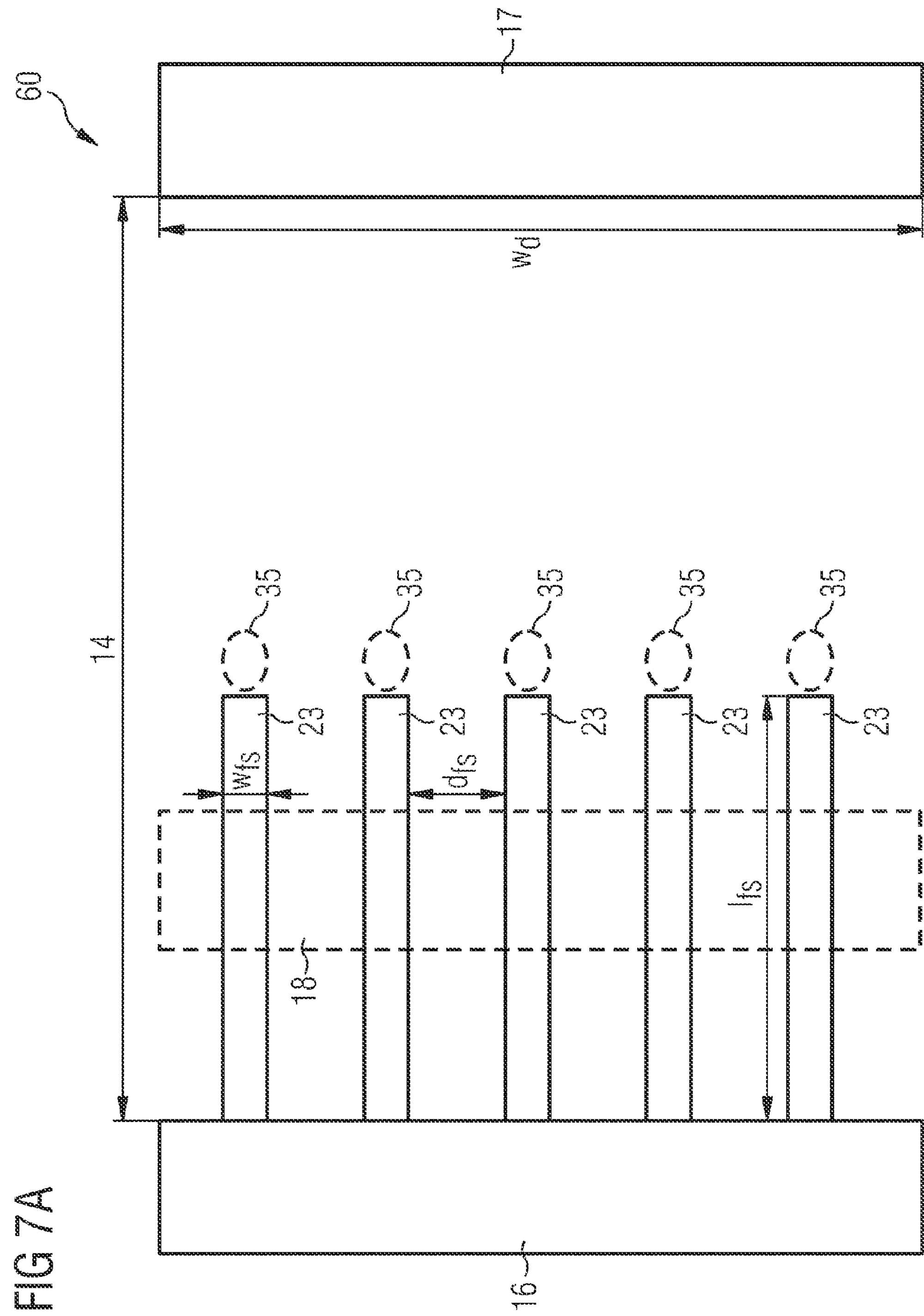
FIG. 7A illustrates a diagrammatic top view of a section of the lateral HEMT illustrated in FIG. 6A.

FIG. 7A illustrates a diagrammatic top view of a section of the lateral HEMT 60 illustrated in FIG. 6A. Components of the same function as those in previous figures are identified by the same reference numbers and are not explained again below.

As illustrated in FIG. 7A, the field plates 23 providing a first plurality of field plates laterally extend closer to the second electrode 17 than the gate electrode 18 and are arranged in a comb-shaped manner. The field plates 23 each include a lateral width $w_{fs}$. The lateral width $w_{fs}$ of the field plates 23 is smaller than the lateral width $w_d$ of the drift region 14, i.e., is given by the relation $w_{fs}<w_d$. Moreover, a sum of the lateral widths $w_{fs}$ of the field plates 23 of the first plurality of field plates is smaller than the lateral width $w_d$.

As illustrated schematically in FIGS. 6A and 7A, when the lateral HEMT 60 is reverse-biased, regions 35 in which breakdown occurs may be pinned towards the ends of the field plates 23 which are laterally closer to the second electrode 17. The two-dimensional electron gas is deteriorated locally in these regions 35 of the drift region 14 by hot charge carriers. However, in the remaining regions of the drift region 14, the electric field strength may be sufficiently lower to avoid breakdown in these regions and thus to avoid a deterioration of the two-dimensional electron gas in these regions. Thus, when the lateral HEMT 60 is forward-biased, the two-dimensional electron gas and hence a conductive channel may be provided in a large area of the drift region 14.

Typically, the sum of the lateral widths $w_{fs}$ of the field plates 23 of the first plurality of field plates is at most 30% of the lateral width $w_d$. In further embodiments, the sum of the lateral widths $w_{fs}$ of the field plates 23 of the first plurality of field plates is at most 10% of the lateral width $w_d$. This increases the area of the two-dimensional electron gas, which is not deteriorated by hot charge carriers when breakdown occurs. Thus, the on-state resistance of the lateral HEMT may be decreased.

In the illustrated embodiment, the lateral distance $d_{fs}$ between adjacent field plates 23 is the same for all field plates 23. In a non-illustrated embodiment, the first plurality of field plates 23 includes a first lateral distance between adjacent field plates 23 and a second lateral distance between adjacent field plates 23, the first lateral distance being different from the second lateral distance. In further non-illustrated embodiments, many or all lateral distances $d_{fs}$ between adjacent field plates 23 are different from one another.

Moreover, in the illustrated embodiment, the lateral widths $w_{fs}$ of the field plates 23 are the same for all field plates 23 and the lateral lengths $l_{fs}$ of the field plates 23 are the same for all field plates 23. In a non-illustrated embodiment, the first plurality of field plates 23 includes a first field plate 23 including a first lateral width $w_{fs}$ and a second field plate 23 including a second lateral width, the first lateral width being different from the second lateral width and/or a first field plate 23 including a first lateral length $l_{fs}$ and a second field plate 23 including a second lateral length, the first lateral length being different from the second lateral length.

Figure 7B:
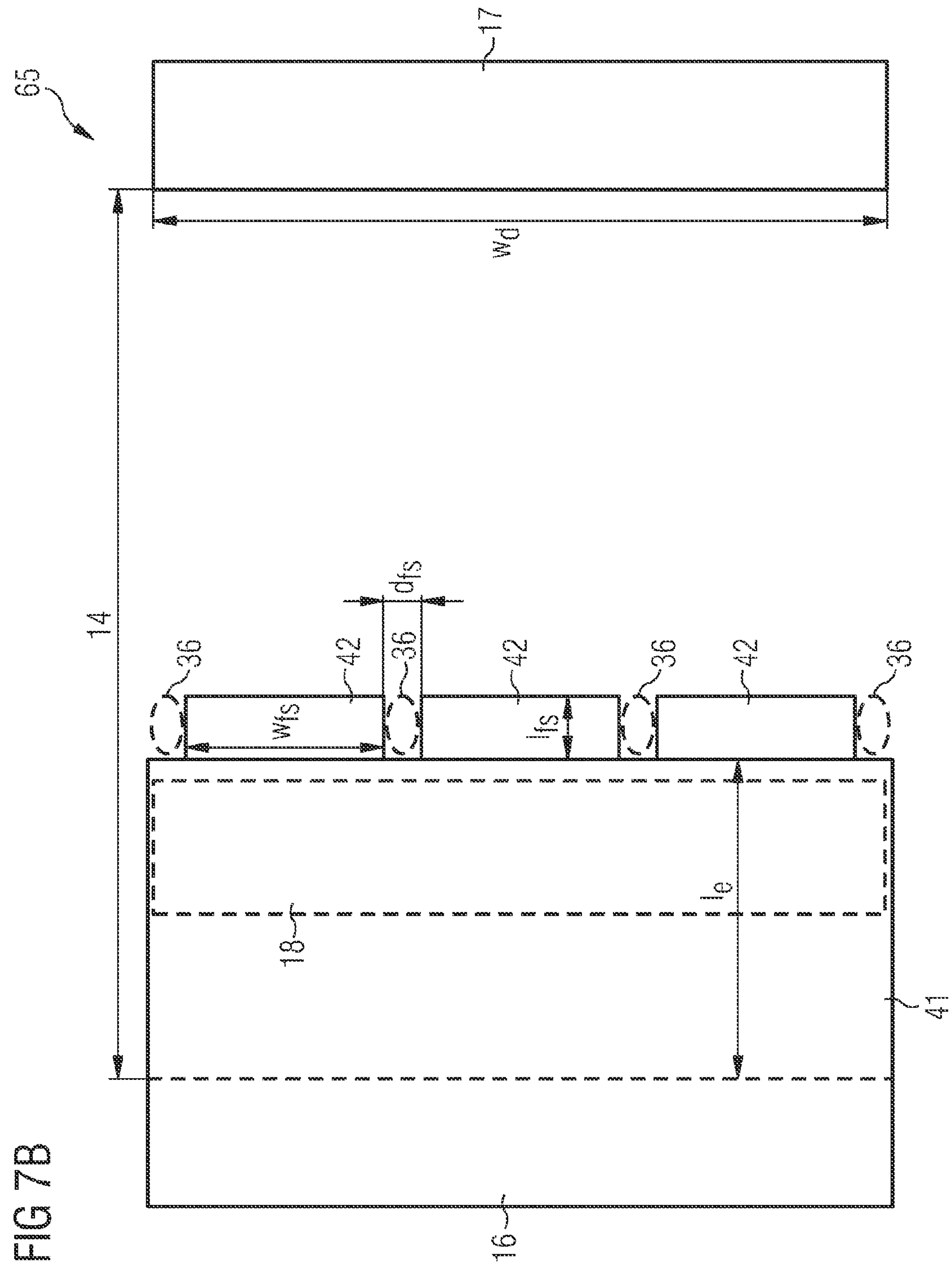
FIG. 7B illustrates a diagrammatic top view of a section of the lateral HEMT illustrated in FIG. 6B.

FIG. 7B illustrates a diagrammatic top view of a section of the lateral HEMT 65 illustrated in FIG. 6B. Components of the same function as those in previous figures are identified by the same reference numbers and are not explained again below.

As illustrated in FIG. 7B, the field plates 42 providing a first plurality of field plates laterally extend closer to the second electrode 17 than the gate electrode 18 and are arranged in a comb-shaped manner. The field plates 42 each include a lateral width $w_{fs}$ and the extension region 41 of the first electrode 16 includes a lateral length $l_e$. The lateral width $w_{fs}$ of the field plates 42 is smaller than the lateral width $w_d$ of the drift region 14, i.e., is given by the relation $w_{fs}<w_d$. Moreover, a sum of the lateral widths $w_{fs}$ of the field plates 42 of the first plurality of field plates is smaller than the lateral width $w_d$.

As illustrated schematically in FIGS. 6B and 7B, when the lateral HEMT 65 is reverse-biased, regions 36 in which breakdown occurs may be pinned towards the end of the extension region 41 which is laterally closer to the second electrode 17 adjacent to a region of the extension region 41 which is not adjoined by a field plate 42. The two-dimensional electron gas is deteriorated locally in these regions 36 of the drift region 14 by hot charge carriers. However, in the remaining regions of the drift region 14, the electric field strength may be sufficiently lower to avoid breakdown in these regions and thus to avoid a deterioration of the two-dimensional electron gas in these regions. Thus, when the lateral HEMT 65 is forward-biased, the two-dimensional electron gas and hence a conductive channel may be provided in a large area of the drift region 14.

Typically, the sum of the lateral widths $w_{fs}$ of the field plates 42 of the first plurality of field plates is at least 70% of the lateral width $w_d$. In further embodiments, the sum of the lateral widths $w_{fs}$ of the field plates 42 of the first plurality of field plates is at least 90% of the lateral width $w_d$. This increases the area of the two-dimensional electron gas, which is not deteriorated by hot charge carriers when breakdown occurs. Thus, the on-state resistance of the lateral HEMT may be decreased.

In the illustrated embodiment, the lateral distance $d_{fs}$ between adjacent field plates 42 is the same for all field plates 42. In a non-illustrated embodiment, the first plurality of field plates 42 includes a first lateral distance between adjacent field plates 42 and a second lateral distance between adjacent field plates 42, the first lateral distance being different from the second lateral distance. In further non-illustrated embodiments, many or all lateral distances $d_{fs}$ between adjacent field plates 42 are different from one another.

Moreover, in the illustrated embodiment, the lateral widths $w_{fs}$ of the field plates 42 are the same for all field plates 42 and the lateral lengths $l_{fs}$ of the field plates 42 are the same for all field plates 42. In a non-illustrated embodiment, the first plurality of field plates 42 includes a first field plate 42 including a first lateral width $w_{fs}$ and a second field plate 42 including a second lateral width, the first lateral width being different from the second lateral width and/or a first field plate 42 including a first lateral length $l_{fs}$ and a second field plate 42 including a second lateral length, the first lateral length being different from the second lateral length.

As illustrated in FIGS. 6A, 6B, 7A and 7B, the positions of the regions in which breakdown occurs when the lateral HEMT is reverse-biased may vary depending on layout details, in particular the thickness of the passivation layer 13, the lateral lengths $l_{fs}$ of the field plates and the lateral length $l_e$ of the extension region 41 of the first electrode 16. For a small value of the thickness of the passivation layer 13 and/or high values of the lateral lengths $l_{fs}$ of the field plates, breakdown may occur first in the regions 35, i.e., the breakdown positions may be located near the end of the field plate fingers. For higher values of the thickness of the passivation layer 13 and lower values of the lateral lengths $l_{fs}$ of the field plates, in particular for a high value of the lateral length $l_e$ of the extension region 41 of the first electrode 16, breakdown may occur first in the regions 36, i.e., the breakdown positions may be located between the field plates close to the end of the gate electrode 18 which is oriented toward the second electrode 17.

Figure 8:
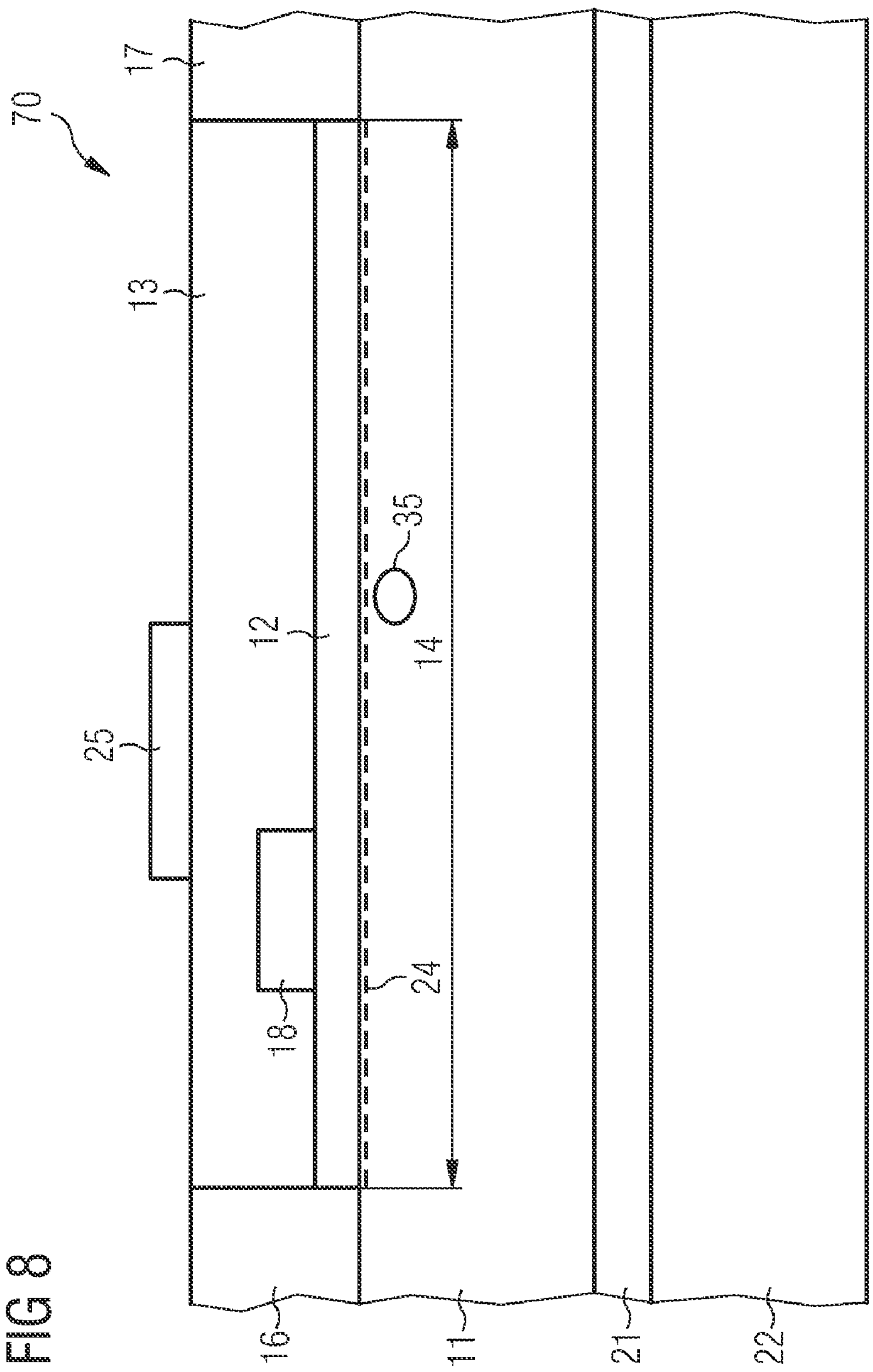
FIG. 8 illustrates a diagrammatic cross-section through a section of an embodiment of a lateral HEMT.

FIG. 8 illustrates a diagrammatic cross-section through a section of a lateral HEMT 70. Components of the same function as those in previous figures are identified by the same reference numbers and are not explained again below.

The lateral HEMT 70 differs from the lateral HEMT 60 in that at least one field plate 25 which is at least partially arranged on the passivation layer 13 and is electrically coupled to the first electrode 16 is not in direct contact with the first electrode 16. Instead, a connection wiring (not illustrated) electrically couples the at least one field plate 25 to the first electrode 16. The at least one field plate 25 at least partially overlaps the gate electrode 18 in a vertical direction and includes an electrically conductive material such as a metal or highly doped polysilicon.

Figure 9:
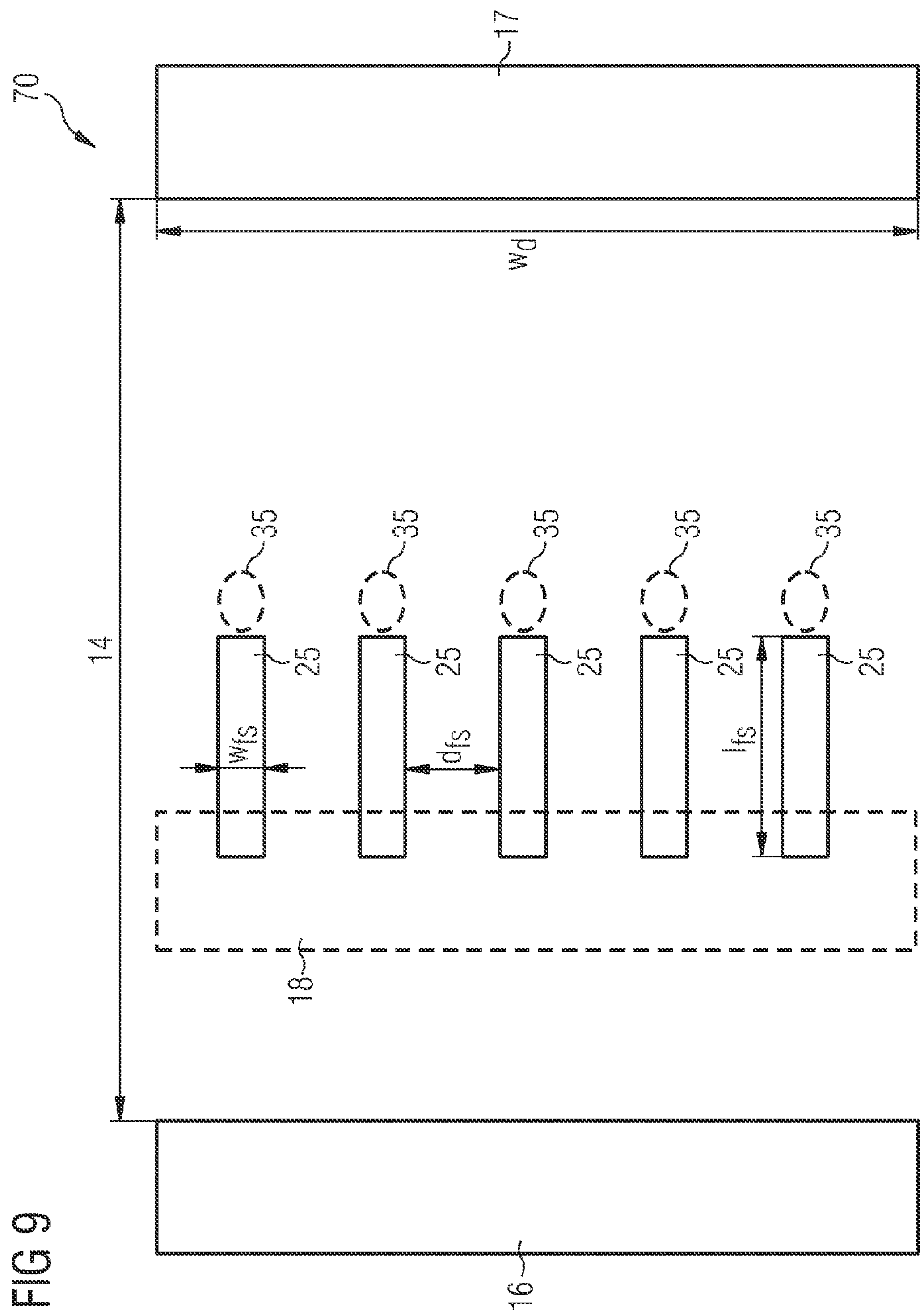
FIG. 9 illustrates a diagrammatic top view of a section of the lateral HEMT illustrated in FIG. 8.

FIG. 9 illustrates a diagrammatic top view of a section of the lateral HEMT 70 illustrated in FIG. 8. Components of the same function as those in previous figures are identified by the same reference numbers and are not explained again below.

As illustrated in FIG. 9, the field plates 25 providing a first plurality of field plates laterally extend closer to the second electrode 17 than the gate electrode 18 and are arranged in a comb-shaped manner. In the illustrated embodiment, the lateral widths $w_{fs}$ of the field plates 25 are the same for each field plate 25. In a non-illustrated embodiment, the first plurality of field plates 25 includes a first field plate 25 including a first lateral width $w_{fs}$ and a second field plate 25 including a second lateral width, the first lateral width being different from the second lateral width. In further non-illustrated embodiments, the lateral widths $w_{fs}$ of many or all field plates 25 are different from one another.

In the illustrated embodiment, the lateral distance $d_{fs}$ between adjacent field plates 25 is the same for all field plates 25. In a non-illustrated embodiment, the first plurality of field plates 25 includes a first lateral distance between adjacent field plates 25 and a second lateral distance between adjacent field plates 25, the first lateral distance being different from the second lateral distance. In further non-illustrated embodiments, many or all lateral distances $d_{fs}$ between adjacent field plates 25 are different from one another.

Moreover, in the illustrated embodiment, the lateral lengths $l_{fs}$ of the field plates 25 are the same for all field plates 25. In a non-illustrated embodiment, the first plurality of field plates 25 includes a first field plate 25 including a first lateral length $l_{fs}$ and a second field plate 25 including a second lateral length, the first lateral length being different from the second lateral length. In further non-illustrated embodiments, the lateral lengths $l_{fs}$ of many or all field plates 25 are different from one another.

Figure 10:
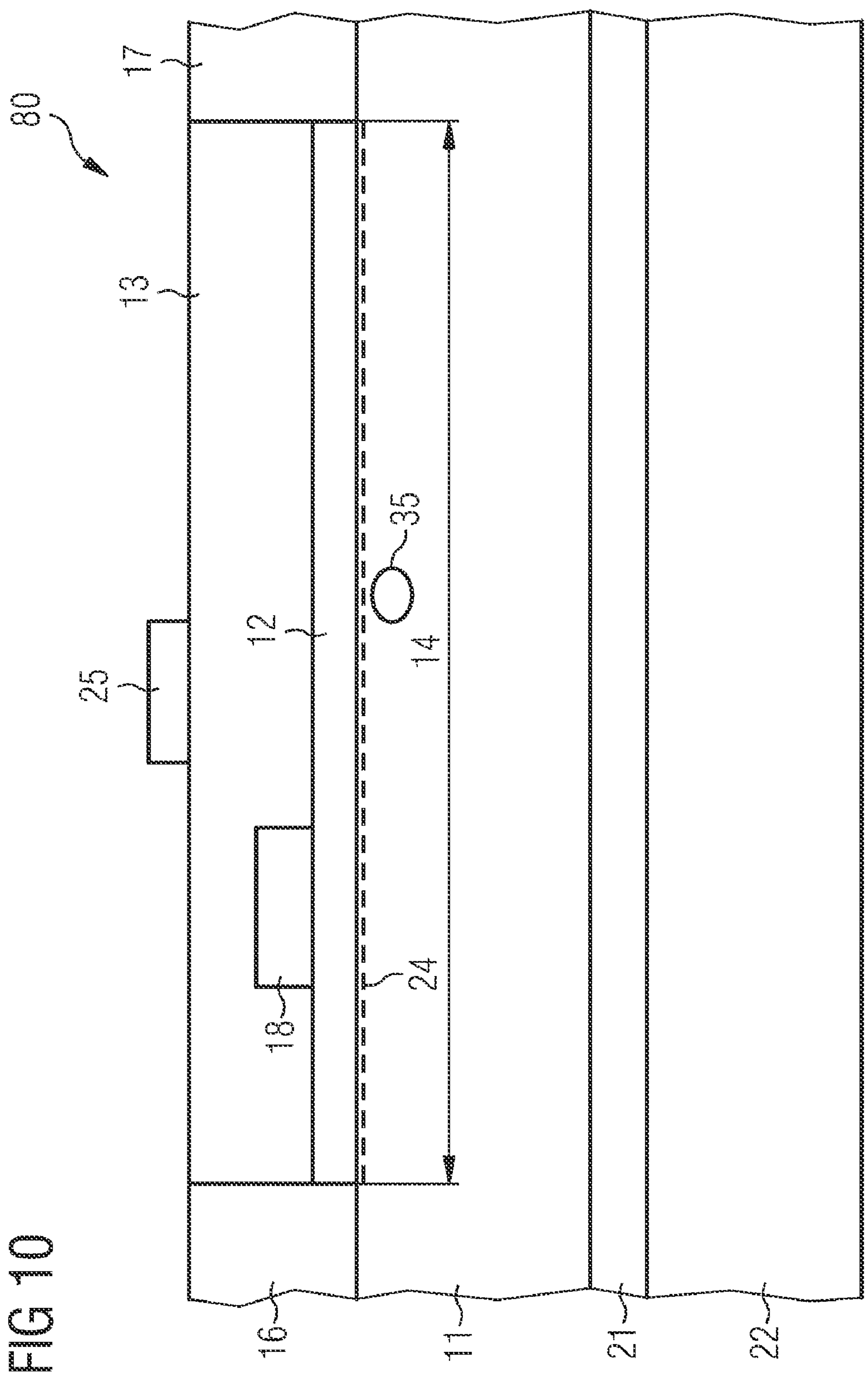
FIG. 10 illustrates a diagrammatic cross-section through a section of an embodiment of a lateral HEMT.

FIG. 10 illustrates a diagrammatic cross-section through a section of a lateral HEMT 80. Components of the same function as those in previous figures are identified by the same reference numbers and are not explained again below.

The lateral HEMT 80 differs from the lateral HEMT 70 in that at least one field plate 25 which is arranged at least partially on the passivation layer 13 and is electrically coupled to the first electrode 16 by a non-illustrated connection wiring, is entirely arranged closer to the second electrode 17 in a lateral direction than the gate electrode 18.

Figure 11:
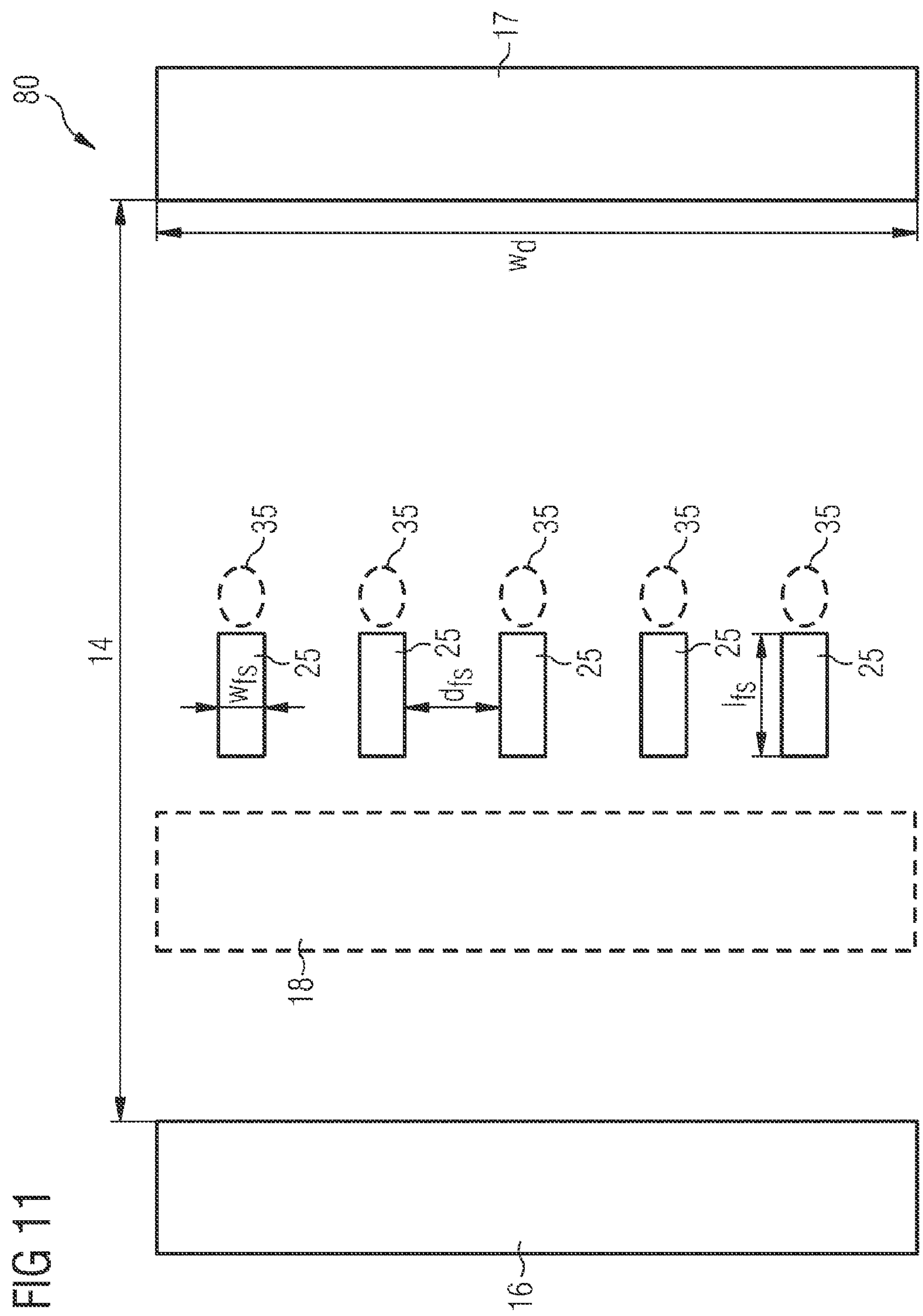
FIG. 11 illustrates a diagrammatic top view of a section of the lateral HEMT illustrated in FIG. 10.

FIG. 11 illustrates a diagrammatic top view of a section of the lateral HEMT 80 illustrated in FIG. 10. Components of the same function as those in previous figures are identified by the same reference numbers and are not explained again below.

As illustrated in FIG. 11, the field plates 25 are arranged entirely between the gate electrode 18 and the second electrode 17 in a region of the drift region 14. In the illustrated embodiment, the lateral widths $w_{fs}$ of the field plates 25 are the same for each field plate 25. In a non-illustrated embodiment, the first plurality of field plates 25 includes a first field plate 25 including a first lateral width $w_{fs}$ and a second field plate 25 including a second lateral width, the first lateral width being different from the second lateral width. In further non-illustrated embodiments, the lateral widths $w_{fs}$ of many or all field plates 25 are different from one another.

In the illustrated embodiment, the lateral distance $d_{fs}$ between adjacent field plates 25 is the same for all field plates 25. In a non-illustrated embodiment, the first plurality of field plates 25 includes a first lateral distance between adjacent field plates 25 and a second lateral distance between adjacent field plates 25, the first lateral distance being different from the second lateral distance. In further non-illustrated embodiments, many or all lateral distances $d_{fs}$ between adjacent field plates 25 are different from one another.

Moreover, in the illustrated embodiment, the lateral lengths $l_{fs}$ of the field plates 25 are the same for all field plates 25. In a non-illustrated embodiment, the first plurality of field plates 25 includes a first field plate 25 including a first lateral length $l_{fs}$ and a second field plate 25 including a second lateral length, the first lateral length being different from the second lateral length. In further non-illustrated embodiments, the lateral lengths $l_{fs}$ of many or all field plates 25 are different from one another.

Figure 12:
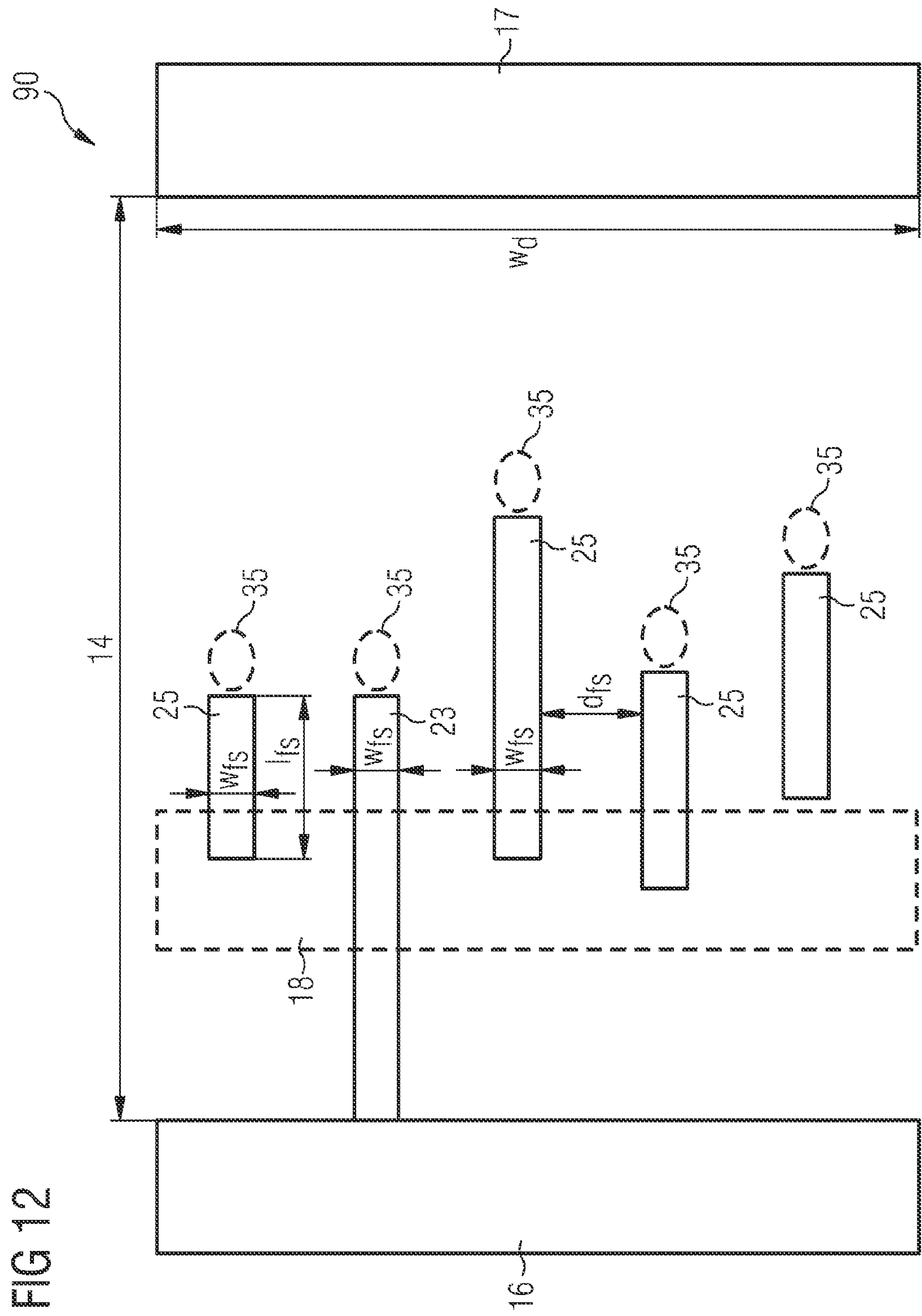
FIG. 12 illustrates a diagrammatic top view of a section of an embodiment of a lateral HEMT.

FIG. 12 illustrates a diagrammatic top view of a section of a lateral HEMT 90. Components of the same function as those in previous figures are identified by the same reference numbers and are not explained again below.

The lateral HEMT 90 differs from the previously illustrated embodiments in that it includes both a field plate 23 which is in direct contact with the first electrode 16, and field plates 25 which are electrically coupled to the first electrode 16 via a non-illustrated connection wiring.

As illustrated in FIG. 12, the lateral distances between the field plates 25 and the second electrode 17 vary and the first plurality of field plates 25 includes a first field plate 25 including a first lateral length $l_{fs}$ and a second field plate 25 including a second lateral length, the first lateral length being different from the second lateral length. In non-illustrated embodiments, the lateral lengths $l_{fs}$ of many or all field plates 25 are different from one another.

Additionally, the first plurality of field plates 25 includes a first field plate 25 at least partially overlapping the gate electrode 18 in a vertical direction and a second field plate 25 being arranged entirely between the gate electrode 18 and the second electrode 17 in a region of the drift region 14.

In the illustrated embodiment, the lateral widths $w_{fs}$ of the field plates 23 and 25 are the same for each field plate. In a non-illustrated embodiment, the first plurality of field plates 23 and 25 includes a first field plate including a first lateral width $w_{fs}$ and a second field plate including a second lateral width, the first lateral width being different from the second lateral width. In further non-illustrated embodiments, the lateral widths $w_{fs}$ of many or all field plates are different from one another.

In the illustrated embodiment, the lateral distance $d_{fs}$ between adjacent field plates 25 is the same for all field plates 25. In a non-illustrated embodiment, the first plurality of field plates 25 includes a first lateral distance between adjacent field plates 25 and a second lateral distance between adjacent field plates 25, the first lateral distance being different from the second lateral distance. In non-illustrated embodiments, many or all lateral distances $d_{fs}$ between adjacent field plates 25 are different from one another.

Figure 13:
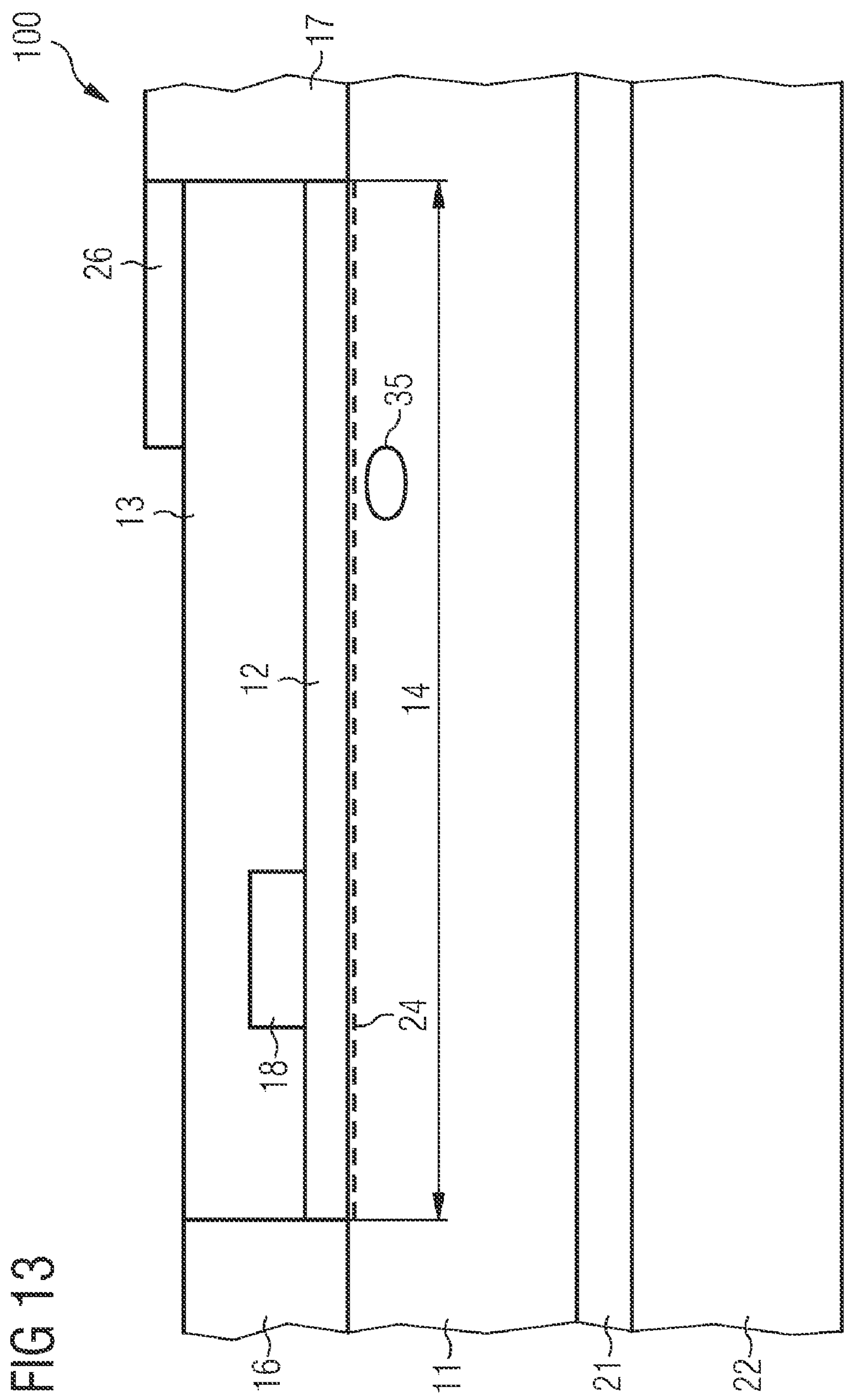
FIG. 13 illustrates a diagrammatic cross-section through a section of an embodiment of a lateral HEMT.

FIG. 13 illustrates a diagrammatic cross-section through the section of a lateral HEMT 100. Components of the same function as those in previous figures are identified by the same reference numbers and are not explained again below.

The lateral HEMT 100 differs from the previously illustrated embodiments in that at least one field plate 26 which is arranged at least partially on the passivation layer 13 in a region of the drift region 14 is electrically coupled to the second electrode 17. In the illustrated embodiment, the at least one field plate 26 is in direct contact with the second electrode 17. The at least one field plate 26 includes an electrically conductive material such as a metal or highly doped polysilicon.

Figure 14:
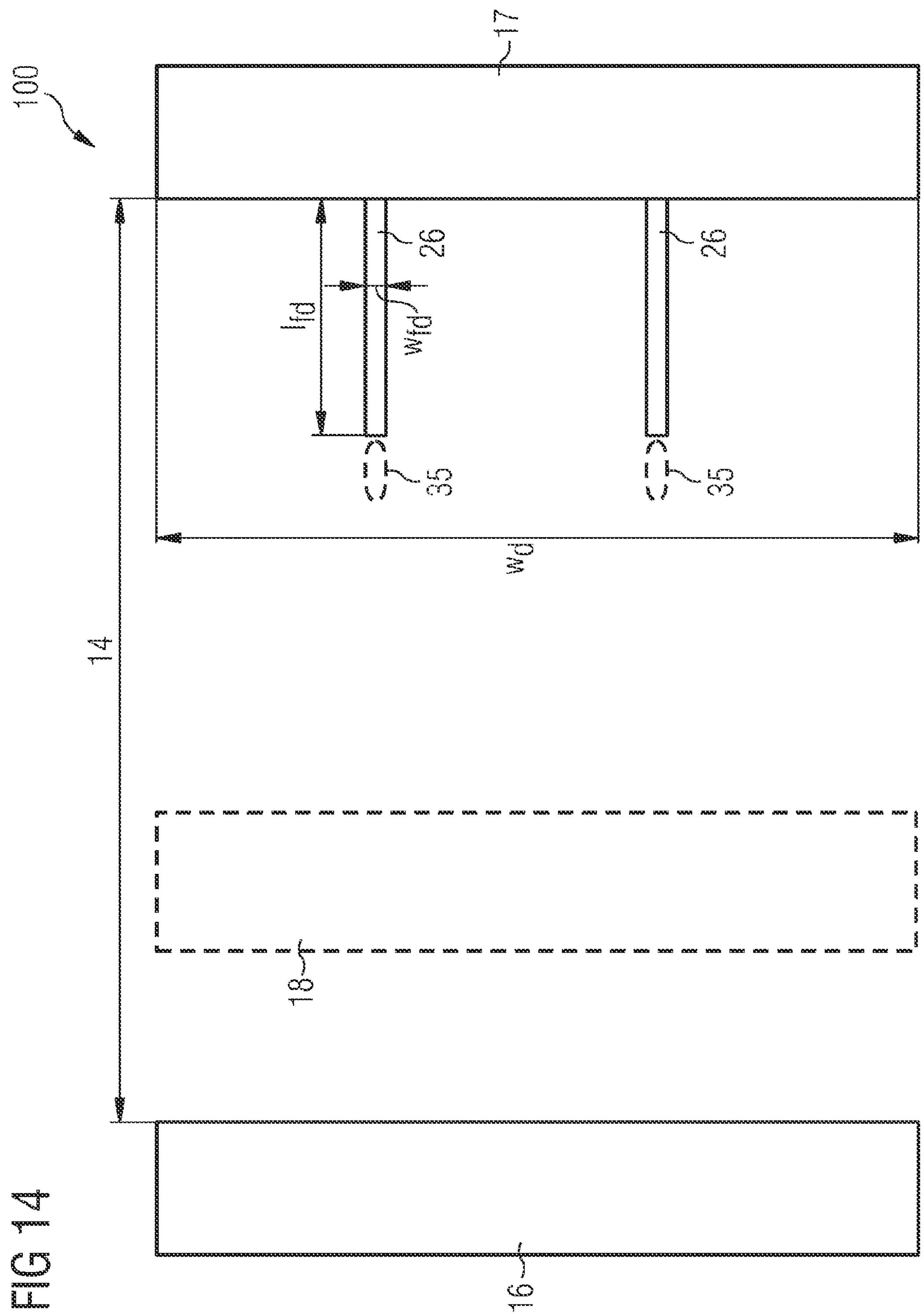
FIG. 14 illustrates a diagrammatic top view of a section of the lateral HEMT illustrated in FIG. 13.

FIG. 14 illustrates a diagrammatic top view of a section of the lateral HEMT 100 illustrated in FIG. 13. Components of the same function as those in previous figures are identified by the same reference numbers and are not explained again below.

As illustrated in FIG. 14, the field plates 26 providing a first plurality of field plates each include a lateral width $w_{fd}$ and are arranged in a comb-shaped manner. The lateral width $w_{fd}$ of the field plates 26 is smaller than the lateral width $w_d$ of the drift region 14, i.e., is given by the relation $w_{fd}<w_d$. Moreover, a sum of the lateral widths $w_{fd}$ of the field plates 26 of the first plurality of field plates is smaller than the lateral width $w_d$.

As illustrated schematically in FIGS. 13 and 14, when the lateral HEMT 100 is reverse-biased, regions 35 in which breakdown occurs may be pinned towards the ends of the field plates 26 which are laterally closer to the first electrode 16. The two-dimensional electron gas is deteriorated locally in these regions 35 of the drift region 14 by hot charge carriers. However, in the remaining regions of the drift region 14, the electric field strength may be sufficiently lowered to avoid breakdown in these regions and thus to avoid a deterioration of the two-dimensional electron gas in these regions. Thus, when the lateral HEMT 100 is forward-biased, the two-dimensional electron gas and hence a conductive channel may be provided in a large area of the drift region 14.

In the illustrated embodiment, the lateral widths $w_{fd}$ of the field plates 26 are the same for each field plate 26. In a non-illustrated embodiment, the first plurality of field plates 26 includes a first field plate 26 including a first lateral width $w_{fd}$ and a second field plate 26 including a second lateral width, the first lateral width being different from the second lateral width. In further non-illustrated embodiments, the lateral widths $w_{fd}$ of many or all field plates 26 are different from one another.

Moreover, in the illustrated embodiment, the lateral lengths $l_{fd}$ of the field plates 26 are the same for all field plates 26. In a non-illustrated embodiment, the first plurality of field plates 26 includes a first field plate 26 including a first lateral length $l_{fd}$ and a second field plate 26 including a second lateral length, the first lateral length being different from the second lateral length. In further non-illustrated embodiments, the lateral lengths $l_{fd}$ of many or all field plates 26 are different from one another.

In the embodiments illustrated in FIGS. 1 to 14, the at least one field plate or the first plurality of field plates is electrically coupled to one of the first electrode 16, the second electrode 17 and the gate electrode 18. In a non-illustrated embodiment, the at least one field plate or the first plurality of field plates is electrically coupled to a further electrode, the further electrode being at a potential different from a potential of the first electrode 16, the second electrode 17 and the gate electrode 18.

Figure 15:
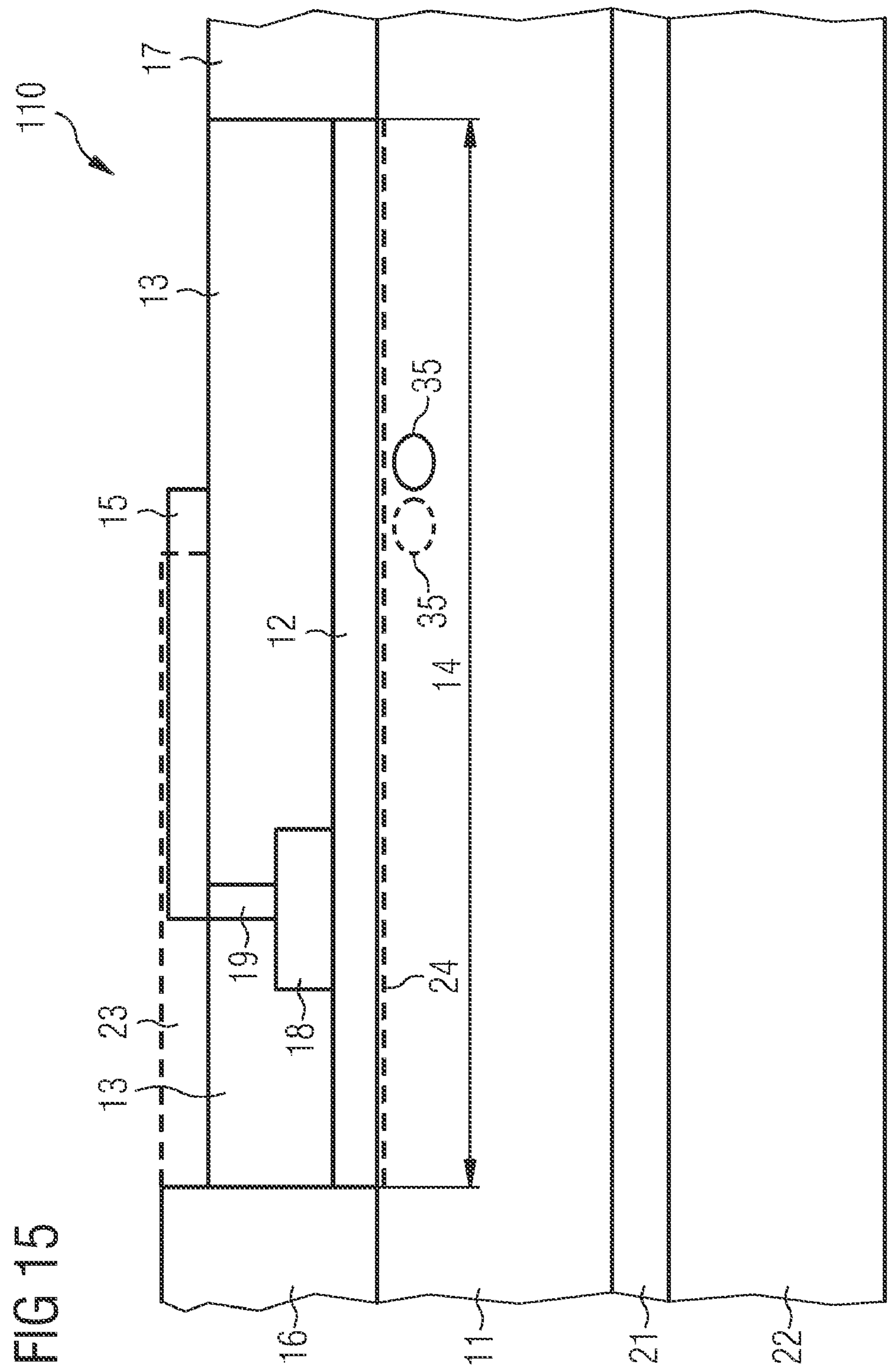
FIG. 15 illustrates a diagrammatic cross-section through a section of an embodiment of a lateral HEMT.

FIG. 15 illustrates a diagrammatic cross-section through a section of a lateral HEMT 110. Components of the same function as those in previous figures are identified by the same reference numbers and are not explained again below.

The lateral HEMT 110 differs from the previously illustrated embodiments in that it includes a first plurality of field plates 15, the first plurality of field plates 15 being electrically coupled to the gate electrode 18, and a second plurality of field plates 23, the second plurality of field plates 23 being electrically coupled to the first electrode 16. The field plates 23 are arranged in lateral layers which are different from the layer illustrated in the cross-section of FIG. 15. Therefore, the field plates 23 are illustrated by a dashed line.

The field plates 15 are electrically coupled to the gate electrode 18 via through contacts 19. The through contacts 19 are arranged between the field plates 15 and the gate electrode 18 in a region of the passivation layer 13 and directly contact both the field plates 15 and the gate electrode 18. The field plates 23 are in direct contact with the first electrode 16. The field plates 15 and 23 include an electrically conductive material such as a metal or highly doped polysilicon.

Figure 16:
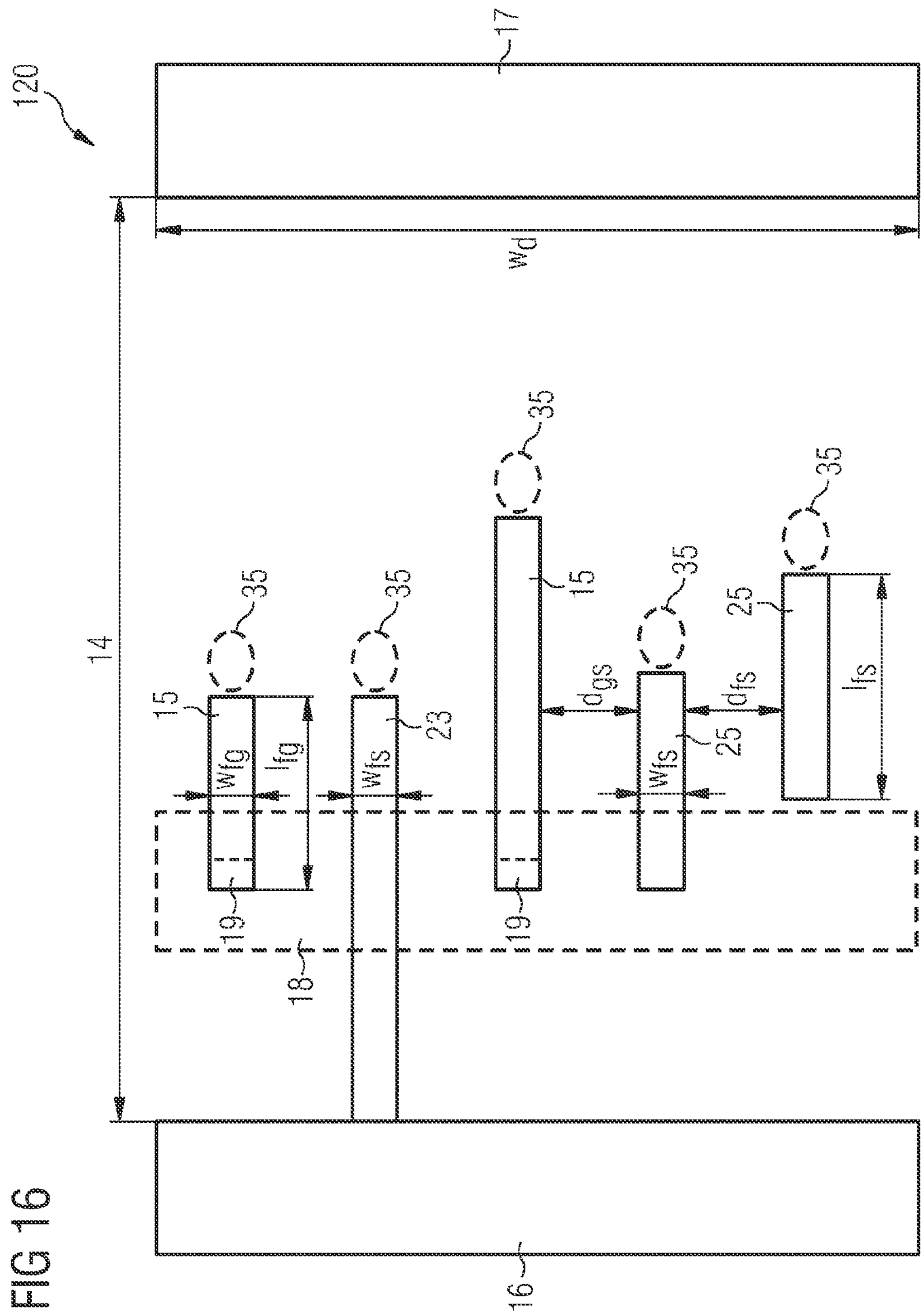
FIG. 16 illustrates a diagrammatic top view of a section of an embodiment of a lateral HEMT.

FIG. 16 illustrates a diagrammatic top view of a section of a lateral HEMT 120. Components of the same function as those in previous figures are identified by the same reference numbers and are not explained again below.

As illustrated in FIG. 16, the lateral HEMT 120 includes a first plurality of field plates 15 being electrically coupled to the gate electrode 18 and a second plurality of field plates 23 and 25 being electrically coupled to the first electrode 16. The field plate 23 of the second plurality of field plates is in direct contact with the first electrode 16, whereas the field plates 25 of the second plurality of field plates are coupled to the first electrode 16 via a non-illustrated connection wiring.

The lateral width $w_{fg}$ of the field plates 15 is smaller than the lateral width $w_d$ of the drift region 14, i.e., is given by the relation $w_{fg}<w_d$ and the lateral width $w_{fs}$ of the field plates 23 and 25 is smaller than the lateral width $w_d$ of the drift region 14, i.e., is given by the relation $w_{fs}<w_d$. Moreover, a sum of the lateral widths $w_{fg}$ of the field plates 15 of the first plurality of field plates is smaller than the lateral width $w_d$ and a sum of the lateral widths $w_{fs}$ of the field plates 23 and 25 of the second plurality of field plates is smaller than the lateral width $w_d$.

In the illustrated embodiment, the lateral distances between the field plates 15 and the second electrode 17 and the lateral distances between the field plates 25 and the second electrodes 17 vary. Moreover, the lateral lengths $l_{fg}$ of the first plurality of field plates 15 and the lateral lengths $l_{fs}$ of the second plurality of field plates 23 and 25 vary.

In the illustrated embodiment, the lateral widths $w_{fg}$ of the first plurality of field plates 15 are the same for each field plate 15 and the lateral widths $w_{fs}$ of the second plurality of field plates 23 and 25 are the same for each field plate 23 and 25. In a non-illustrated embodiment, the first plurality of field plates 15 includes a first field plate 15 including a first lateral width $w_{fg}$ and a second field plate 15 including a second lateral width, the first lateral width being different from the second lateral width and/or the second plurality of field plates 23 and 25 includes a first field plate including a first lateral width $w_{fs}$ and a second field plate including a second lateral width, the first lateral width being different from the second lateral width.

In the illustrated embodiment, the lateral width $w_{fg}$ of the field plates 15 of the first plurality of field plates is the same as the lateral width $w_{fs}$ of the field plates 23 and 25 of the second plurality of field plates. In a non-illustrated embodiment, the lateral widths of the field plates 15 and of the field plates 23 and 25 are different.

In the illustrated embodiment, a lateral distance $d_{gs}$ between adjacent field plates of the first plurality of field plates and the second plurality of field plates is the same for all field plates. In a non-illustrated embodiment, the lateral distances between adjacent field plates of the first plurality of field plates and the second plurality of field plates vary.

Figure 17:
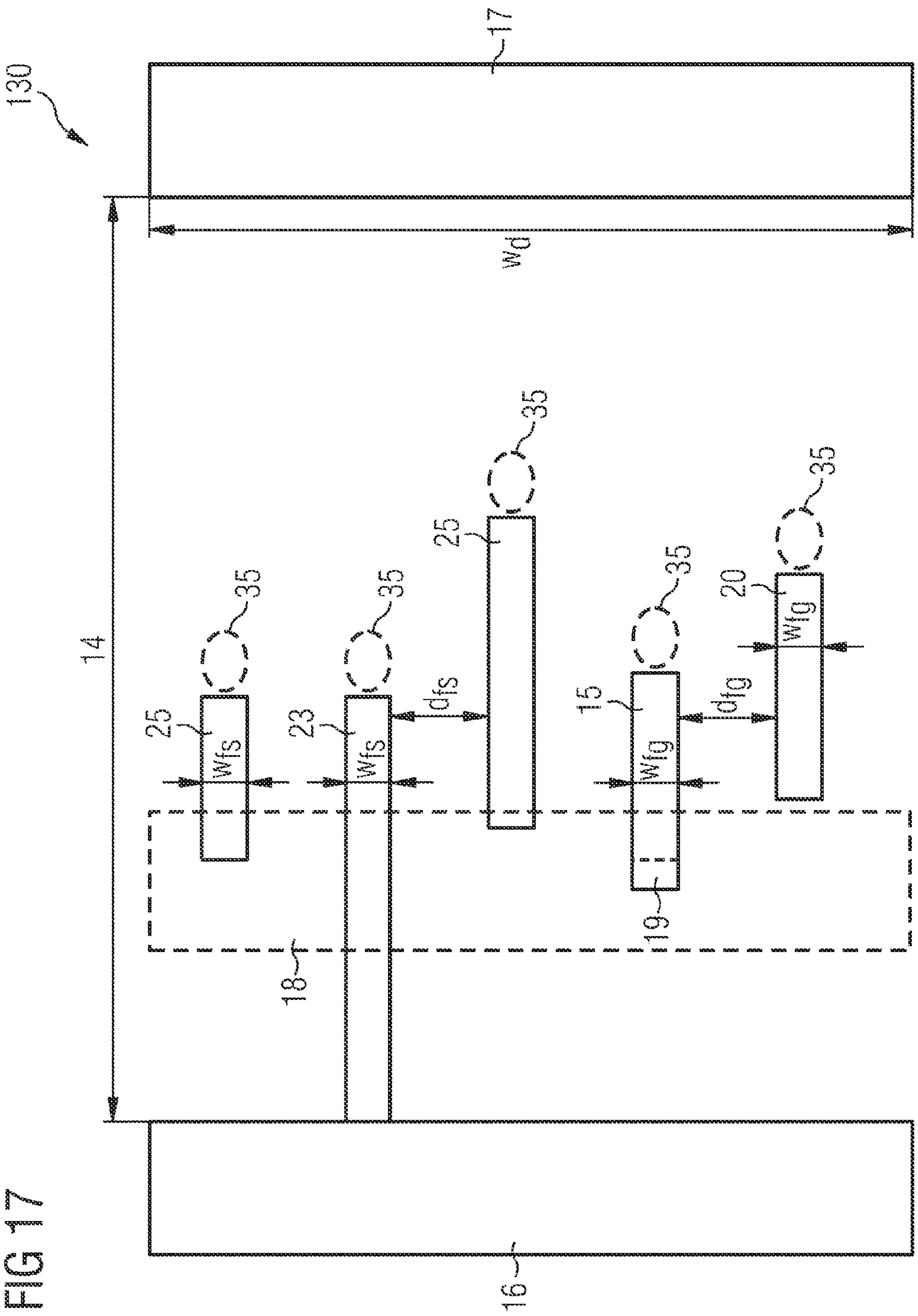
FIG. 17 illustrates a diagrammatic top view of a section of an embodiment of a lateral HEMT.

FIG. 17 illustrates a diagrammatic top view of a section of a lateral HEMT 130. Components of the same function as those in previous figures are identified by the same reference numbers and are not explained again below.

The lateral HEMT 130 differs from the lateral HEMT 120 in that a field plate 20 is electrically coupled to the gate electrode 18 via a non-illustrated connection wiring. The field plate 20 includes an electrically conductive material such as a metal or highly doped polysilicon.

In the illustrated embodiment, the lateral widths $w_{fg}$ of the first plurality of field plates 15 and 20 are the same for each field plate 15 and 20 and the lateral widths $w_{fs}$ of the second plurality of field plates 23 and 25 are the same for each field plate 23 and 25. In a non-illustrated embodiment, the first plurality of field plates 15 and 20 includes a first field plate including a first lateral width $w_{fg}$ and a second field plate including a second lateral width, the first lateral width being different from the second lateral width and/or the second plurality of field plates 23 and 25 includes a first field plate including a first lateral width $w_{fs}$ and a second field plate including a second lateral width, the first lateral width being different from the second lateral width.

Figure 18:
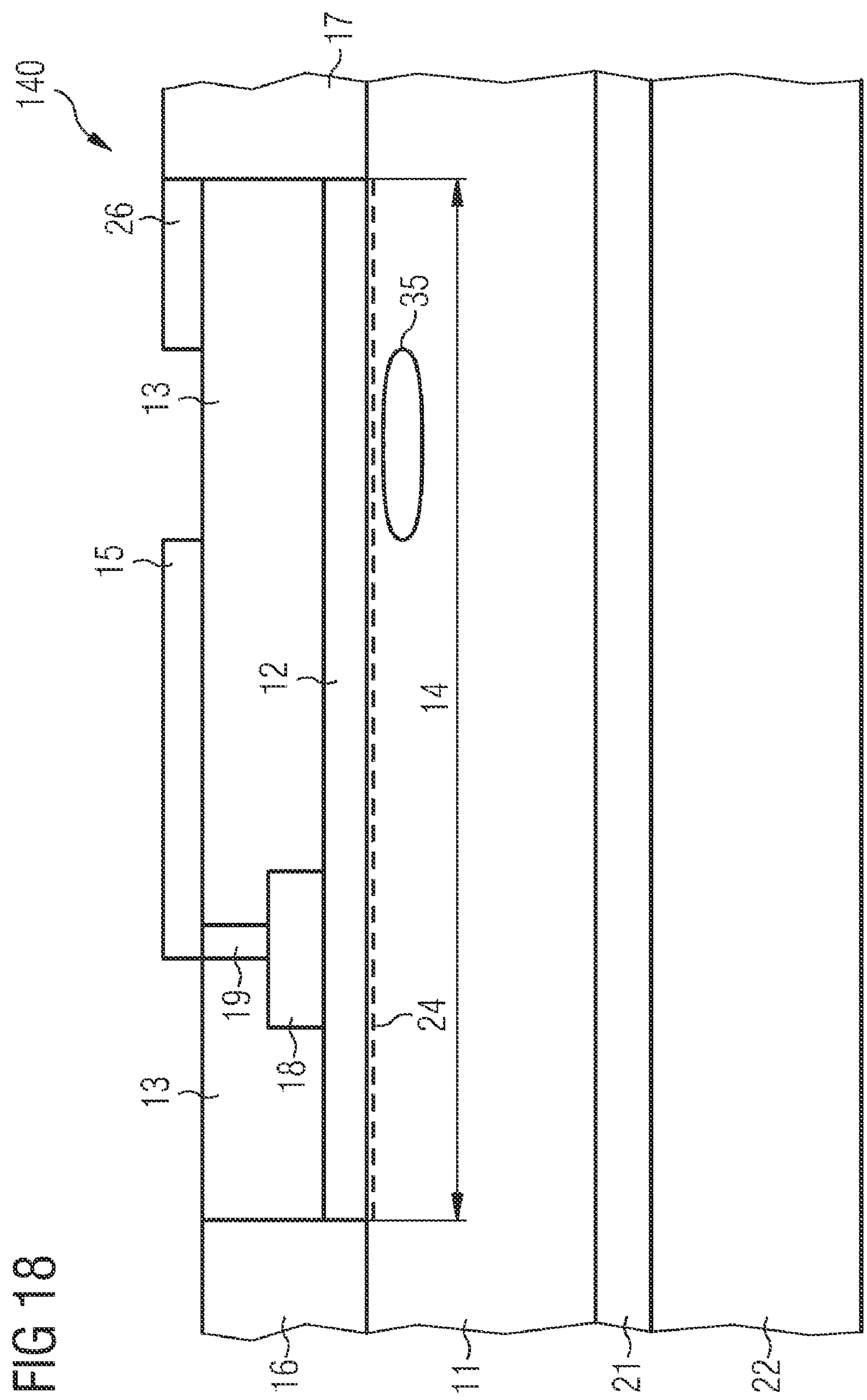
FIG. 18 illustrates a diagrammatic cross-section through a section of an embodiment of a lateral HEMT.

FIG. 18 illustrates a diagrammatic cross-section through a section of a lateral HEMT 140. Components of the same function as those in previous figures are identified by the same reference numbers and are not explained again below.

The lateral HEMT 140 differs from the previously illustrated embodiments in that a first plurality of field plates 15 is electrically coupled to the gate electrode 18 and a second plurality of field plates 26 is electrically coupled to the second electrode 17.

The field plates 15 are electrically coupled to the gate electrode 18 via through contacts 19. The through contacts 19 are arranged between the field plates 15 and the gate electrode 18 in a region of the passivation layer 13 and directly contact both the field plates 15 and the gate electrode 18. The field plates 26 are in direct contact with the second electrode 17. The field plates 15 and 26 include an electrically conductive material such as a metal or highly doped polysilicon.

Figure 19:
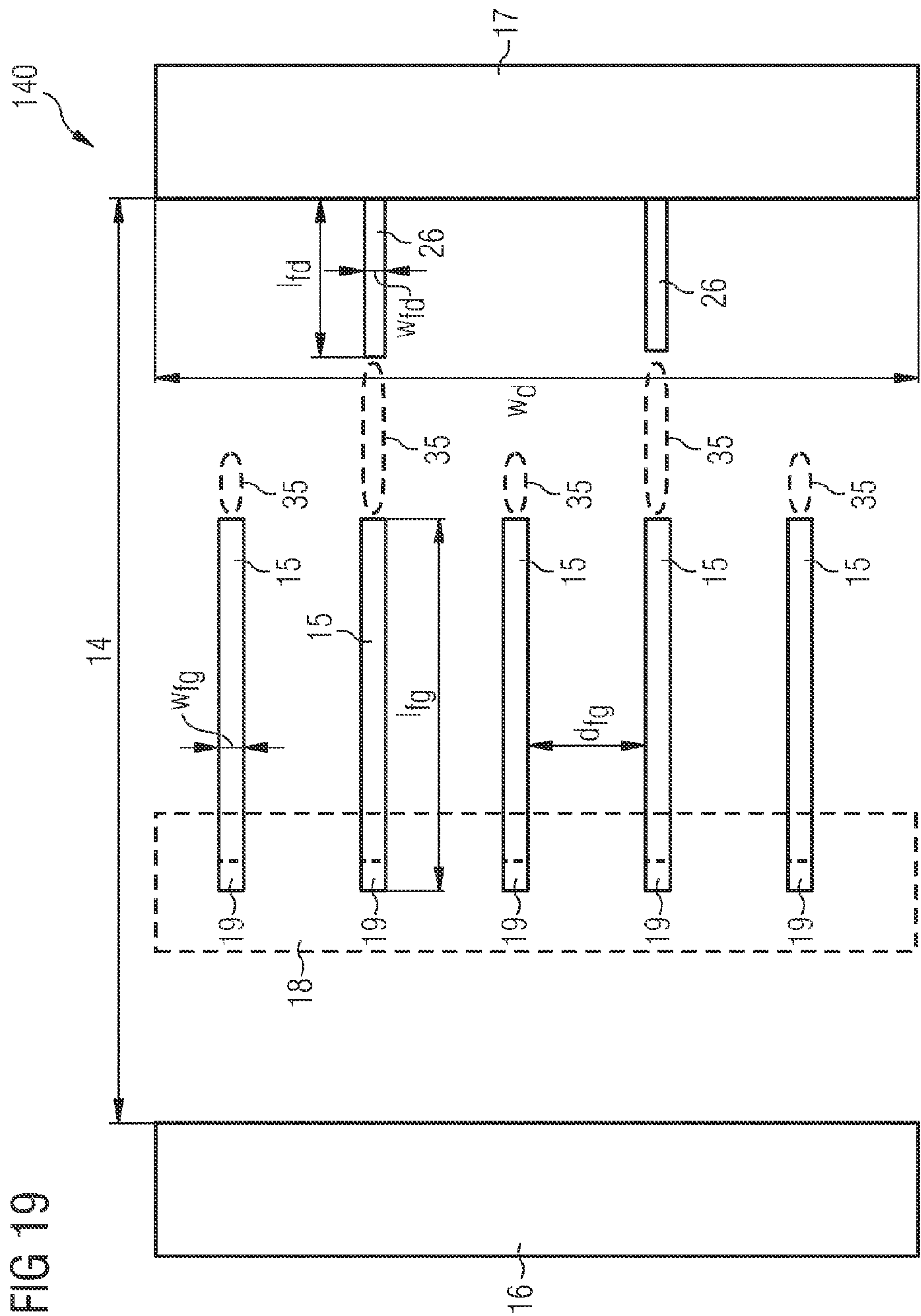
FIG. 19 illustrates a diagrammatic top view of a section of the lateral HEMT illustrated in FIG. 18.

FIG. 19 illustrates a diagrammatic top view of a section of the lateral HEMT 140 illustrated in FIG. 18. Components of the same function as those in previous figures are identified by the same reference numbers and are not explained again below.

As illustrated in FIG. 19, the field plates 15 of the first plurality of field plates each include a lateral width $w_{fg}$, which is the same for all field plates 15, and the field plates 26 of the second plurality of field plates each include a lateral width $w_{fd}$, which is the same for all field plates 26. In a non-illustrated embodiment, the first plurality of field plates 15 includes a first field plate 15 including a first lateral width $w_{fg}$ and a second field plate 15 including a second lateral width, the first lateral width being different from the second lateral width and/or the second plurality of field plates 26 includes a first field plate 26 including a first lateral width $w_{fd}$ and a second field plate 26 including a second lateral width, the first lateral width being different from the second lateral width.

Moreover, in the illustrated embodiment, the lateral widths $w_{fg}$ and $w_{fd}$ are the same. In a non-illustrated embodiment, $w_{fg}$ is different from $w_{fd}$.

The lateral width $w_{fg}$ of the field plates 15 is smaller than the lateral width $w_d$ of the drift region 14, i.e., is given by the relation $w_{fg}<w_d$ and the lateral width $w_{fd}$ of the field plates 26 is smaller than the lateral width $w_d$ of the drift region 14, i.e., is given by the relation $w_{fd}<w_d$. Moreover, a sum of the lateral widths $w_{fg}$ of the field plates 15 of the first plurality of field plates is smaller than the lateral width $w_d$ and a sum of the lateral widths $w_{fd}$ of the field plates 26 of the second plurality of field plates is smaller than the lateral width $w_d$.

In the illustrated embodiment, the lateral distance $d_{fg}$ between adjacent field plates 15 is the same for all field plates 15. In a non-illustrated embodiment, the first plurality of field plates 15 includes a first lateral distance between adjacent field plates 15 and a second lateral distance between adjacent field plates 15, the first lateral distance being different from the second lateral distance. In further non-illustrated embodiments, many or all lateral distances $d_{fg}$ between adjacent field plates 15 are different from one another.

Moreover, in the illustrated embodiment, the lateral lengths $l_{fg}$ of the field plates 15 are the same for all field plates 15 and the lateral lengths $l_{fd}$ of the field plates 26 are the same for all field plates 26. In a non-illustrated embodiment, the first plurality of field plates 15 includes a first field plate 15 including a first lateral length $l_{fg}$ and a second field plate 15 including a second lateral length, the first lateral length being different from the second lateral length and/or the second plurality of field plates 26 includes a first field plate 26 including a first lateral length $l_{fd}$ and a second field plate 26 including a second lateral length, the first lateral length being different from the second lateral length.

Figure 20:
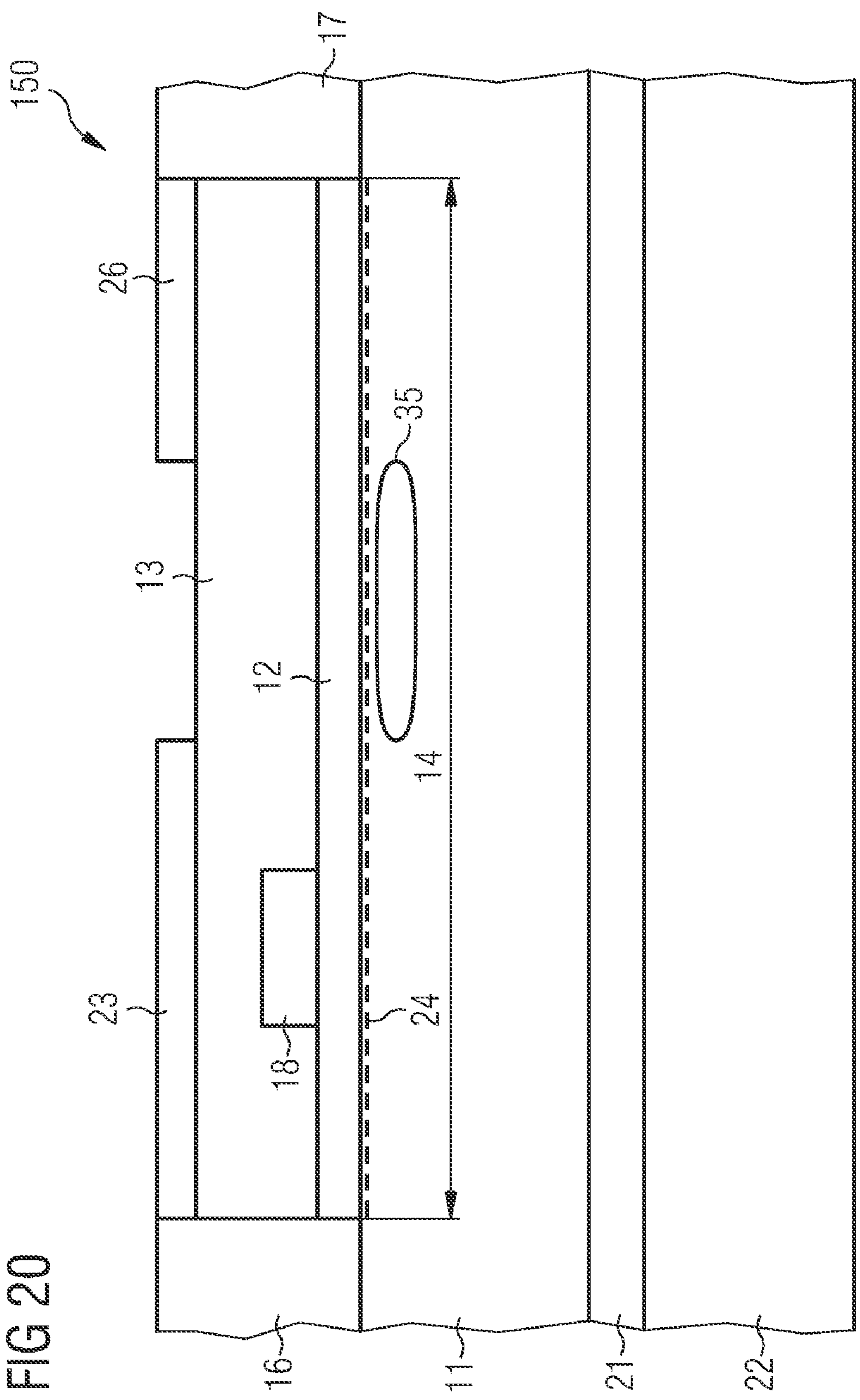
FIG. 20 illustrates a diagrammatic cross-section through a section of an embodiment of a lateral HEMT.

FIG. 20 illustrates a diagrammatic cross-section through a section of a lateral HEMT 150. Components of the same function as those in previous figures are identified by the same reference numbers and are not explained again below.

The lateral HEMT 150 differs from the previously illustrated embodiments in that a first plurality of field plates 23 is electrically coupled to the first electrode 16 and a second plurality of field plates 26 is electrically coupled to the second electrode 17.

The field plates 23 are in direct contact with the first electrode 16 and the field plates 26 are in direct contact with the second electrode 17. The field plates 23 and 26 include an electrically conductive material such as a metal or highly doped polysilicon.

Figure 21:
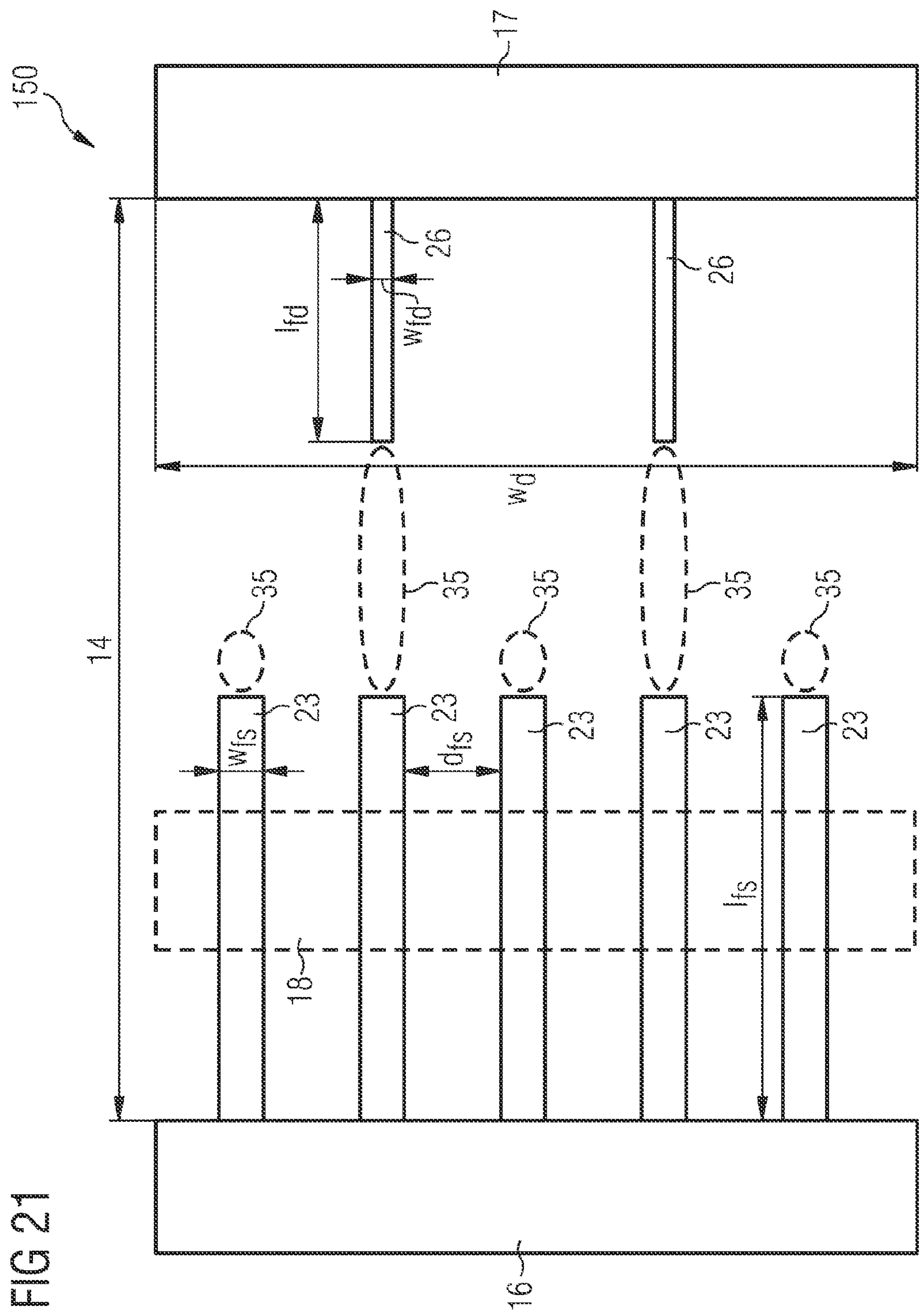
FIG. 21 illustrates a diagrammatic top view of a section of the lateral HEMT illustrated in FIG. 20.

FIG. 21 illustrates a diagrammatic top view of a section of the lateral HEMT 150 illustrated in FIG. 20. Components of the same function as those in previous figures are identified by the same reference numbers and are not explained again below.

As illustrated in FIG. 21, the lateral width $w_{fs}$ of the field plates 23 of the first plurality of field plates is the same for each field plate 23 and the lateral width $w_{fd}$ of the field plates 26 of the second plurality of field plates is the same for each field plate 26. In a non-illustrated embodiment, the first plurality of field plates 23 includes a first field plate 23 including a first lateral width $w_{fs}$ and a second field plate 23 including a second lateral width, the first lateral width being different from the second lateral width and/or the second plurality of field plates 26 includes a first field plate 26 including a first lateral width $w_{fd}$ and a second field plate 26 including a second lateral width, the first lateral width being different from the second lateral width.

The lateral width $w_{fs}$ of the field plates 23 is smaller than the lateral width $w_d$ of the drift region 14, i.e., is given by the relation $w_{fs}<w_d$ and the lateral width $w_{fd}$ of the field plates 26 is smaller than the lateral width $w_d$ of the drift region 14, i.e., is given by the relation $w_{fd}<w_d$. Moreover, a sum of the lateral widths $w_{fs}$ of the field plates 23 of the first plurality of field plates is smaller than the lateral width $w_d$ and a sum of the lateral widths $w_{fd}$ of the field plates 26 of the second plurality of field plates is smaller than the lateral width $w_d$.

In the illustrated embodiment, the lateral distance $d_{fs}$ between adjacent field plates 23 is the same for all field plates 23. In a non-illustrated embodiment, the first plurality of field plates 23 includes a first lateral distance between adjacent field plates 23 and a second lateral distance between adjacent field plates 23, the first lateral distance being different from the second lateral distance. In further non-illustrated embodiments, many or all lateral distances $d_{fs}$ between adjacent field plates 23 are different from one another.

Moreover, in the illustrated embodiment, the lateral lengths $l_{fs}$ of the field plates 23 are the same for all field plates 23 and the lateral lengths $l_{fd}$ of the field plates 26 are the same for all field plates 26. In a non-illustrated embodiment, the first plurality of field plates 23 includes a first field plate 23 including a first lateral length $l_{fs}$ and a second field plate 23 including a second lateral length, the first lateral length being different from the second lateral length and/or the second plurality of field plates 26 includes a first field plate 26 including a first lateral length $l_{fd}$ and a second field plate 26 including a second lateral length, the first lateral length being different from the second lateral length.

In the illustrated embodiment, $w_{fs}$ is different from $w_{fd}$. In a non-illustrated embodiment, the lateral widths $w_{fs}$ and $w_{fd}$ are the same.

Figure 22:
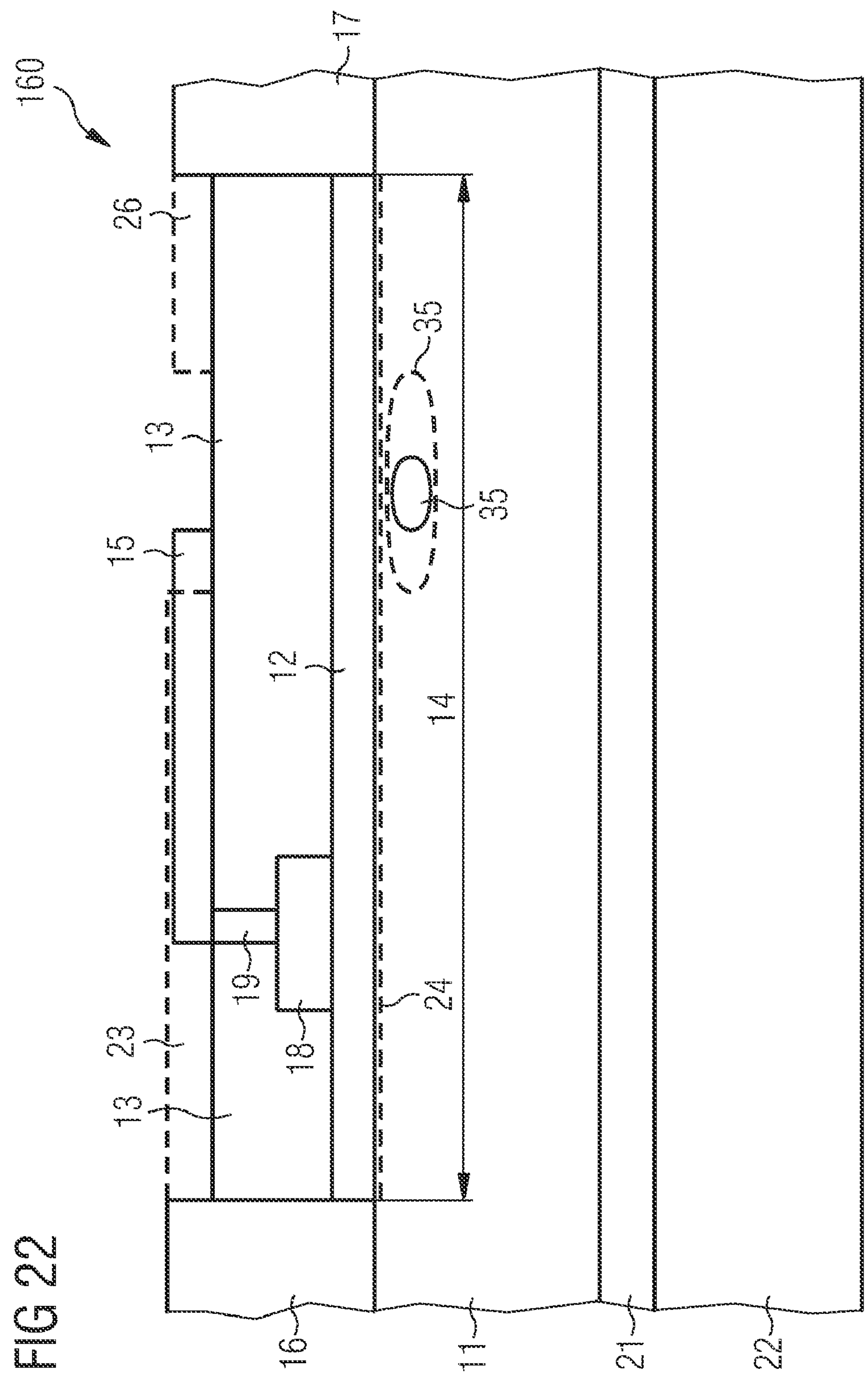
FIG. 22 illustrates a diagrammatic cross-section through a section of an embodiment of a lateral HEMT.

FIG. 22 illustrates a diagrammatic cross-section through a section of a lateral HEMT 160. Components of the same function as those in previous figures are identified by the same reference numbers and are not explained again below.

The lateral HEMT 160 differs from the previously illustrated embodiments in that a first plurality of field plates 15 is electrically coupled to the gate electrode 18, a second plurality of field plates 23 is electrically coupled to the first electrode 16 and a third plurality of field plates 26 is electrically coupled to the second electrode 17. The field plates 23 and 26 are arranged in lateral layers which are different from the layer illustrated in the cross-section of FIG. 22. Therefore, the field plates 23 and 26 are illustrated by a dashed line.

The field plates 15 are electrically coupled to the gate electrode 18 via through contacts 19. The through contacts 19 are arranged between the field plates 15 and the gate electrode 18 in a region of the passivation layer 13 and directly contact both the field plates 15 and the gate electrode 18. The field plates 23 are in direct contact with the first electrode 16 and the field plates 26 are in direct contact with the second electrode 17. The field plates 15, 23 and 26 include an electrically conductive material such as a metal or highly doped polysilicon.

Figure 23:
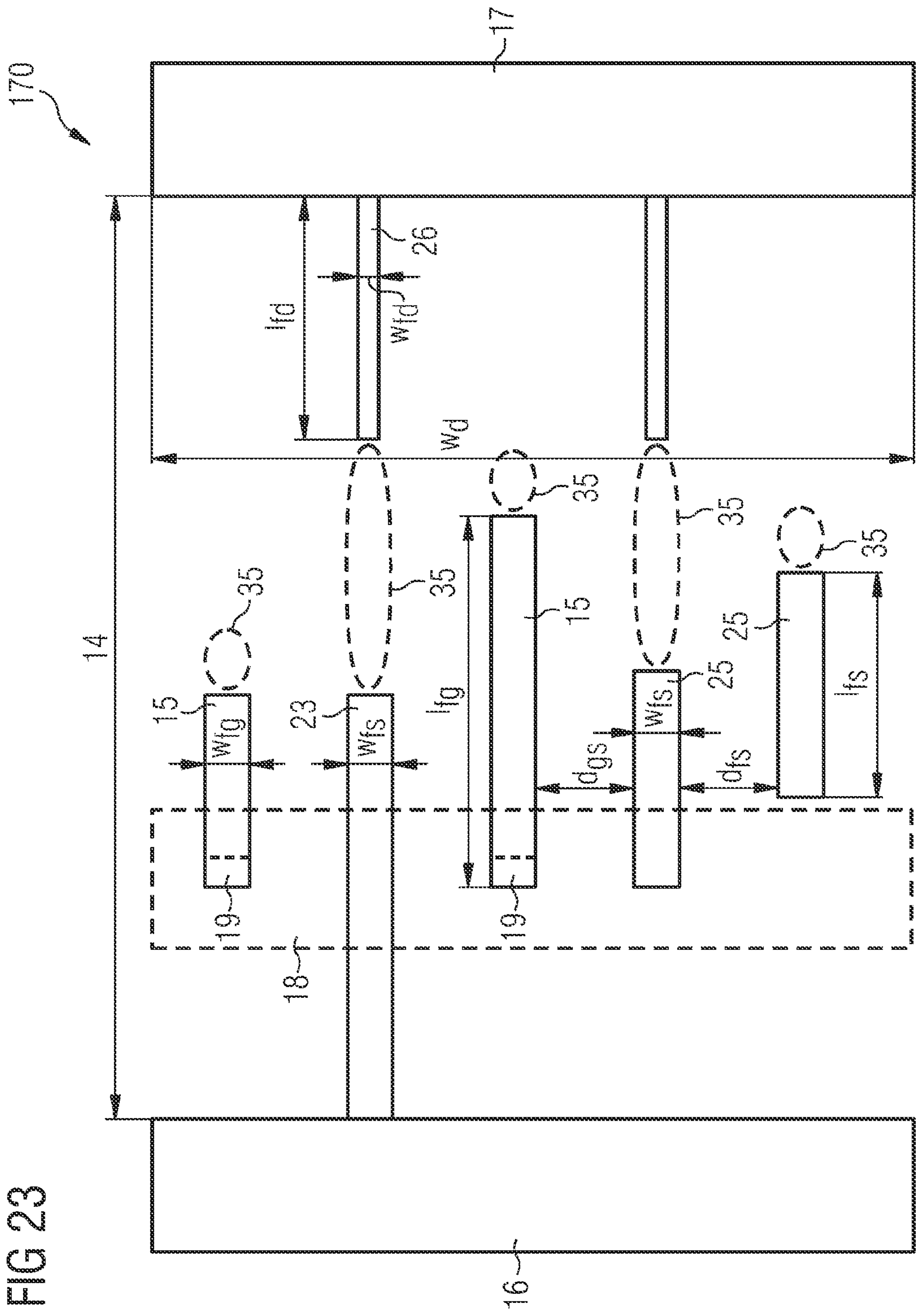
FIG. 23 illustrates a diagrammatic top view of a section of an embodiment of a lateral HEMT.

FIG. 23 illustrates a diagrammatic top view of a section of a lateral HEMT 170. Components of the same function as those in previous figures are identified by the same reference numbers and are not explained again below.

The lateral HEMT 170 differs from the lateral HEMT 120 illustrated in FIG. 12 in that the lateral HEMT 170 includes a first plurality of field plates 15 being electrically coupled to the gate electrode 18, a second plurality of field plates 23 and 25 being electrically coupled to the first electrode 16 and a third plurality of field plates 26 being electrically coupled to the second electrode 17. The field plate 23 of the second plurality of field plates is in direct contact with the first electrode 16, whereas the field plates 25 of the second plurality of field plates are coupled to the first electrode 16 via a non-illustrated connection wiring.

The lateral width $w_{fg}$ of the field plates 15 is smaller than the lateral width $w_d$ of the drift region 14, i.e., is given by the relation $w_{fg}<w_d$, the lateral width $w_{fs}$ of the field plates 23 and 25 is smaller than the lateral width $w_d$ of the drift region 14, i.e., is given by the relation $w_{fs}<w_d$ and the lateral width $w_{fd}$ of the field plates 26 is smaller than the lateral width $w_d$ of the drift region 14, i.e., is given by the relation $w_{fd}<w_d$. Moreover, a sum of the lateral widths $w_{fg}$ of the field plates 15 of the first plurality of field plates is smaller than the lateral width $w_d$, a sum of the lateral widths $w_{fs}$ of the field plates 23 and 25 of the second plurality of field plates is smaller than the lateral width $w_d$ and a sum of the lateral widths $w_{fd}$ of the field plates 26 of the third plurality of field plates is smaller than the lateral width $w_d$.

In the illustrated embodiment, the lateral lengths $l_{fd}$ of the field plates 26 are the same for all field plates 26. In a non-illustrated embodiment, the third plurality of field plates 26 includes a first field plate 26 including a first lateral length $l_{fd}$ and a second field plate 26 including a second lateral length, the first lateral length being different from the second lateral length. Moreover, in the illustrated embodiment, the lateral width $w_{fd}$ of the field plates 26 are the same for all field plates 26. In a non-illustrated embodiment, the third plurality of field plates 26 includes a first field plate 26 including a first lateral width $w_{fd}$ and a second field plate 26 including a second lateral width, the first lateral width being different from the second lateral width.

In the embodiments illustrated in FIGS. 15 to 23, the first plurality of field plates is electrically coupled to one of the first electrode 16, the second electrode 17 and the gate electrode 18 and the second plurality of field plates is electrically coupled to one of the two remaining electrodes. In a non-illustrated embodiment, the first plurality of field plates and/or the second plurality of field plates is electrically coupled to a further electrode, the further electrode being at a potential different from a potential of the first electrode 16, the second electrode 17 and the gate electrode 18.

In a further non-illustrated embodiment, a lateral HEMT includes a first layer, the first layer including a semiconducting material, and a second layer, the second layer including a semiconducting material and being at least partially arranged on the first layer. The first layer may include lightly n-doped GaN, which is typically depleted by fixed charges at the interface or which is lightly n-conducting and is containing deep traps to reduce the concentration of free charge carriers and the second layer may include AlGaN. The AlGaN of the second layer is typically compensated, i.e., it has no free charge carriers and is therefore electrically insulating. At the interface between the first layer and the second layer, a two-dimensional electron gas is formed. The lateral HEMT further includes a gate electrode, the gate electrode being arranged at least partially directly on the second layer in a region between a first electrode and a second electrode, a drift region, the drift region including a lateral width $w_d$, and a plurality of field plates. Each field plate is arranged at least partially directly on the second layer in a region of the drift region and includes a lateral width, wherein a sum of the lateral widths of the field plates is smaller than the lateral width $w_d$. Additionally, the plurality of field plates is electrically coupled to the gate electrode. Typically, each field plate directly contacts the gate electrode. In this embodiment, the plurality of field plates and the gate electrode are at least partially arranged on a common layer, i.e., the second layer. Further embodiments may be constructed from the illustrated ones by forming field plates and gate electrodes out of the same material layer fabricated by the same deposition and etch processes and arranged directly on the second layer using equivalent layouts.

Figure 24:
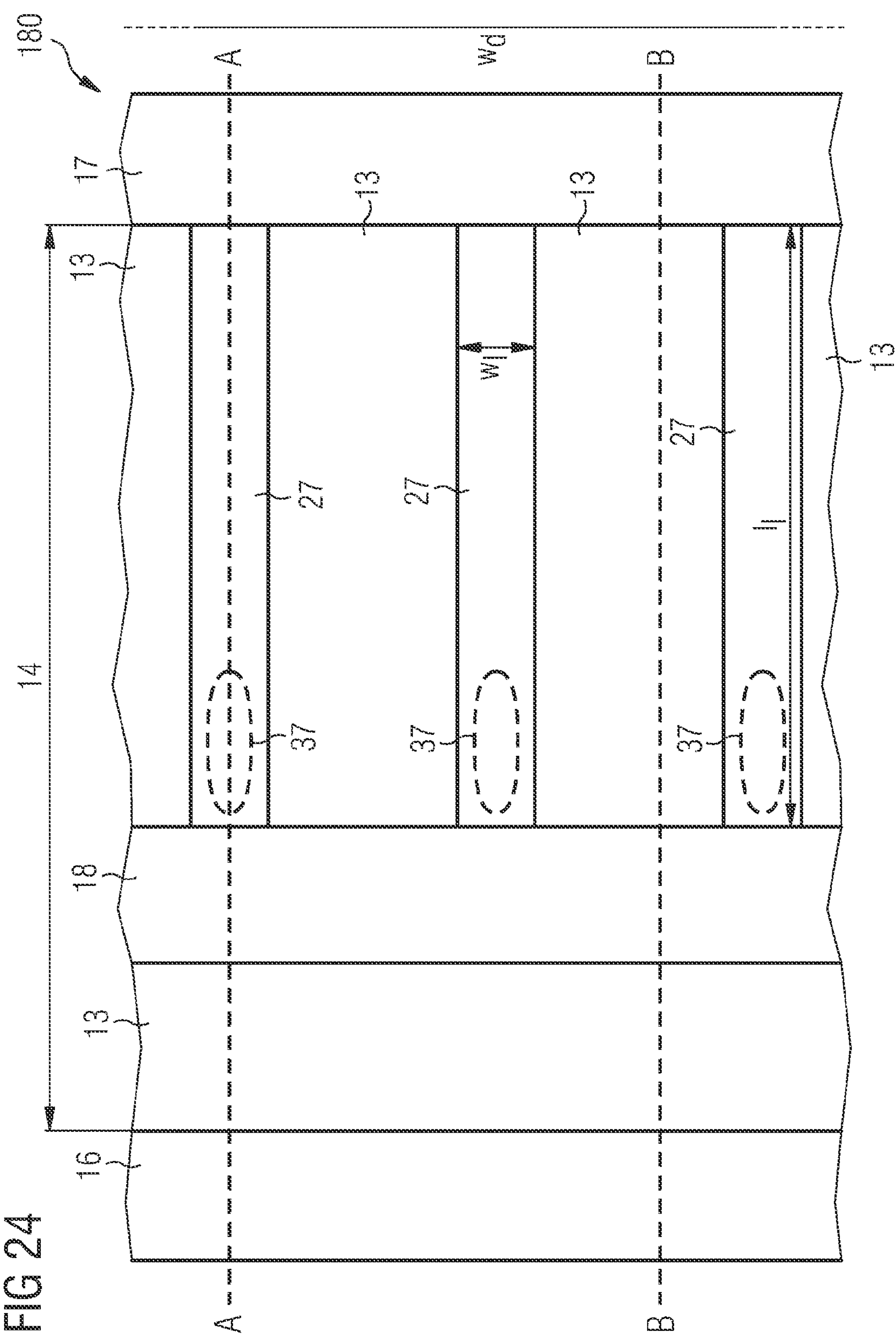
FIG. 24 illustrates a diagrammatic top view of a section of an embodiment of a lateral HEMT.

FIG. 24 illustrates a diagrammatic top view of a section of a lateral HEMT 180. Components of the same function as those in previous figures are identified by the same reference numbers and are not explained again below.

The lateral HEMT 180 differs from the previously illustrated embodiments in that at least one insulating layer 27 is arranged on the second layer 12 in a region of the drift region 14 between the gate electrode 18 and the second electrode 17. In the illustrated embodiment, the lateral HEMT 180 includes a plurality of insulating layers 27, wherein the insulating layers 27 are arranged at least partially on the passivation layer 13 in a comb-shaped manner. The insulating layers 27 extend laterally from the gate electrode 18 to the second electrode 17 and are in direct contact both with the gate electrode 18 and the second electrode 17.

The insulating layers 27 each include a lateral width $w_l$, wherein the lateral width $w_l$ of the insulating layers 27 is smaller than the lateral width $w_d$ of the drift region 14, i.e., is given by the relation $w_l<w_d$. In addition, a sum of the lateral widths $w_l$ of the insulating layers 27 is smaller than the lateral width $w_d$.

The insulating layers 27 include a stress-inducing material, the stress-inducing material inducing a lateral tensile stress at least on the second layer 12. By inducing a lateral tensile stress, the insulating layers 27 modulate the lateral stress in the AlGaN—GaN heterostructure lying beneath the insulating layers 27, i.e., the second layer 12 and the first layer 11 and thus modulate via the piezoelectric effect the charge carrier concentration in the two-dimensional electron gas at the interface between the first layer 11 and the second layer 12. In regions of higher restraint and higher charge carrier concentration of the two-dimensional electron gas, the breakdown voltage may be laterally reduced between the second electrode 17 and the gate electrode 18. When the lateral HEMT 180 is reverse-biased, avalanche generation may occur first in the regions of higher charge carrier concentration of the two-dimensional electron gas when reaching the maximum blocking voltage of the lateral HEMT 180. Thus, the regions 37 in which breakdown occurs may be pinned beneath the insulating layers 27 towards the ends of the insulating layers 27 which are laterally closer to the first electrode 16. The two-dimensional electron gas is deteriorated locally in these regions 37 of the drift region 14 by hot charge carriers. However, in the remaining regions of the drift region 14, breakdown and thus deterioration of the two-dimensional electron gas may be avoided. Thus, when the lateral HEMT 180 is forward-biased, the two-dimensional electron gas and hence a conductive channel may be provided in a large area of the drift region 14.

The insulating layers 27 may contain an oxide which may be applied by chemical vapor deposition or SiN. Materials which may be etched selectively with respect to the layers arranged beneath the insulating layers 27, i.e., the second layer 12 and the passivation layer 13, respectively, may be contained in the insulating layers 27.

Figure 25:
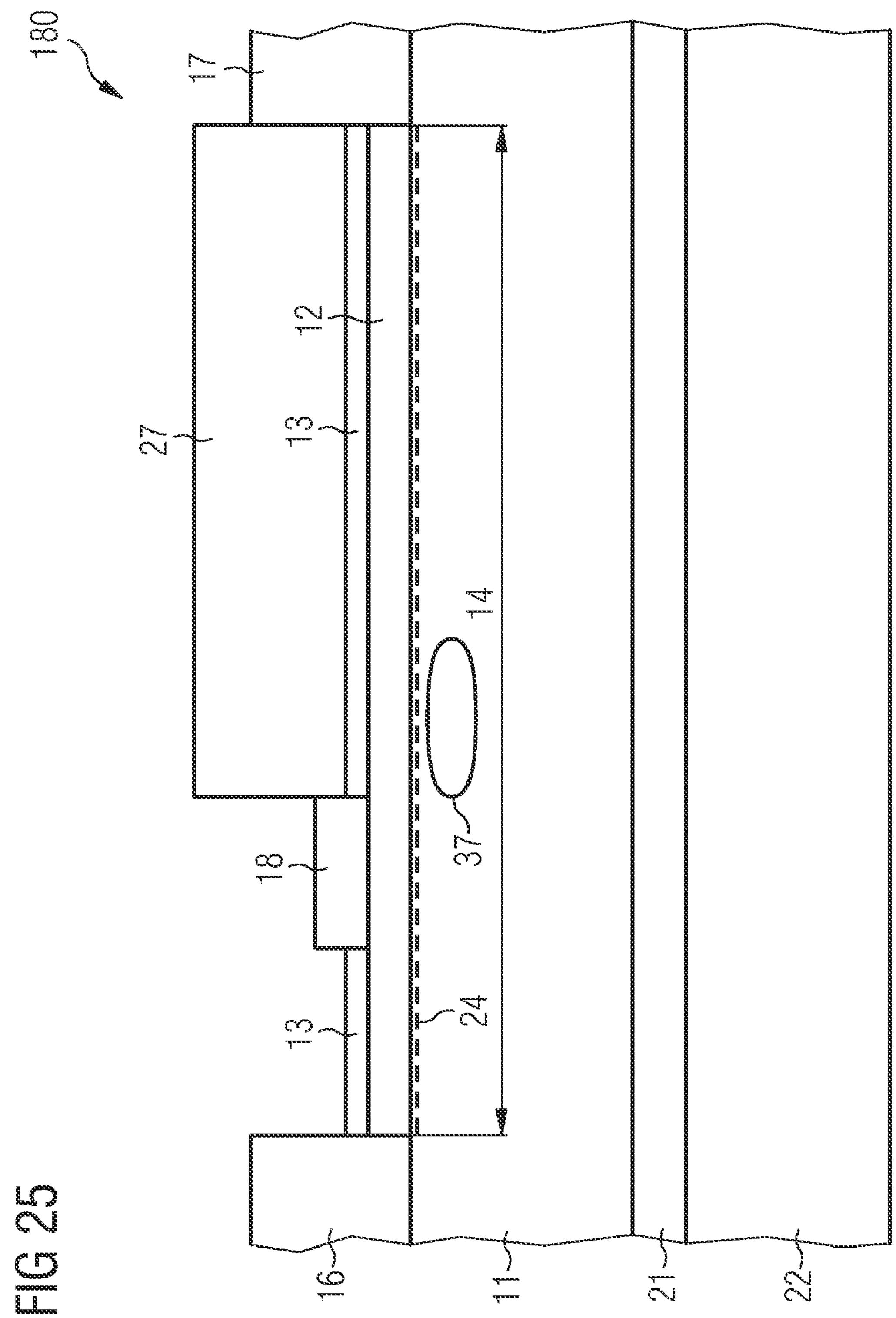
FIG. 25 illustrates a diagrammatic cross-section through a section of the lateral HEMT illustrated in FIG. 24.
Figure 26:
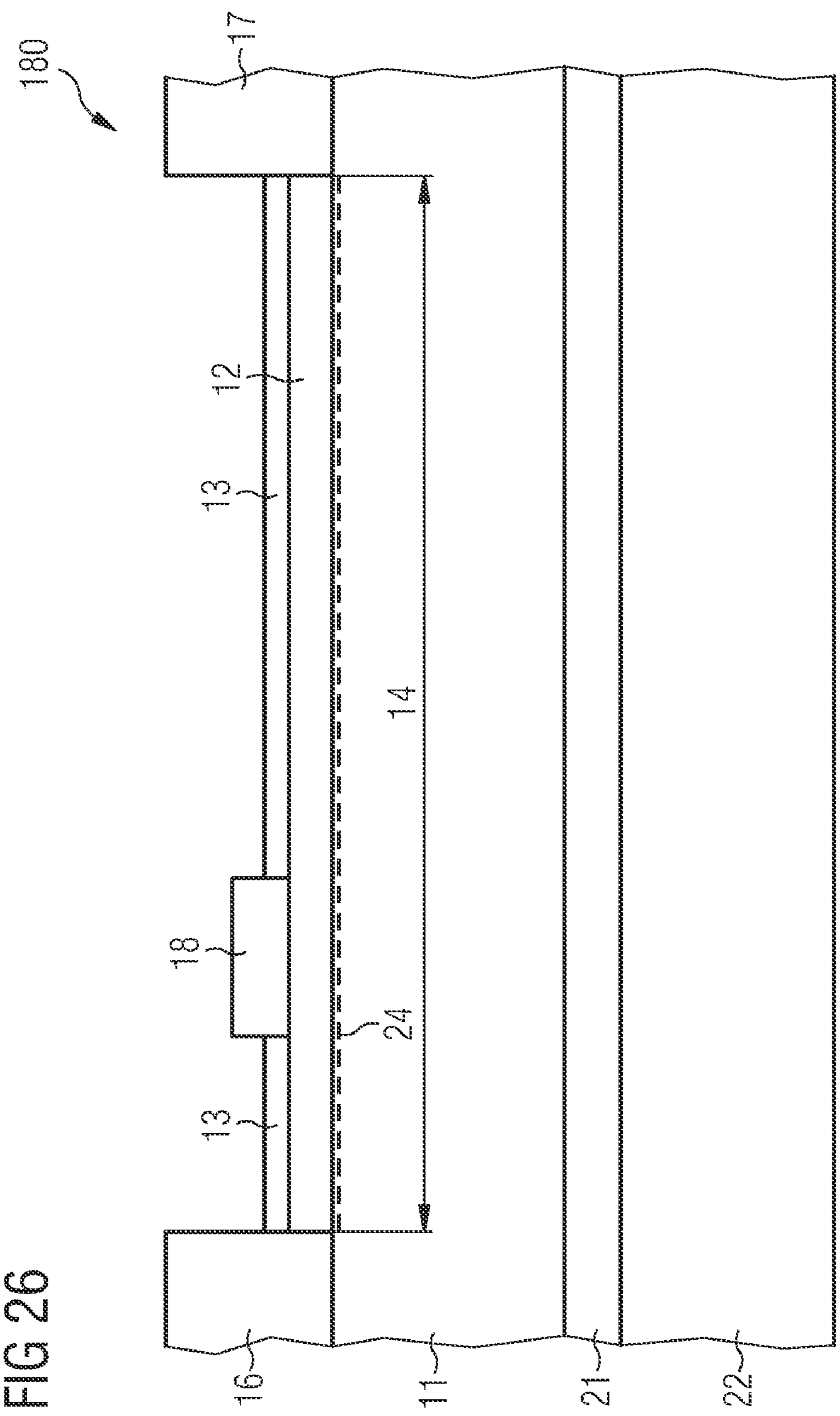
FIG. 26 illustrates a diagrammatic cross-section through a section of the lateral HEMT illustrated in FIG. 24.

FIG. 25 illustrates a diagrammatic cross-section through a section of the lateral HEMT 180 illustrated in FIG. 24 taken along the line A-A and FIG. 26 illustrates a diagrammatic cross-section through a section of the lateral HEMT illustrated in FIG. 24 taken along the line B-B. Components of the same function as those in previous figures are identified by the same reference numbers and are not explained again below.

As illustrated in FIGS. 25 and 26, the lateral HEMT 180 includes a substrate 22 and a buffer layer 21 arranged on the substrate 22. The substrate 22 may include Si, SiC, GaN or $Al_2O_3$. The buffer layer 21 may include AlN, GaN or AlGaN or a superlattice of these materials.

A first layer 11 is arranged on the buffer layer 21. A second layer 12 is at least partially arranged on the first layer 11. In the illustrated embodiment, the first layer 11 includes n-conducting GaN and the second layer 12 includes AlGaN. The AlGaN of the second layer 12 is compensated, i.e., it has no free charge carriers and is therefore electrically insulating. At the interface between the first layer 11 and the second layer 12, a two-dimensional electron gas is formed, which is schematically illustrated in FIGS. 25 and 26 by a dashed line 24.

The lateral HEMT 180 further includes a first electrode 16, a second electrode 17 and a gate electrode 18. In the illustrated embodiment, the first electrode 16 and the second electrode 17 are each arranged on the first layer 11. In other embodiments, the first electrode 16 and the second electrode 17 are each arranged on the second layer 12 and the two-dimensional electron gas is electrically contacted by alloying the first electrode 16 and the second electrode 17 into the second layer 12. The first electrode 16 and the second electrode 17 are electrically contacting the first layer 11, the second layer 12 and the two-dimensional electron gas. Between the first electrode 16 and the second electrode 17, a drift region 14 is provided in the region of the two-dimensional electron gas. The gate electrode 18 is arranged on the second layer 12 in a region between the first electrode 16 and the second electrode 17 or in some embodiments may be at least partially recessed into the second layer 12. A passivation layer 13 is arranged on the second layer 12 and at least partially surrounds the gate electrode 18. The passivation layer 13 may include a material selected from the group consisting of $Si_xN_y$, $SiO_2$ and $Al_2O_3$.

Figure 27:
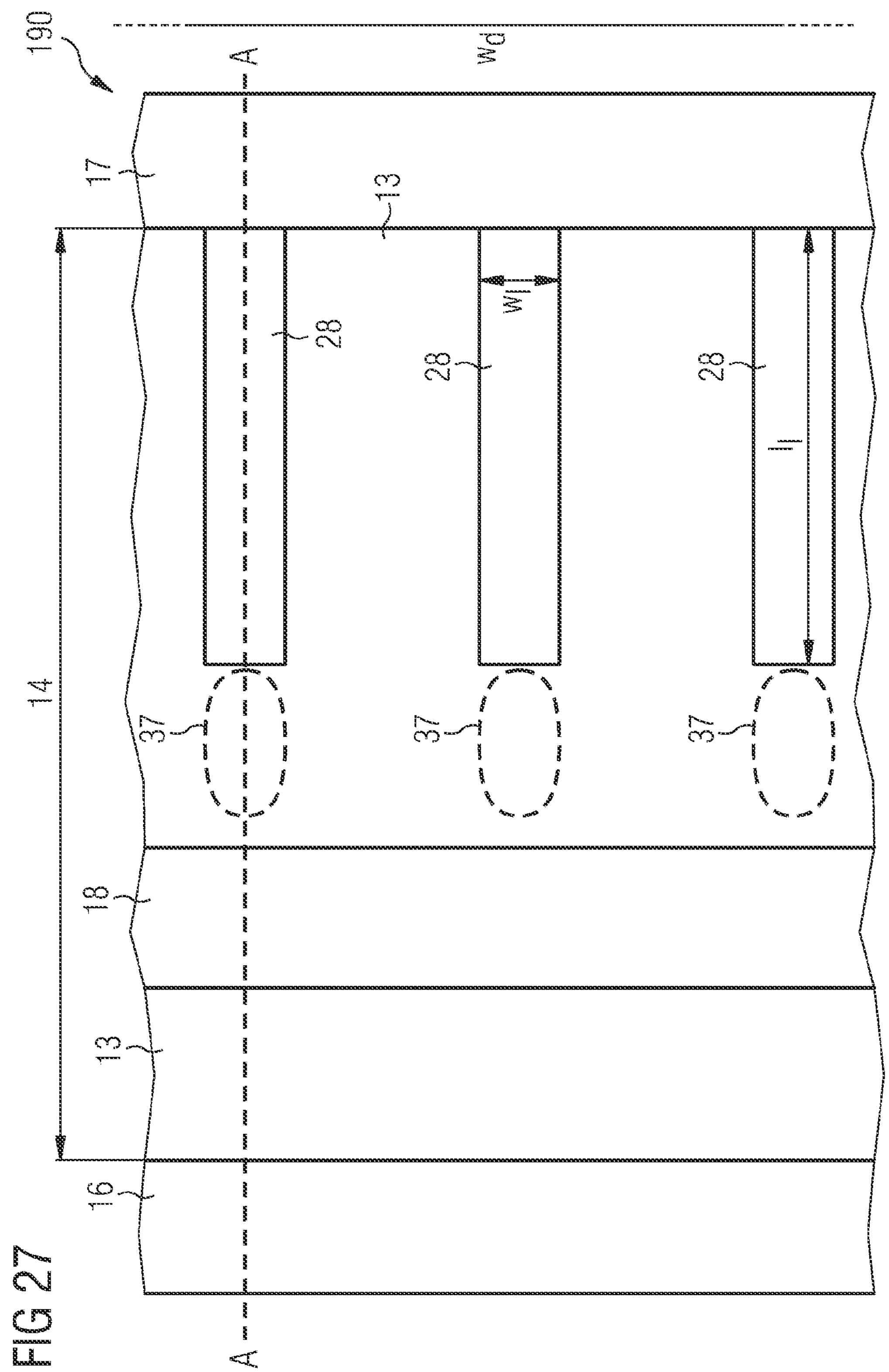
FIG. 27 illustrates a diagrammatic top view of a section of an embodiment of a lateral HEMT.
Figure 28:
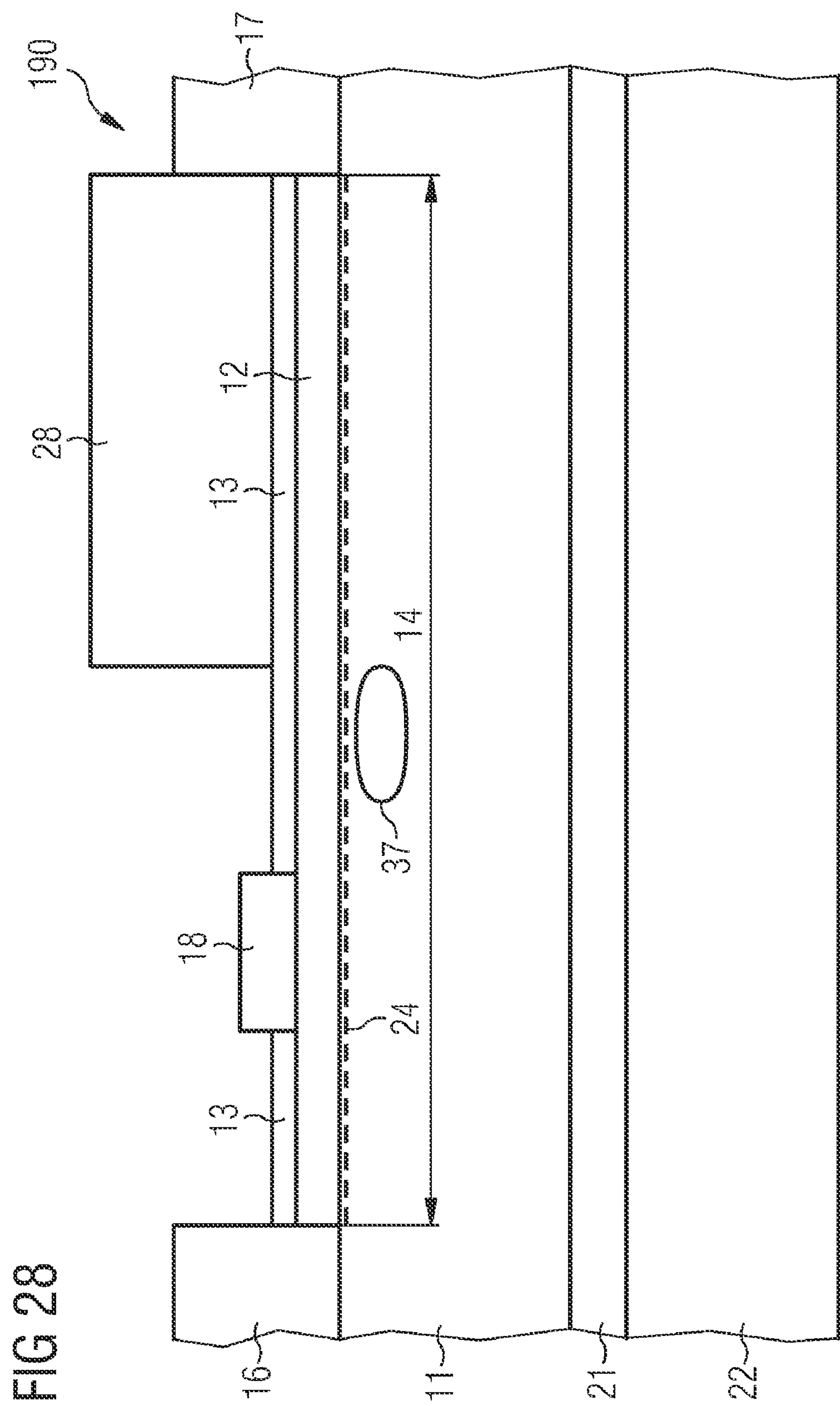
FIG. 28 illustrates a diagrammatic cross-section through a section of the lateral HEMT illustrated in FIG. 27.

FIG. 27 illustrates a diagrammatic top view of a section of a lateral HEMT 190 and FIG. 28 illustrates a diagrammatic cross-section through a section of the lateral HEMT 190 illustrated in FIG. 27 taken along the line A-A. Components of the same function as those in previous figures are identified by the same reference numbers and are not explained again below.

The lateral HEMT 190 differs from the lateral HEMT 180 in that at least one insulating layer 28 is arranged on the second layer 12 in a region of the drift region 14 and extends laterally from the second electrode 17 towards the gate electrode 18 and is in direct contact only with the second electrode 17.

When the lateral HEMT 190 is reverse-biased, the regions 37 in which breakdown occurs may be pinned towards the ends of the insulating layers 28 which are laterally closer to the first electrode 16.

In the illustrated embodiment, the plurality of insulating layers 28 is arranged at least partially on the passivation layer 13 in a comb-shaped manner.

Figure 29:
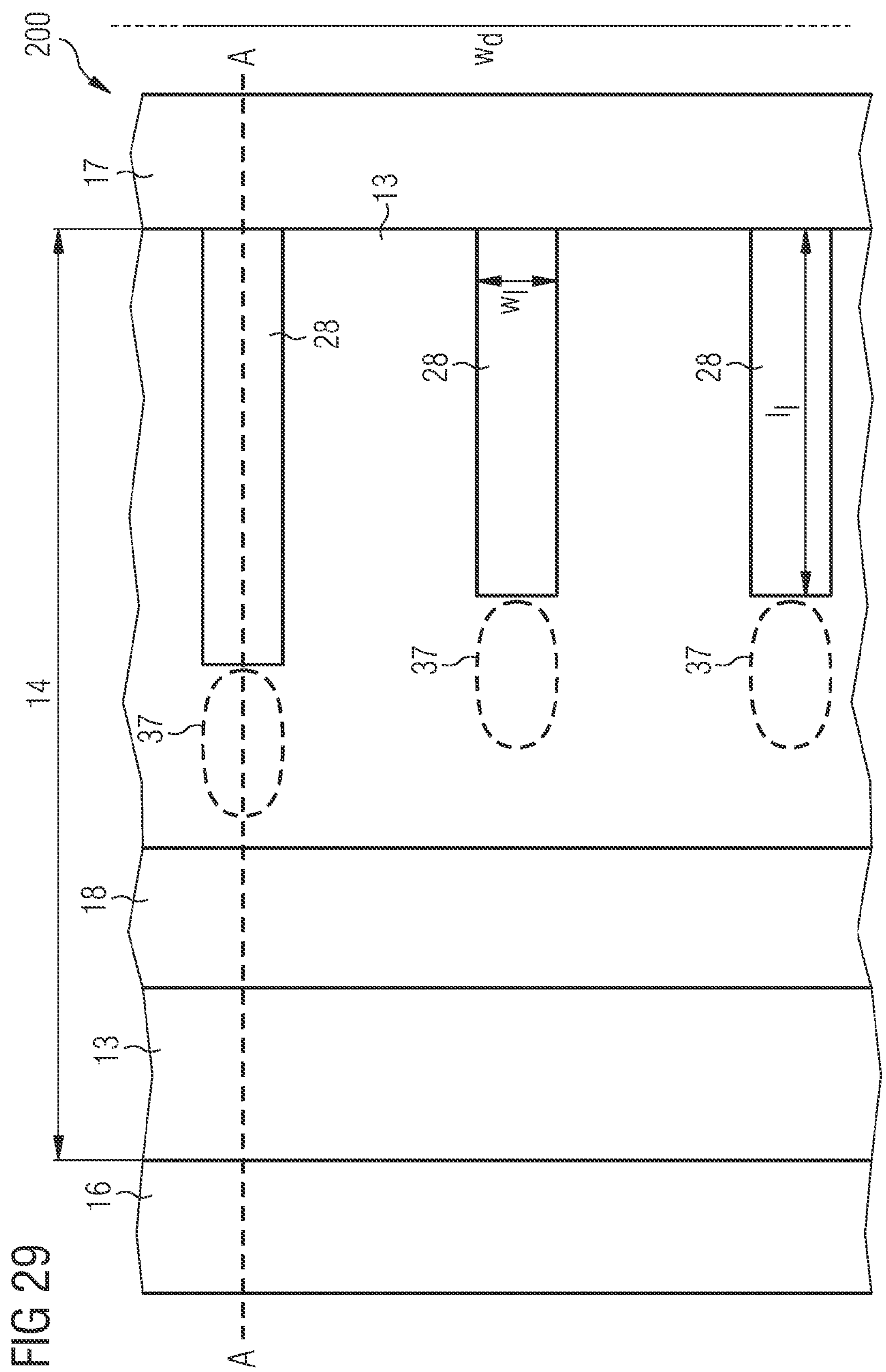
FIG. 29 illustrates a diagrammatic top view of a section of an embodiment of a lateral HEMT.

FIG. 29 illustrates a diagrammatic top view of a section of a lateral HEMT 200. Components of the same function as those in previous figures are identified by the same reference numbers and are not explained again below.

The lateral HEMT 200 differs from the lateral HEMT 190 in that the plurality of insulating layers 28 includes at least a first insulating layer 28 including a first lateral length $l_l$ and a second insulating layer 28 including a second lateral length, the first lateral length being different from the second lateral length.

When the lateral HEMT 200 is reverse-biased, the regions 37 in which breakdown occurs may be pinned towards the ends of the insulating layers 28 which are laterally closer to the first electrode 16.

Figure 30:
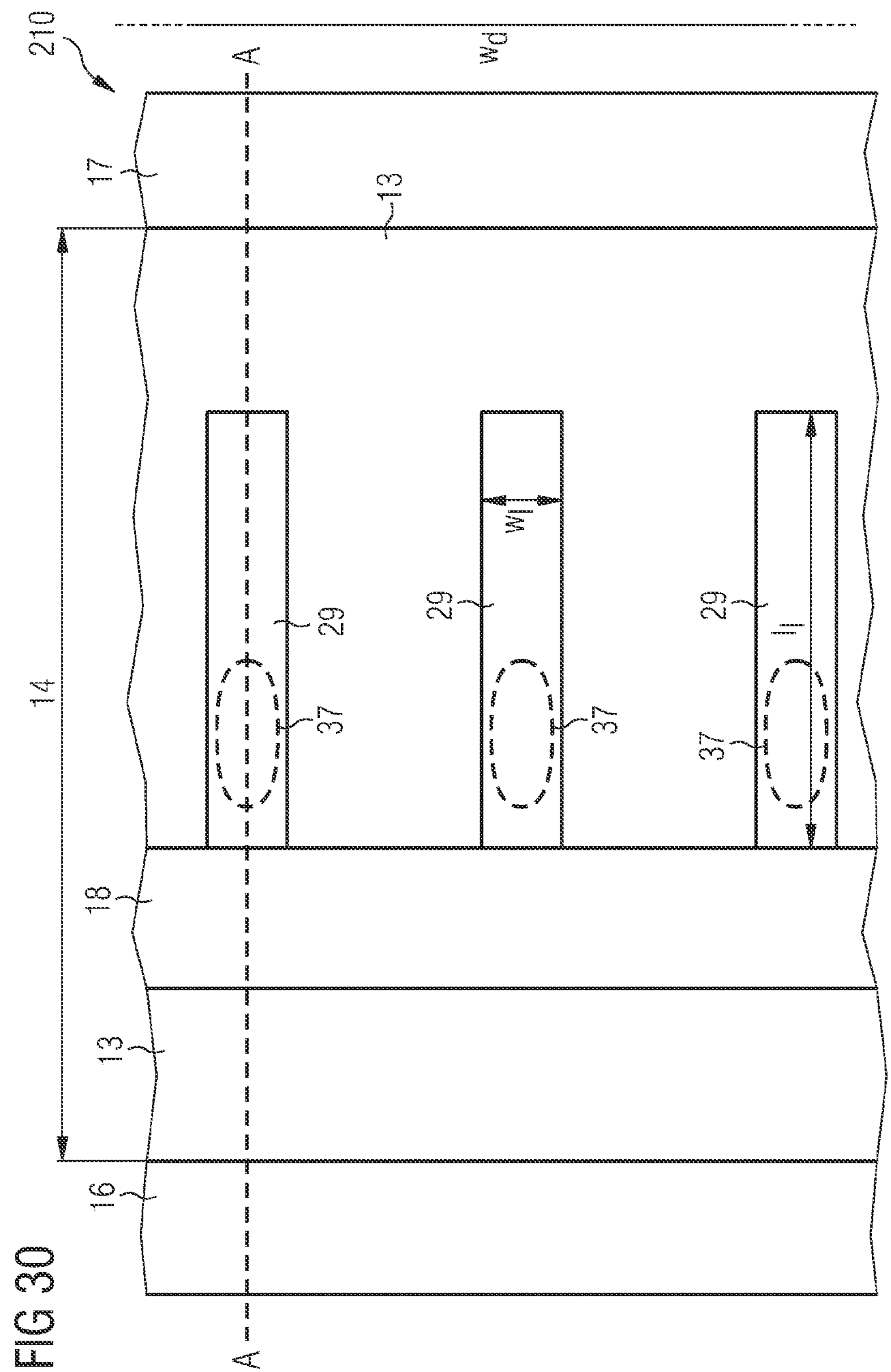
FIG. 30 illustrates a diagrammatic top view of a section of an embodiment of a lateral HEMT.
Figure 31:
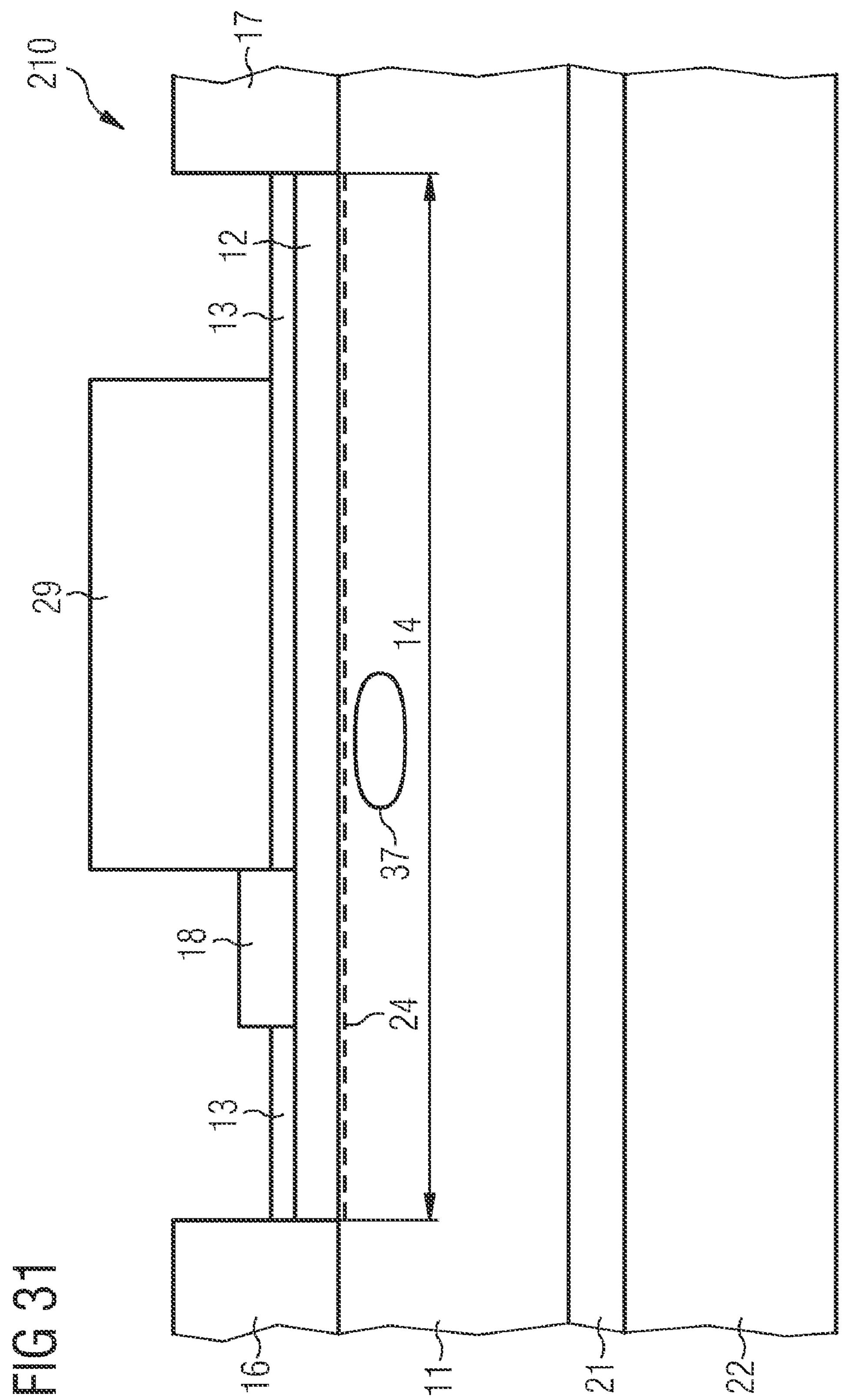
FIG. 31 illustrates a diagrammatic cross-section through a section of the lateral HEMT illustrated in FIG. 30.

FIG. 30 illustrates a diagrammatic top view of a section of a lateral HEMT 210 and FIG. 31 illustrates a diagrammatic cross-section through a section of the lateral HEMT 210 illustrated in FIG. 30 taken along the line A-A. Components of the same function as those in previous figures are identified by the same reference numbers and are not explained again below.

The lateral HEMT 210 differs from the previously illustrated embodiments in that at least one insulating layer 29 is arranged on the second layer 12 in a region of the drift region 14 and extends laterally from the gate electrode 18 towards the second electrode 17 and directly contacts only the gate electrode 18.

When the lateral HEMT 210 is reverse-biased, the regions 37 in which breakdown occurs may be pinned towards the ends of the insulating layers 29 which are laterally closer to the first electrode 16.

In the illustrated embodiment, the plurality of insulating layers 29 is arranged at least partially on the passivation layer 13 in a comb-shaped manner.

Figure 32:
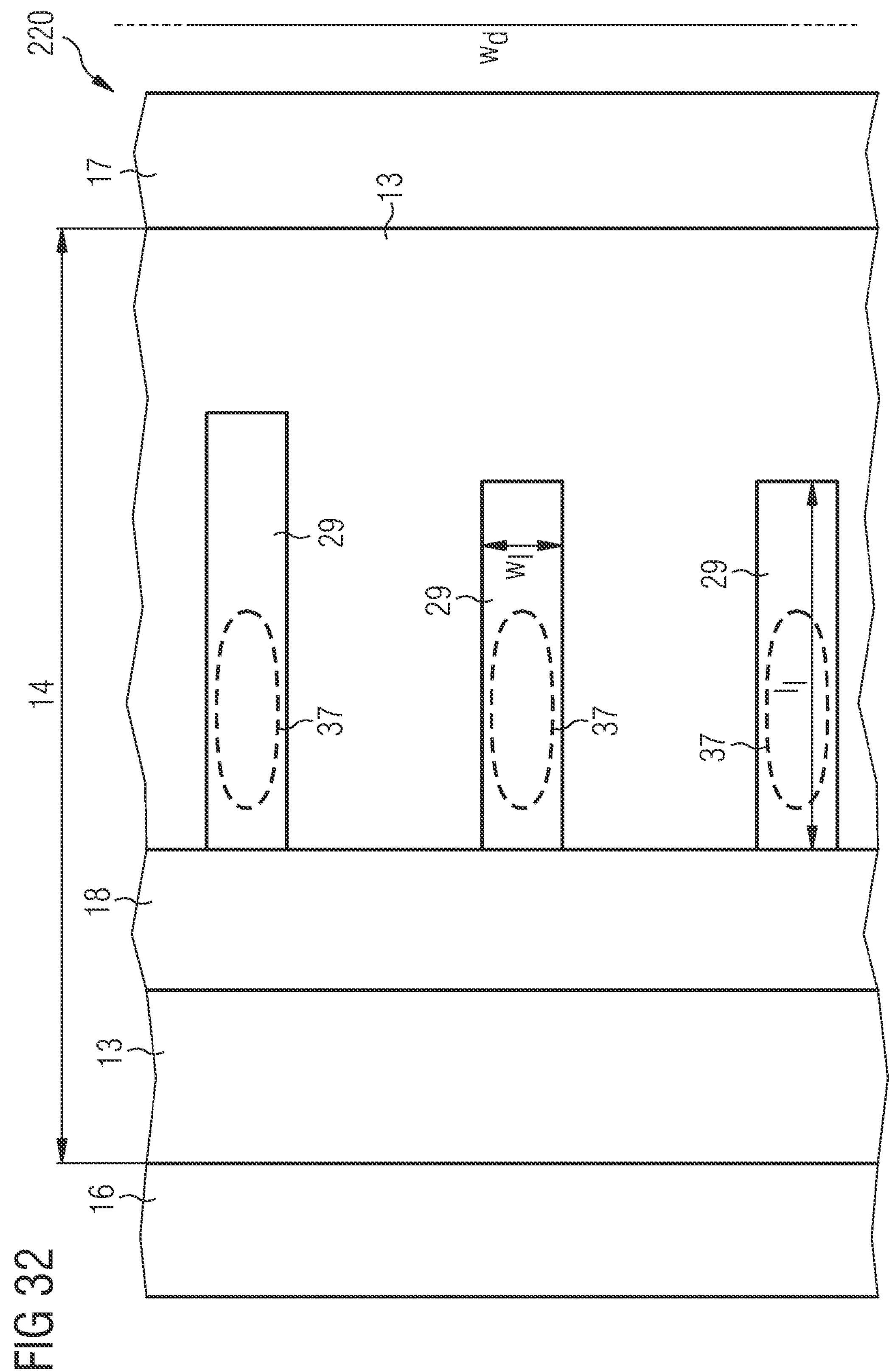
FIG. 32 illustrates a diagrammatic top view of a section of an embodiment of a lateral HEMT.

FIG. 32 illustrates a diagrammatic top view of a section of a lateral HEMT 220. Components of the same function as those in previous figures are identified by the same reference numbers and are not explained again below.

The lateral HEMT 220 differs from the lateral HEMT 210 in that the plurality of insulating layers 29 includes a first insulating layer 29 including a first lateral length $l_l$ and a second insulating layer including a second lateral length, the first lateral length being different from the second lateral length.

When the lateral HEMT 220 is reverse-biased, the regions 37 in which breakdown occurs may be pinned towards the ends of the insulating layers 29 which are laterally closer to the first electrode 16.

Figure 33:
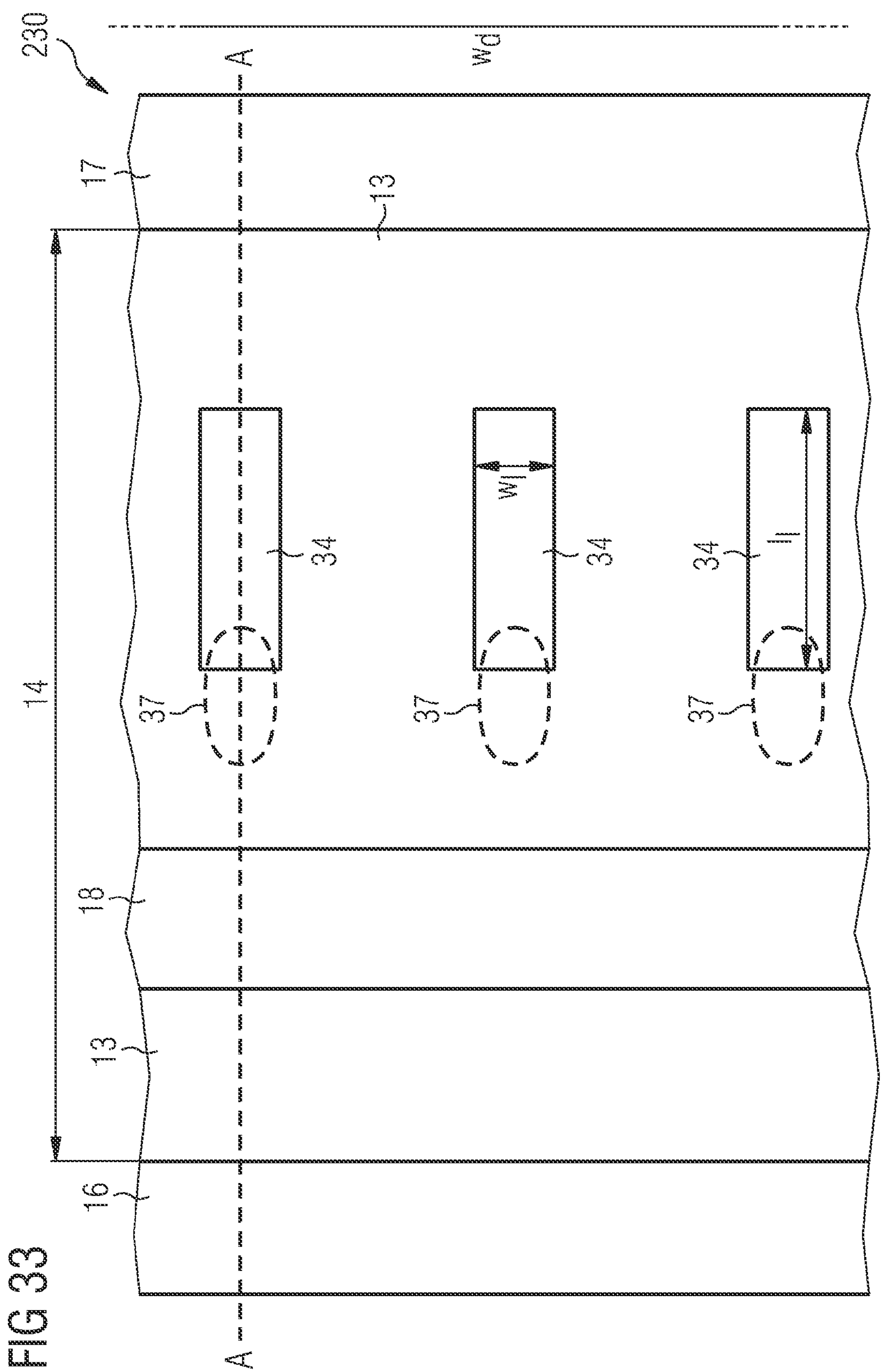
FIG. 33 illustrates a diagrammatic top view of a section of an embodiment of a lateral HEMT.
Figure 34:
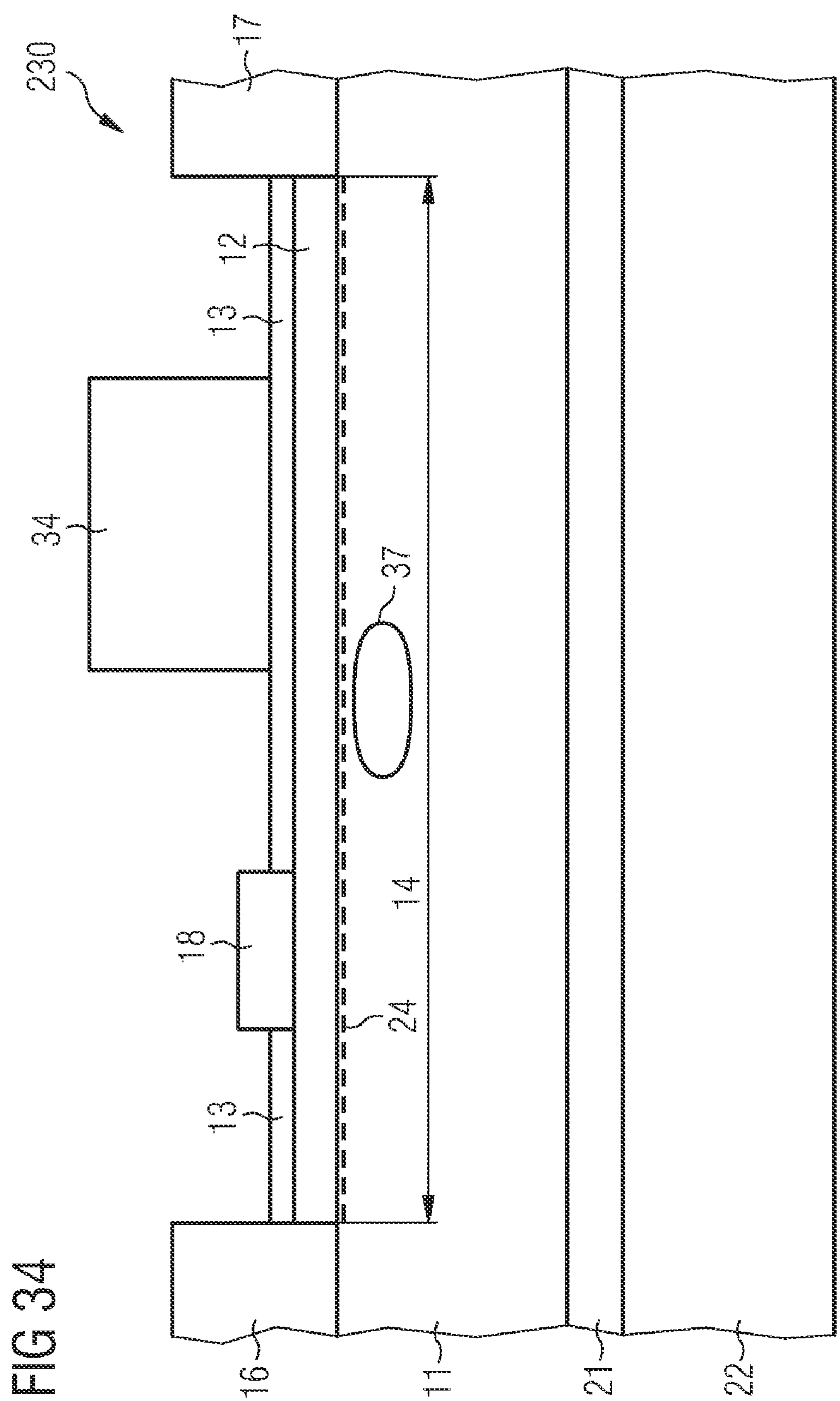
FIG. 34 illustrates a diagrammatic cross-section through a section of the lateral HEMT illustrated in FIG. 33.

FIG. 33 illustrates a diagrammatic top view of a section of a lateral HEMT 230 and FIG. 34 illustrates a diagrammatic cross-section through a section of the lateral HEMT 230 illustrated in FIG. 33 taken along the line A-A. Components of the same function as those in previous figures are identified by the same reference numbers and are not explained again below.

The lateral HEMT 230 differs from the previously illustrated embodiments in that at least one insulating layer 34 is arranged on the second layer 12 in a region of the drift region 14 between the second electrode 17 and the gate electrode 18 and does neither contact the second electrode 17 nor the gate electrode 18.

When the lateral HEMT 230 is reverse-biased, the regions 37 in which breakdown occurs may be pinned towards the ends of the insulating layers 34 which are laterally closer to the first electrode 16.

In the illustrated embodiment, the insulating layers 34 are arranged at least partially on the passivation layer 13 in a comb-shaped manner.

Figure 35:
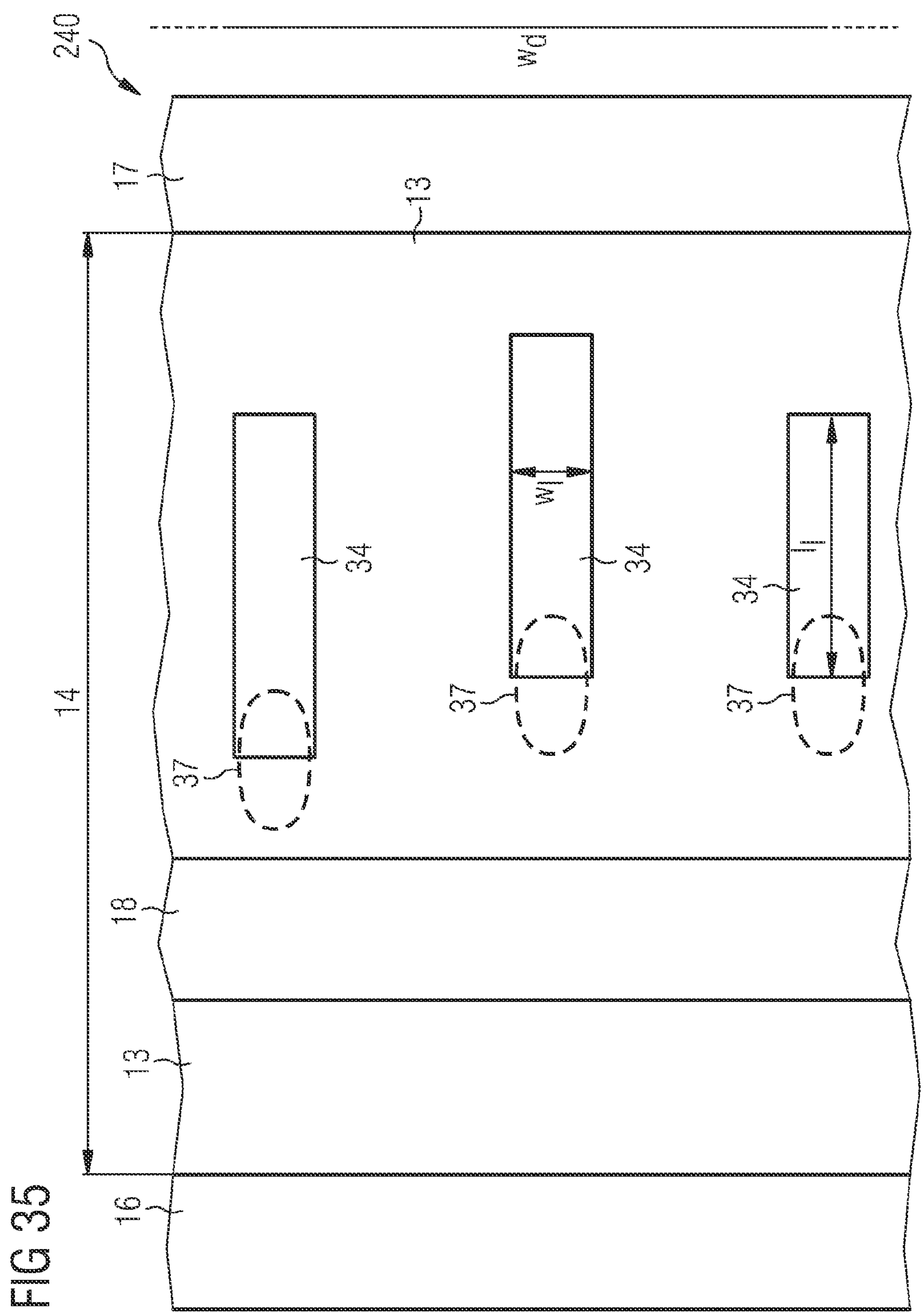
FIG. 35 illustrates a diagrammatic top view of a section of an embodiment of a lateral HEMT.

FIG. 35 illustrates a diagrammatic top view of a section of a lateral HEMT 240. Components of the same function as those in previous figures are identified by the same reference numbers and are not explained again below.

The lateral HEMT 240 differs from the lateral HEMT 230 in that the plurality of insulating layers 34 includes a first insulating layer 34 including a first lateral length $l_l$ and a second insulating layer 34 including a second lateral length, the first lateral length being different from the second lateral length. Additionally, the lateral distances between the insulating layers 34 and the second electrode 17 and lateral distances between the insulating layers 34 and the gate electrode 18 vary.

When the lateral HEMT 240 is reverse-biased, the regions 37 in which breakdown occurs may be pinned towards the ends of the insulating layers 34 which are laterally closer to the first electrode 16.

Figure 36:
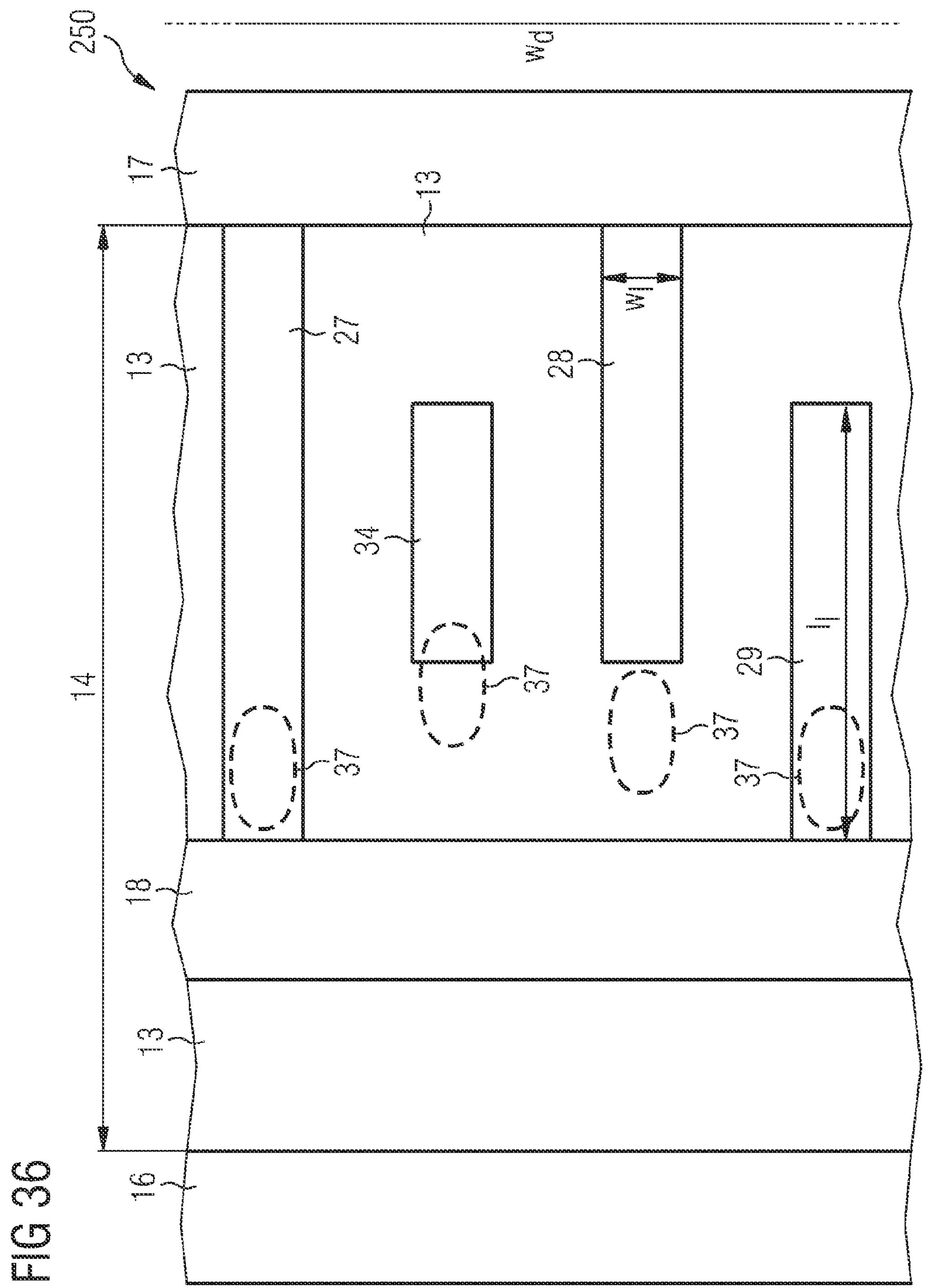
FIG. 36 illustrates a diagrammatic top view of a section of an embodiment of a lateral HEMT.

FIG. 36 illustrates a diagrammatic top view of a section of a lateral HEMT 250. Components of the same function as those in previous figures are identified by the same reference numbers and are not explained again below.

The lateral HEMT 250 includes at least one insulating layer 27 being arranged on the second layer 12 in a region of the drift region 14 and extending laterally between the second electrode 17 and the gate electrode 18 and being in direct contact both with the second electrode 17 and the gate electrode 18. Moreover, the lateral HEMT 250 includes at least one insulating layer 28 being arranged on the second layer 12 in a region of the drift region 14, extending laterally from the second electrode 17 towards the gate electrode 18 and being in direct contact only with the second electrode 17 and at least one insulating layer 29 being arranged on the second layer 12 in a region of the drift region 14, extending laterally from the gate electrode 18 towards the second electrode 17 and being in direct contact only with the gate electrode 18. Additionally, the lateral HEMT 250 includes at least one insulating layer 34 being arranged on the second layer 12 in a region of the drift region 14 between the second electrode 17 and the gate electrode 18, wherein the at least one insulating layer 34 does neither contact the second electrode 17 nor the gate electrode 18.

In the illustrated embodiment, the insulating layers 27, 28, 29 and 34 are arranged at least partially on the passivation layer 13.

Figure 37:
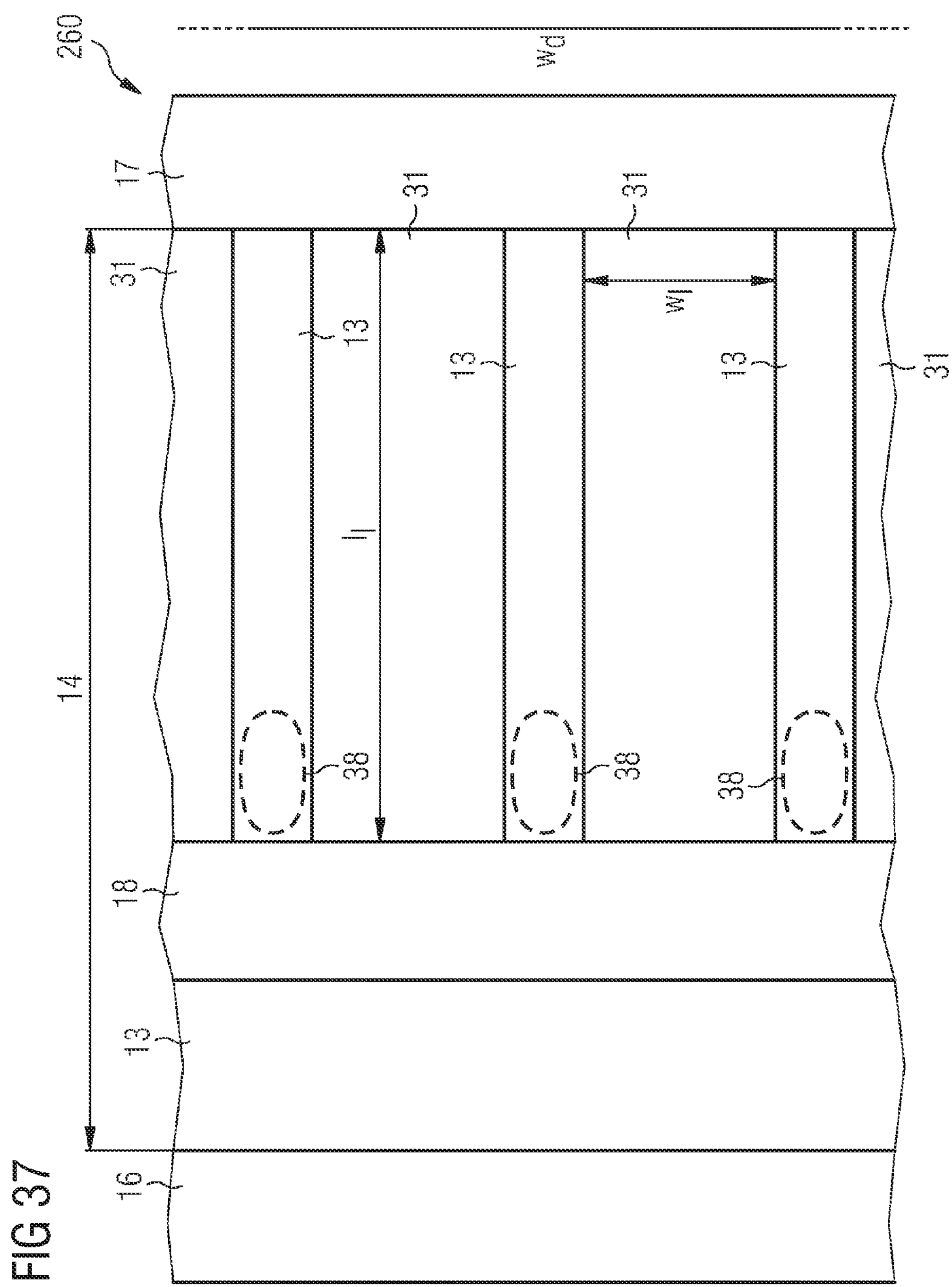
FIG. 37 illustrates a diagrammatic top view of a section of an embodiment of a lateral HEMT.

FIG. 37 illustrates a diagrammatic top view of a section of a lateral HEMT 260. Components of the same function as those in previous figures are identified by the same reference numbers and are not explained again below.

The lateral HEMT 260 differs from the previously illustrated embodiments in that at least one insulating layer 31 is arranged on the second layer 12 in a region of the drift region 14, the at least one insulating layer 31 including a stress-inducing material, the stress-inducing material inducing a lateral compressive stress at least on the second layer 12.

In the illustrated embodiment, the at least one insulating layer 31 is arranged at least partially on the passivation layer 13.

Moreover, in the illustrated embodiment, the lateral HEMT 260 includes a plurality of insulating layers 31, wherein the insulating layers 31 are arranged in a comb-shaped manner.

The stress-inducing material inducing a lateral compressive stress at least on the second layer 12 reduces the charge carrier concentration in the two-dimensional electron gas at the interface between the first layer 11 and the second layer 12 beneath the at least one insulating layer 31. When the lateral HEMT 260 is reverse-biased, avalanche generation may occur first in the regions of higher charge carrier concentration of the two-dimensional electron gas which are located beneath the regions of the passivation layer 13 not covered by the at least one insulating layer 31 when reaching the maximum blocking voltage of the lateral HEMT 260. Thus, the regions 38 in which breakdown occurs may be pinned beneath the regions of the passivation layer 13 not covered by the at least one insulating layer 31 towards the end of the passivation layer 13 which is laterally closer to the first electrode 16. The two-dimensional electron gas is deteriorated locally in these regions 38 of the drift region 14 by hot charge carriers. However, in the remaining regions of the drift region 14, breakdown and thus deterioration of the two-dimensional electron gas may be avoided. Thus, when the lateral HEMT 260 is forward-biased, the two-dimensional electron gas and hence a conductive channel may be provided in a large area of the drift region 14.

In the embodiments illustrated in FIGS. 24 to 37, the lateral widths $w_l$ of the insulating layers providing the plurality of insulating layers are the same for each insulating layer. In non-illustrated embodiments, the plurality of insulating layers includes a first insulating layer including a first lateral width and a second insulating layer including a second lateral width, the first lateral width being different from the second lateral width. In further non-illustrated embodiments, the lateral widths $w_l$ of many or all insulating layers are different from one another.

Moreover, in the embodiments illustrated in FIGS. 24 to 37, a lateral distance between adjacent insulating layers is the same for all insulating layers. In non-illustrated embodiments, the plurality of insulating layers includes a first lateral distance between adjacent insulating layers and a second lateral distance between adjacent insulating layers, the first lateral distance being different from the second lateral distance. In further non-illustrated embodiments, many or all lateral distances between adjacent insulating layers are different from one another.

Figure 38:
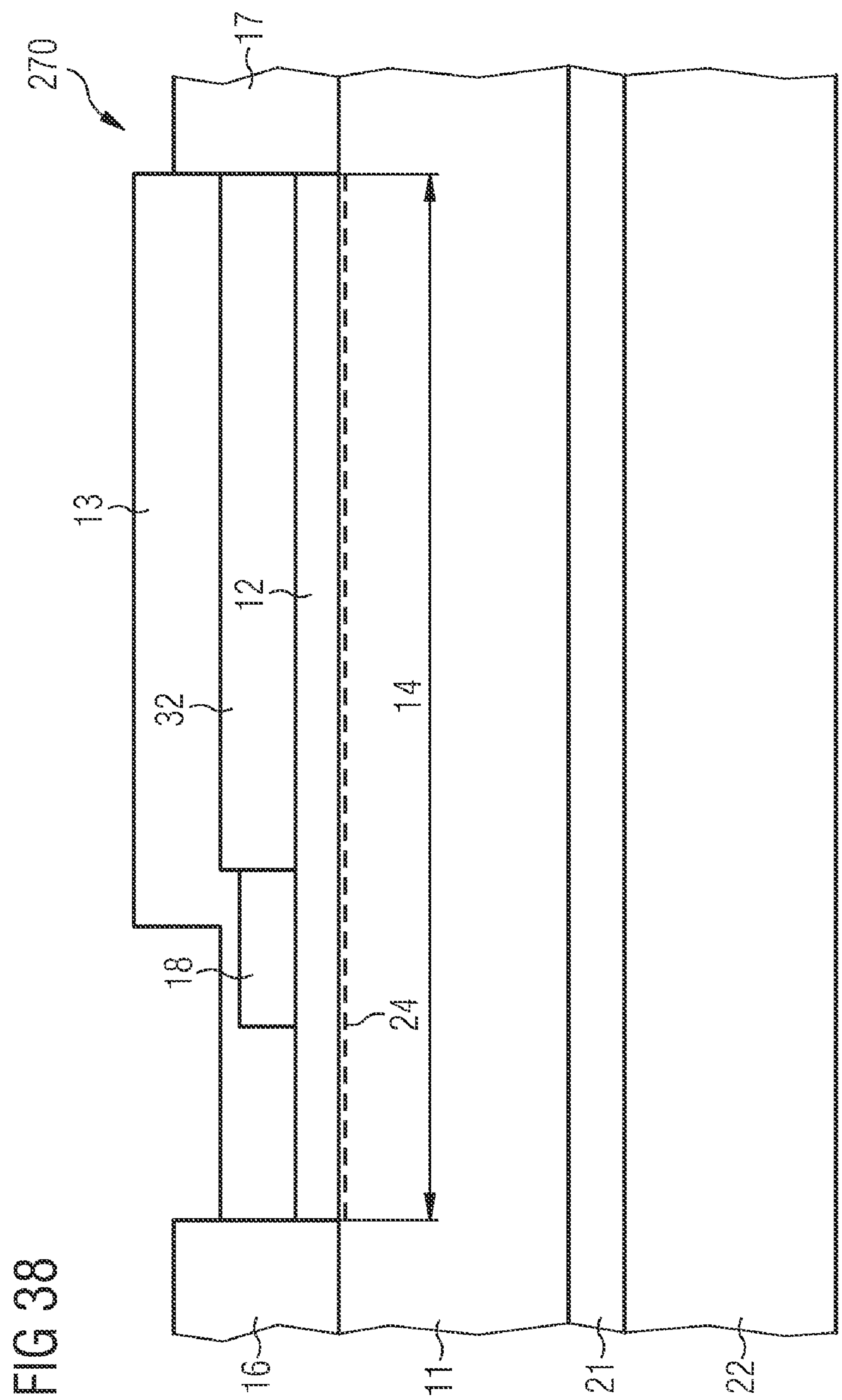
FIG. 38 illustrates a diagrammatic cross-section through a section of an embodiment of a lateral HEMT.

FIG. 38 illustrates a diagrammatic cross-section through a section of a lateral HEMT 270. Components of the same function as those in previous figures are identified by the same reference numbers and are not explained again below.

The lateral HEMT 270 differs from the previously illustrated embodiments in that at least one insulating layer 32 is arranged at least partially directly on the second layer 12 in a region of the drift region 14. The passivation layer 13 is arranged at least partially on the at least one insulating layer 32 and the gate electrode 18.

The at least one insulating layer 32 includes a stress-inducing material, wherein the stress-inducing material induces one of a lateral tensile stress and a lateral compressive stress at least on the second layer 12.

In the embodiments illustrated in FIGS. 1 to 38, the first layer 11 includes GaN and the second layer 12 includes AlGaN and the two-dimensional electron gas is located at the interface between the first layer 11 and the second layer 12 towards the first layer 11, which is also called Ga-face polarity. The HEMT is then also called "normal HEMT". In non-illustrated embodiments, the first layer 11 includes AlGaN and the second layer 12 includes GaN. The two-dimensional electron gas is thus located at the interface between the first layer and the second layer towards the second layer, which is also called N-face polarity. The lateral HEMT is then also called "inverted HEMT".

In further non-illustrated embodiments, both the first layer and the second layer are undoped and the two-dimensional electron gas at the interface between the first layer and the second layer is formed due to the piezoelectric effect. The HEMT is then also called "PI-HEMT" (Polarization Induced High Electron Mobility Transistor).

In further non-illustrated embodiments, the first electrode includes an extension region arranged on the passivation layer. The extension region overlaps the gate electrode in a vertical direction and laterally extends closer to the second electrode than the gate electrode. The extension region includes an electrically conductive material such as a metal or highly doped polysilicon. The extension region may reduce peaks in the electric field strength.

FIGS. 39A to 39E illustrate a method for the production of a lateral HEMT 280. Components of the same function as those in previous figures are identified by the same reference numbers and are not explained again below.

Figure 39A:
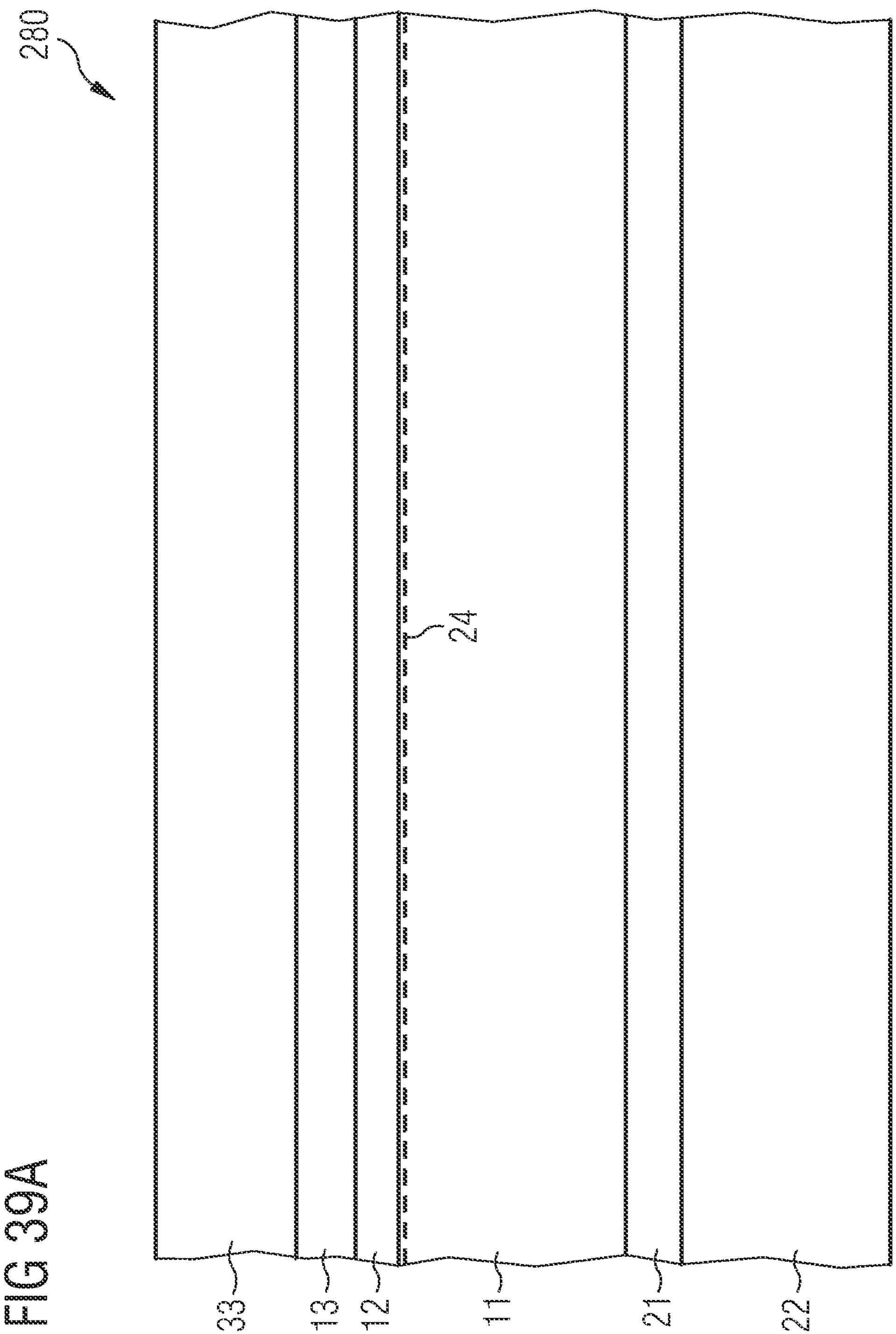
FIGS. 39A to 39E illustrate an embodiment of a method for the production of a lateral HEMT.

A buffer layer 21 is applied on a substrate 22. The buffer layer 21 may include for example AlN and the substrate 22 may include $Al_2O_3$, SiC or Si. A first layer 11 is arranged on the buffer layer 21 and a second layer 12 is at least partially arranged on the first layer 11. In the illustrated embodiment, the first layer 11 includes n-conducting GaN and the second layer 12 includes AlGaN. A passivation layer 13 is applied on the second layer 12 and an insulating layer 33 is applied at least partially on the passivation layer 13 for example by chemical vapor deposition. The passivation layer 13 may include a material selected from the group consisting of $Si_xN_y$, $SiO_2$ and $Al_2O_3$ and the insulating layer 33 may include an oxide and may be selectively etched with respect to the layers arranged beneath the insulating layer 33. A gate layer may be formed after the formation of the second layer 12 or after the formation and partial recess of the passivation layer 13. Ohmic contacts may be formed before the formation of the gate layer. FIG. 39A illustrates the lateral HEMT 280 after the above-mentioned process steps.

Figure 39B:
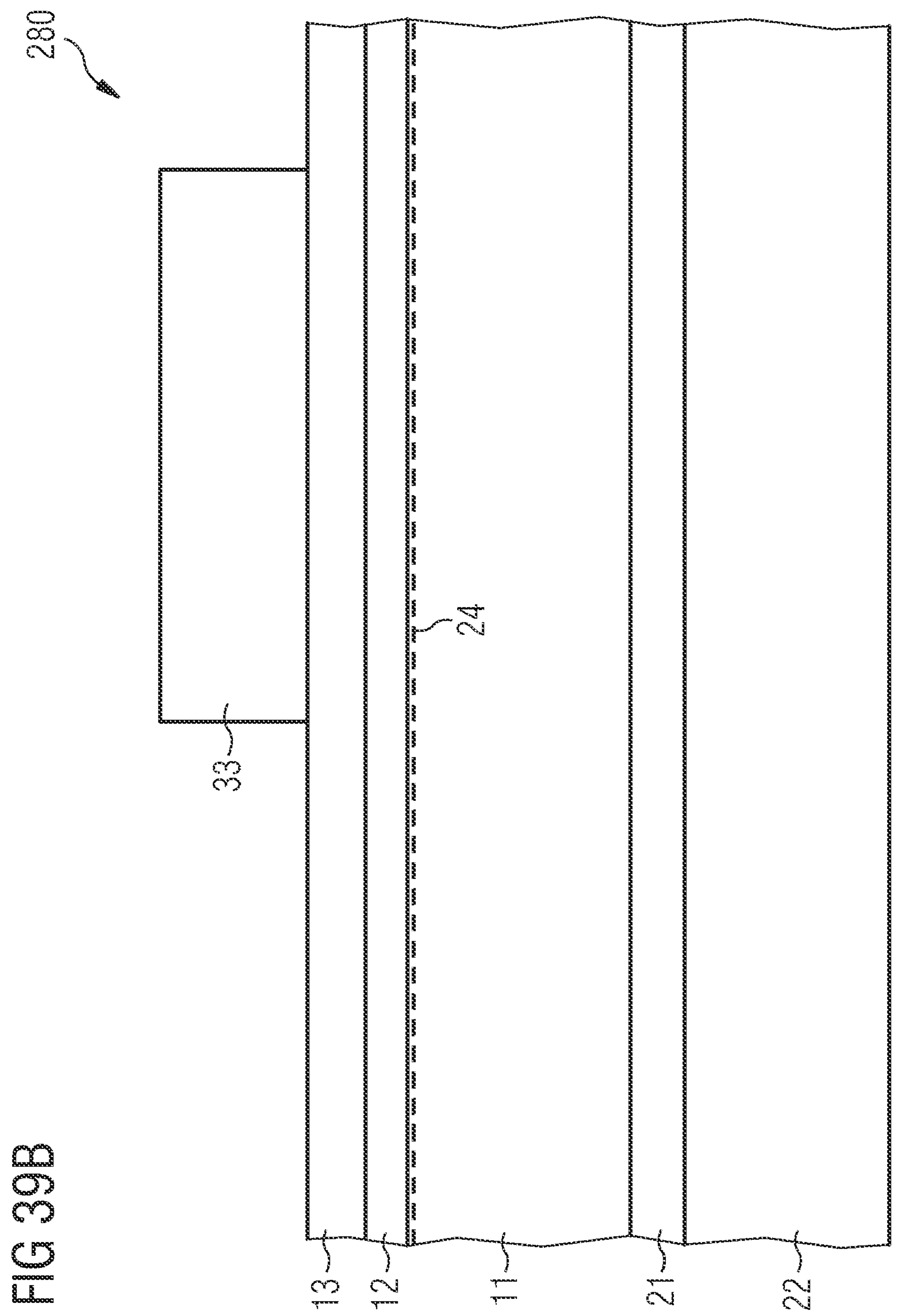
Figure 39C:
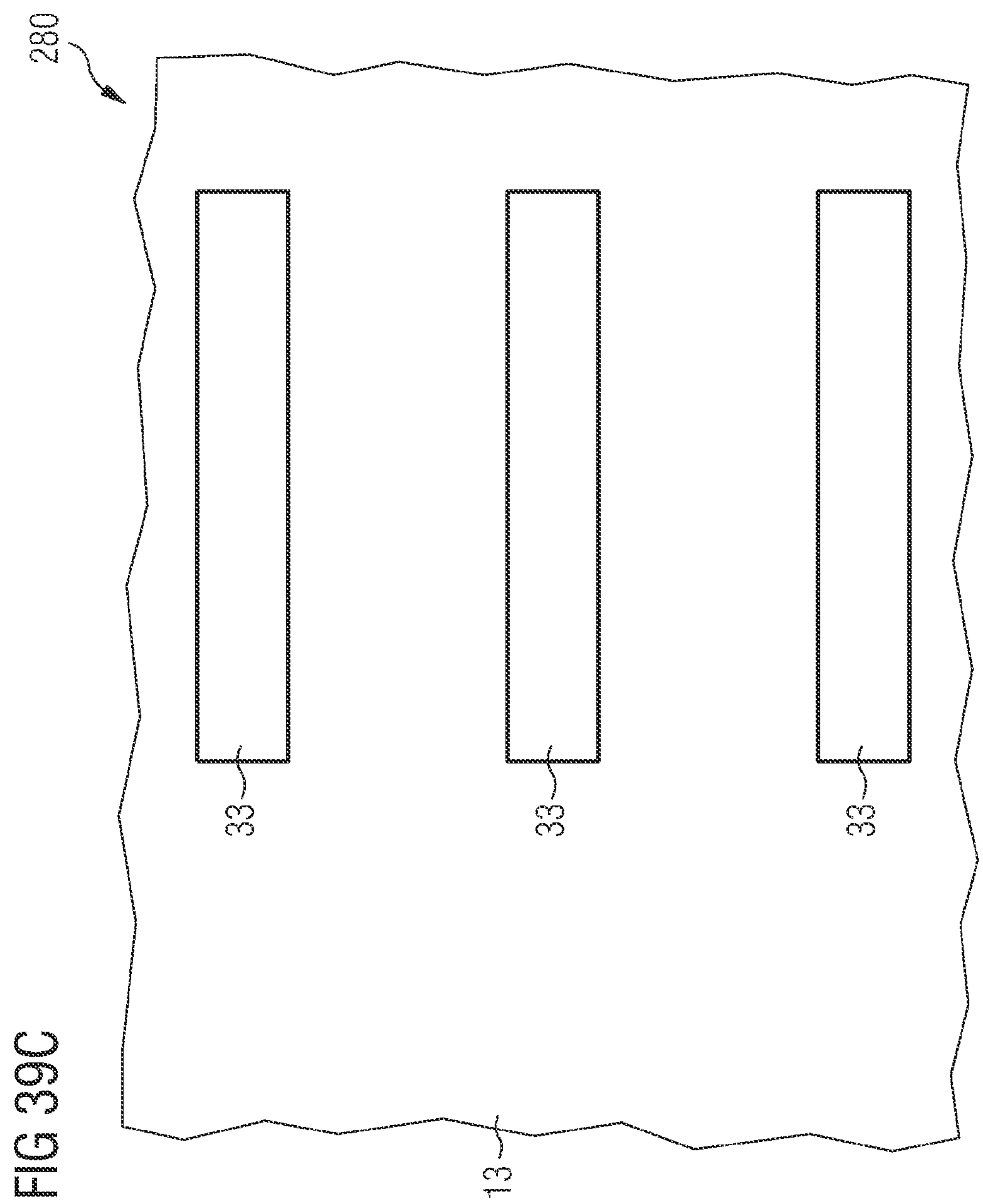

In a further step, the insulating layer 33 is structured for example by a plasma chemical process. For this purpose, a non-illustrated photo resist mask is applied at least partially on the insulating layer 33 and the insulating layer 33 is subsequently removed in the regions not covered by the photo resist mask. The photo resist mask is removed in a further process step. FIGS. 39B and 39C illustrate the lateral HEMT 280 after the above-mentioned process steps in a cross-sectional view and a top view, respectively.

Figure 39D:
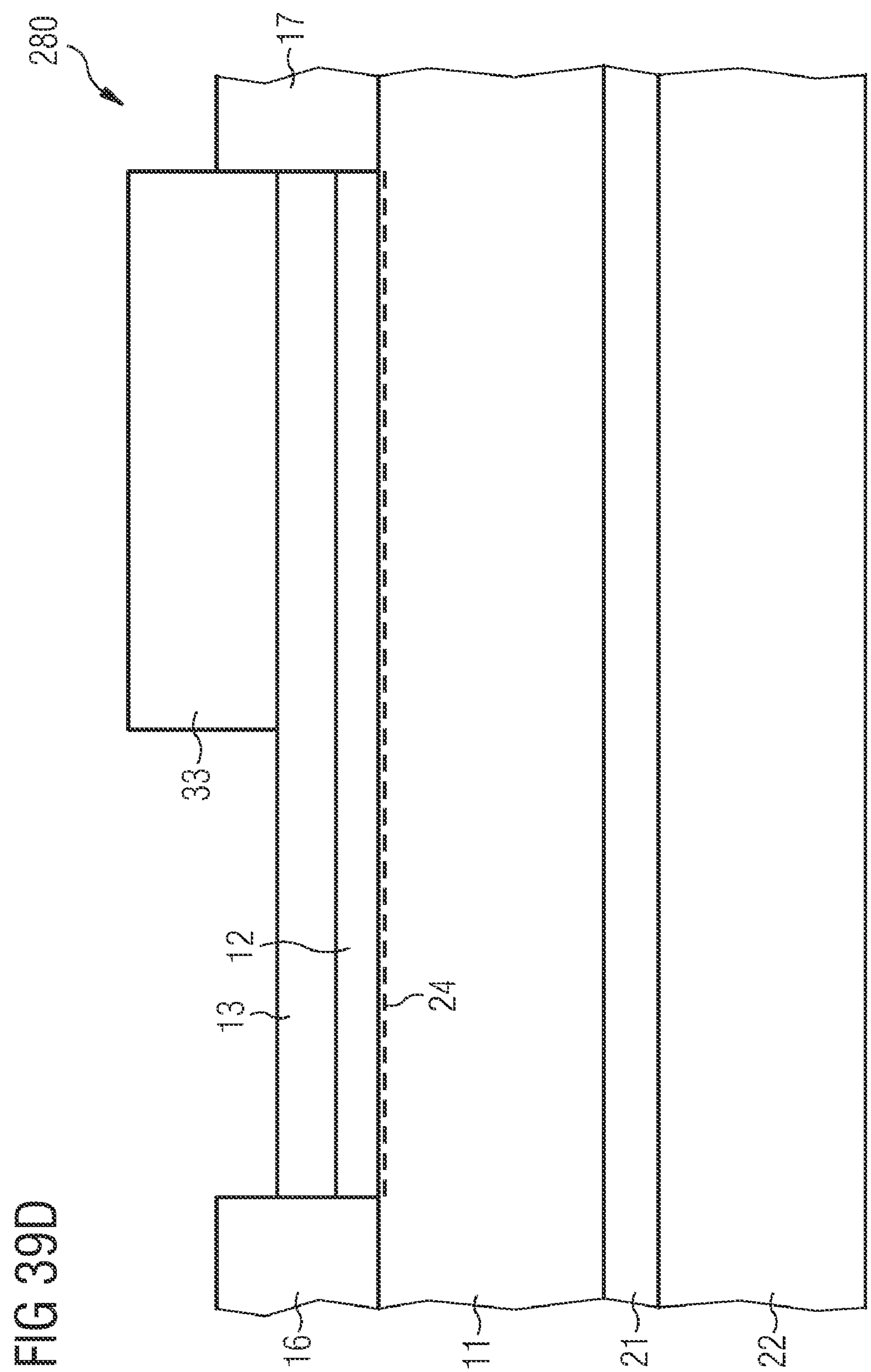

In the illustrated embodiment, the passivation layer 13 and the second layer 12 are partially removed and electrically conductive material, for example a metal or highly doped polysilicon, is applied and structured on the first layer 11, thereby providing a first electrode 16 and a second electrode 17. The lateral HEMT 280 after the above-mentioned process steps is illustrated in FIG. 39D. In other embodiments, the passivation layer 13 is partially removed and electrically conductive material, for example a metal or highly doped polysilicon, is applied and structured on the second layer 12, thereby providing a first electrode 16 and a second electrode 17. The first electrode 16 and the second electrode 17 are each arranged on the second layer 12 and the two-dimensional electron gas is electrically contacted by alloying the first electrode 16 and the second electrode 17 into the second layer 12.

Figure 39E:
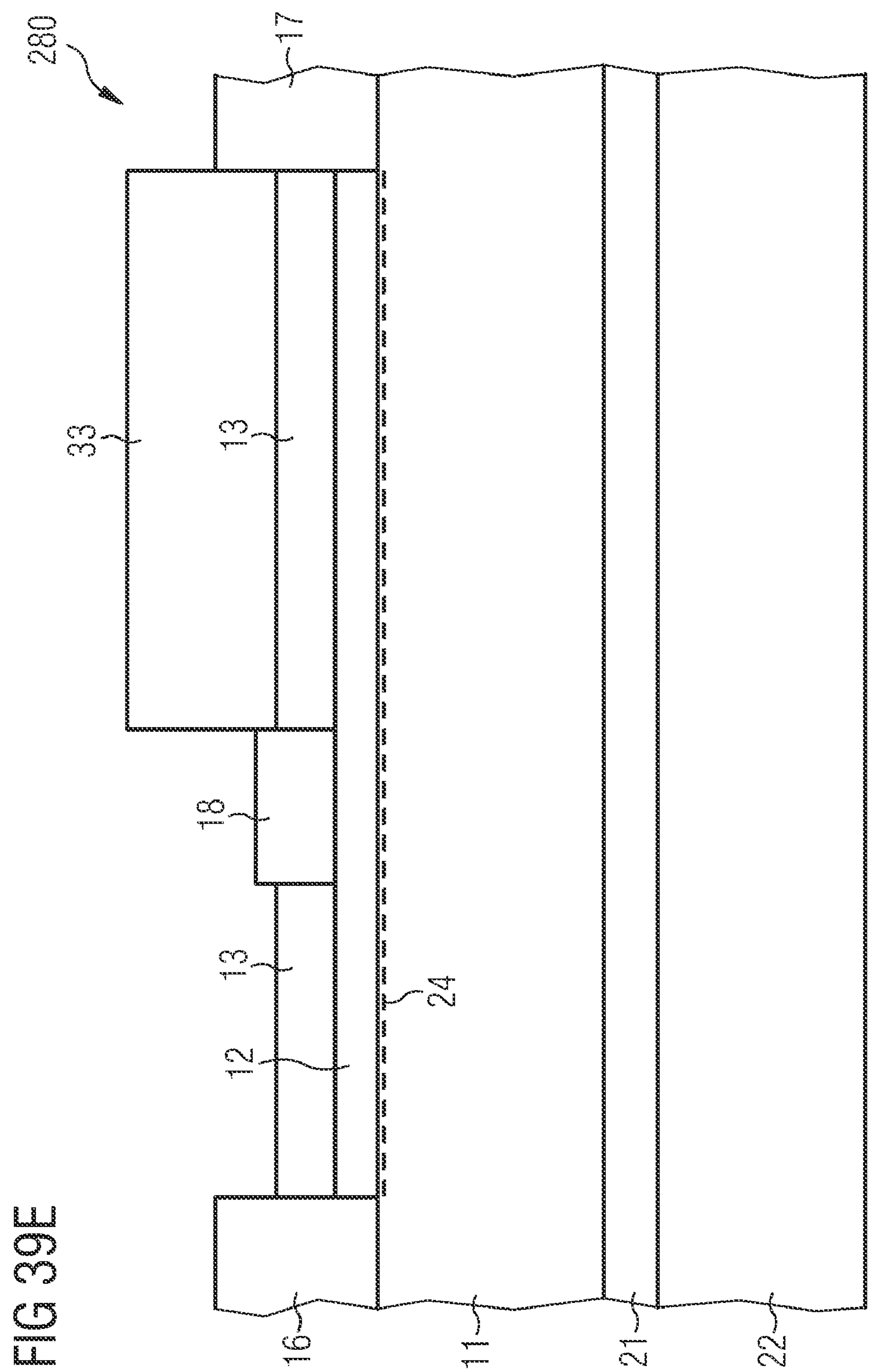

In a further process step, the passivation layer 13 is partially removed in a region between the first electrode and the second electrode 17 and an electrically conductive material, for example a metal or highly doped polysilicon, is applied and structured on the second layer 12, thereby providing a gate electrode 18. FIG. 39E illustrates the lateral HEMT 280 after the above-mentioned process steps.

In a non-illustrated embodiment, both the first layer and the second layer may be undoped. In a further non-illustrated embodiment, the first layer includes AlGaN and the second layer includes GaN.

It is to be understood that the features of the various exemplary embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A lateral HEMT comprising:

a first layer, the first layer comprising a semiconducting material;

a second layer, the second layer comprising a semiconducting material and being at least partially arranged on the first layer;

a passivation layer;

a drift region, the drift region comprising a lateral width $w_d$;

at least one field plate, the at least one field plate being arranged at least partially on the passivation layer in a region of the drift region and comprising a lateral width $w_f$, wherein $w_f < w_d$.

2. The lateral HEMT of claim 1, further comprising a first electrode, a second electrode and a gate electrode, wherein the passivation layer at least partially surrounds the gate electrode.

3. The lateral HEMT of claim 2, wherein the at least one field plate is electrically coupled to one of the first electrode, the second electrode and the gate electrode or to a further electrode, the further electrode being at a potential different from a potential of the first electrode, the second electrode and the gate electrode.

4. The lateral HEMT of claim 1, wherein the field plate comprises a metal.

5. The lateral HEMT of claim 1, wherein the first layer comprises GaN and the second layer comprises AlGaN.

6. The lateral HEMT of claim 1, wherein the first layer comprises AlGaN and the second layer comprises GaN.

7. A lateral HEMT comprising:

a first layer, the first layer comprising a semiconducting material;

a second layer, the second layer comprising a semiconducting material and being at least partially arranged on the first layer;

a gate electrode;

a drift region, the drift region comprising a lateral width $w_d$;

a plurality of field plates, each of the field plates being arranged at least partially directly on the second layer in a region of the drift region and comprising a lateral width, wherein a sum of the lateral widths of the field plates is smaller than the lateral width $w_d$ and wherein the plurality of field plates is electrically coupled to the gate electrode.

8. A lateral HEMT comprising:

a first layer, the first layer comprising a semiconducting material;

a second layer, the second layer comprising a semiconducting material and being at least partially arranged on the first layer;

a passivation layer;

a drift region, the drift region comprising a lateral width $w_d$;

a first plurality of field plates, each of the field plates of the first plurality of field plates being arranged at least partially on the passivation layer in a region of the drift region and comprising a lateral width, wherein a sum of the lateral widths of the field plates of the first plurality of field plates is smaller than the lateral width $w_d$.

9. The lateral HEMT of claim 8, further comprising a first electrode, a second electrode and a gate electrode, wherein the passivation layer at least partially surrounds the gate electrode.

10. The lateral HEMT of claim 8, further comprising at least a second plurality of field plates, each of the field plates of the second plurality of field plates being arranged at least partially on the passivation layer in a further region of the drift region and comprising a lateral width, wherein a sum of the lateral widths of the field plates of the second plurality of field plates is smaller than the lateral width $w_d$.

11. The lateral HEMT of claim 10, wherein the first plurality of field plates and/or the second plurality of field plates is electrically coupled to one of the first electrode, the second electrode and the gate electrode or to a further electrode, the further electrode being at a potential different from a potential of the first electrode, the second electrode and the gate electrode.

12. The lateral HEMT of claim 10, wherein the first plurality of field plates and/or the second plurality of field plates comprises a first field plate comprising a first lateral width and a second field plate comprising a second lateral width, the first lateral width being different from the second lateral width.

13. The lateral HEMT of claim 10, wherein the first plurality of field plates and/or the second plurality of field plates comprises a first field plate comprising a first lateral length and a second field plate comprising a second lateral length, the first lateral length being different from the second lateral length.

14. The lateral HEMT of claim 8, wherein a relation of the sum of the lateral widths of the field plates of the first plurality of field plates to a sum of the lateral distances between adjacent field plates of the first plurality of field plates is given by 1:n, wherein $n>1$.

15. The lateral HEMT of claim 14, wherein $n>5$.

16. The lateral HEMT of claim 14, wherein $n>10$.

17. The lateral HEMT of claim 10, wherein the first plurality of field plates and/or the second plurality of field plates comprises a metal.

18. The lateral HEMT of claim 8, wherein the first layer comprises GaN and the second layer comprises AlGaN.

19. The lateral HEMT of claim 8, wherein the first layer comprises AlGaN and the second layer comprises GaN.

20. The lateral HEMT of claim 8, wherein the passivation layer comprises a material selected from the group consisting of $Si_xN_y$, $SiO_2$ and $Al_2O_3$.

21. A lateral HEMT comprising:

a first layer, the first layer comprising a semiconducting material;

a second layer, the second layer comprising a semiconducting material and being at least partially arranged on the first layer;

a drift region, the drift region comprising a lateral width $w_d$;

at least one insulating layer, the at least one insulating layer being arranged on the second layer in a region of the drift region and comprising a lateral width $w_l$, wherein $w_l<w_d$, wherein the at least one insulating layer comprises a stress-inducing material, the stress-inducing material inducing a lateral stress at least on the second layer.

22. The lateral HEMT of claim 21, wherein the stress-inducing material induces one of a lateral tensile stress and a lateral compressive stress at least on the second layer.

23. The lateral HEMT of claim 21, wherein the stress-inducing material comprises one of an oxide and SiN.

24. The lateral HEMT of claim 21, wherein the at least one insulating layer is arranged at least partially directly on the second layer.

25. The lateral HEMT of claim 21, further comprising a passivation layer, wherein the at least one insulating layer is arranged at least partially on the passivation layer.

* * * * *